United States Patent
Matsuura

(10) Patent No.: US 9,368,595 B2
(45) Date of Patent: Jun. 14, 2016

(54) SEMICONDUCTOR DEVICE PROVIDED WITH AN IE TYPE TRENCH IGBT

(71) Applicant: Renesas Electronics Corporation, Kanagawa (JP)

(72) Inventor: Hitoshi Matsuura, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 14/715,648

(22) Filed: May 19, 2015

(65) Prior Publication Data

US 2015/0340480 A1    Nov. 26, 2015

(30) Foreign Application Priority Data

May 22, 2014 (JP) ................ 2014-105788
Feb. 26, 2015 (JP) ................ 2015-036141

(51) Int. Cl.

| H01L 29/00 | (2006.01) |
| H01L 29/66 | (2006.01) |
| H01L 29/423 | (2006.01) |
| H01L 29/08 | (2006.01) |
| H01L 29/10 | (2006.01) |
| H01L 29/417 | (2006.01) |

(Continued)

(52) U.S. Cl.
CPC ...... *H01L 29/66348* (2013.01); *H01L 29/0619* (2013.01); *H01L 29/0696* (2013.01); *H01L 29/0804* (2013.01); *H01L 29/0821* (2013.01); *H01L 29/1095* (2013.01); *H01L 29/36* (2013.01); *H01L 29/41708* (2013.01); *H01L 29/4236* (2013.01); *H01L 29/42364* (2013.01); *H01L 29/42368* (2013.01); *H01L 29/66333* (2013.01); *H01L 29/7395* (2013.01); *H01L 29/7397* (2013.01); *H01L 29/7813* (2013.01); *H01L 29/407* (2013.01)

(58) Field of Classification Search
CPC .............. H01L 29/7397; H01L 29/66348; H01L 29/0696; H01L 29/1095; H01L 29/7395; H01L 29/7813; H01L 29/66333
See application file for complete search history.

(56) References Cited

U.S. PATENT DOCUMENTS

| 2006/0214221 A1 | 9/2006 | Challa et al. |
| 2011/0018029 A1 | 1/2011 | Pfirsch et al. |

(Continued)

FOREIGN PATENT DOCUMENTS

| DE | 102013010734 A1 | 1/2014 |
| EP | 2 613 356 A2 | 7/2013 |

(Continued)

OTHER PUBLICATIONS

Extended European Search Report received in corresponding European Application No. 15167948.7 dated Nov. 11, 2015.

*Primary Examiner* — Ngan Ngo
(74) *Attorney, Agent, or Firm* — Mattingly & Malur, PC

(57) ABSTRACT

A switching loss is prevented from being deteriorated by suppressing increase in a gate capacitance due to a cell shrink of an IE type trench gate IGBT. A cell formation region is configured of a linear active cell region, a linear hole collector cell region, and a linear inactive cell region between them. Then, upper surfaces of the third and fourth linear trench gate electrodes which are formed so as to sandwich both sides of the linear hole collector cell region and electrically connected to an emitter electrode are positioned to be lower than upper surfaces of the first and second linear trench gate electrodes which are formed so as to sandwich both sides of the linear active cell region and electrically connected to a gate electrode.

20 Claims, 44 Drawing Sheets

(51) Int. Cl.
*H01L 29/36* (2006.01)
*H01L 29/78* (2006.01)
*H01L 29/739* (2006.01)
*H01L 29/06* (2006.01)
*H01L 29/40* (2006.01)

(56) References Cited

U.S. PATENT DOCUMENTS

2012/0313139 A1* 12/2012 Matsuura ............... H01L 29/36
257/139
2013/0037853 A1* 2/2013 Onozawa ............ H01L 29/0661
257/139
2013/0175574 A1 7/2013 Matsuura
2013/0328105 A1 12/2013 Matsuura
2015/0380538 A1* 12/2015 Ogawa ................ H01L 29/4236
257/144

FOREIGN PATENT DOCUMENTS

| JP | 2011-165928 A | 8/2011 |
| JP | 2013-140885 A | 7/2013 |
| JP | 2013-258190 A | 12/2013 |

* cited by examiner

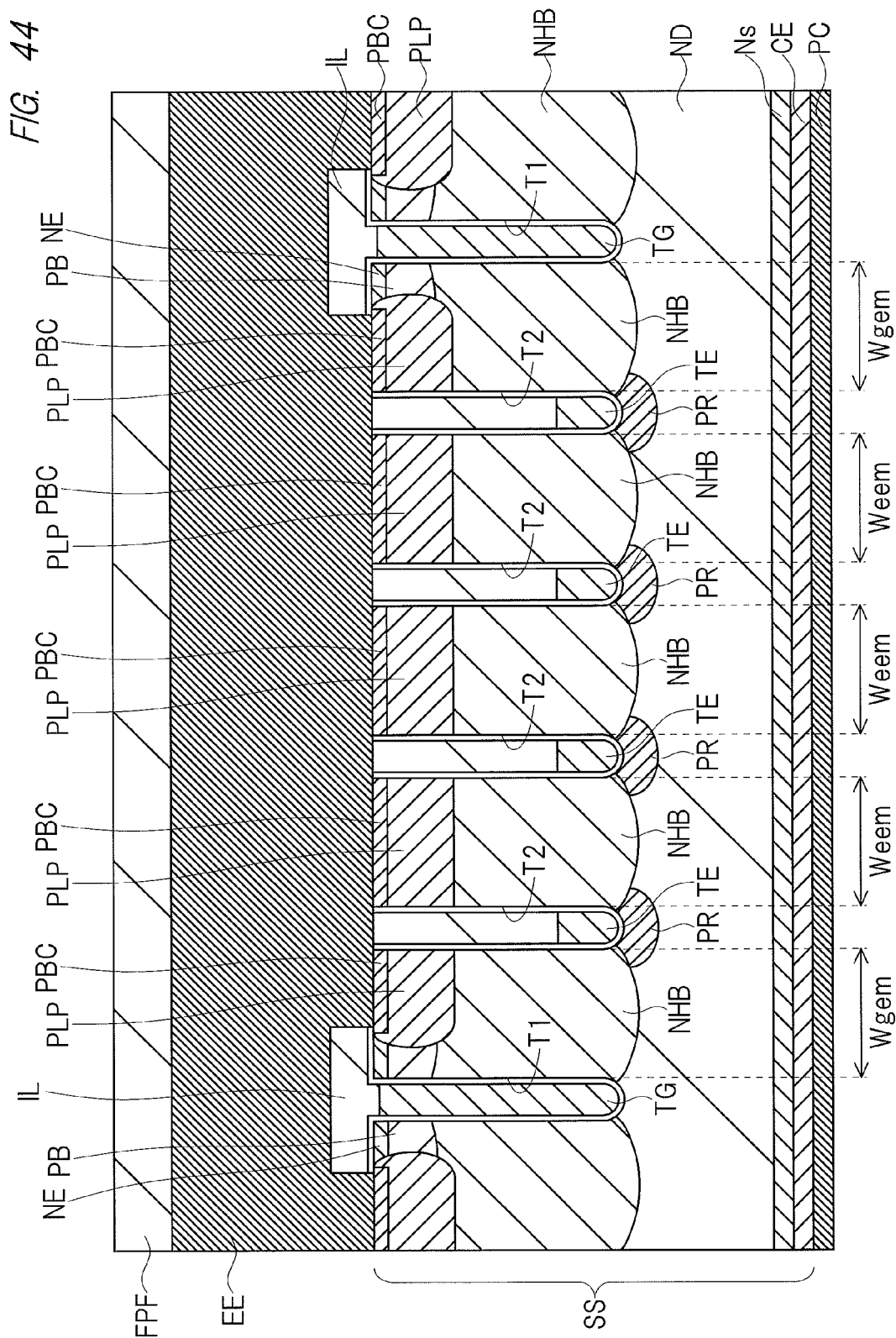

US 9,368,595 B2

SEMICONDUCTOR DEVICE PROVIDED WITH AN IE TYPE TRENCH IGBT

CROSS-REFERENCE TO RELATED APPLICATION

The present application claims priority from Japanese Patent Application No. 2014-105788 filed on May 22, 2014, and Japanese Patent Application No. 2015-036141 filed on Feb. 26, 2015, the content of which is hereby incorporated by reference into this application.

TECHNICAL FIELD OF THE INVENTION

The present invention relates to a semiconductor device, and can be preferably utilized to a power semiconductor device such as an IE (Injection Enhancement) type trench gate IGBT (Insulated Gate Bipolar Transistor) in which an active cell and an inactive cell are mixed in a direction in orthogonal to a trench gate.

BACKGROUND

For example, Japanese Patent Application Laid-Open Publication No. 2013-140885 (Patent Document 1) discloses an IE type trench gate IGBT with a cell formation region basically formed of a first linear unit cell region having a linear active cell region, a second linear unit cell region having a linear hole collector cell region, and a linear inactive cell region between the first linear unit cell region and the second linear unit cell region.

Also, Japanese Patent Application Laid-Open Publication No. 2013-258190 (Patent Document 2) discloses a narrow-active-cell IE type trench gate IGBT having an active cell two-dimensional thinning structure but not having a body contact region provided therein.

SUMMARY

For example, in the IE type trench gate IGBT described in the Patent Document 1, a trench gate electrode on both sides of a linear hole collector cell region is connected to an emitter electrode, so that an active cell thinning rate is maintained in a preferable range so as to sufficiently exert the IE effect while increase in a gate capacitance is avoided, and cell shrink is achieved.

However, in further studies on the cell shrink in the above-described IE type trench gate IGBT, it has been found out that a capacitance (input capacitance) between a gate and an emitter cannot be reduced although a capacitance (feedback capacitance) between a gate and a collector can be reduced. The capacitance between the gate and the collector mainly affects a switching-off loss, and the capacitance between the gate and the emitter mainly affects a switching-on loss. That is, even if the cell shrink is performed, if the capacitance between the gate and the emitter cannot be reduced, there is a problem of deterioration of the switching-on loss.

The other object and novel characteristics of the present invention will be apparent from the description of the present specification and the accompanying drawings.

In a semiconductor device according to an embodiment, a cell formation region of an IE type trench gate IGBT is formed of a linear active cell region, a linear hole collector cell region, and a linear inactive cell region between the linear active cell region and the linear hole collector cell region. And, upper surfaces of third and fourth linear trench gate electrodes formed so as to sandwich both sides of the linear hole collector cell region and electrically connected to an emitter electrode are lower than upper surfaces of first and second linear trench gate electrodes formed so as to sandwich both sides of the linear active cell region and electrically connected to a gate electrode.

According to an embodiment, switching loss can be prevented from being deteriorated by suppressing increase in a gate capacitance due to cell shrink of the IE type trench gate IGBT.

BRIEF DESCRIPTIONS OF THE DRAWINGS

FIG. 44 is a cross-sectional view of a principal part of a fourth example of the IE-type trench gate IGBT according to the ninth embodiment.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, when "formed of A", "formed by A", "having A", or "including A" is described, it goes without saying that other components are not eliminated unless otherwise specified to be particularly only the component. Similarly, in the embodiments described below, when the shape of the components, positional relation thereof, and the like are described, the substantially approximate and similar shapes and the like are included therein unless otherwise stated or except the case where it is conceivable that they are apparently excluded in principle. The same goes for the numerical value and the range described above.

Also, in some drawings used in the following embodiments, hatching is used even in a plan view so as to make the drawings easy to see. Also, components having the same function are denoted by the same reference symbols in principle throughout all the drawings for describing the following embodiments, and the repetitive description thereof is omitted. Hereinafter, the present embodiment will be described in detail based on the drawings.

As a prior art technique disclosed with respect to an IE-type trench gate IGBT, for example, Japanese Patent Application Laid-Open Publication No. 2013-140885 (Patent Document 1) and Japanese Patent Application Laid-Open Publication No. 2013-258190 (Patent Document 2) are cited. Since Japanese Patent Application Laid-Open Publication No. 2013-140885 (Patent Document 1) discloses (1) a cell region and a planar structure in the periphery of the cell region, (2) a narrow-active-cell type unit cell and an alternate arrangement system, and (3) active cell two-dimensional thinning structure, the overlap descriptions for them are not repeated in principle.

(First Embodiment)

<<Structure of IE Type Trench Gate IGBT>>

Figure 1:
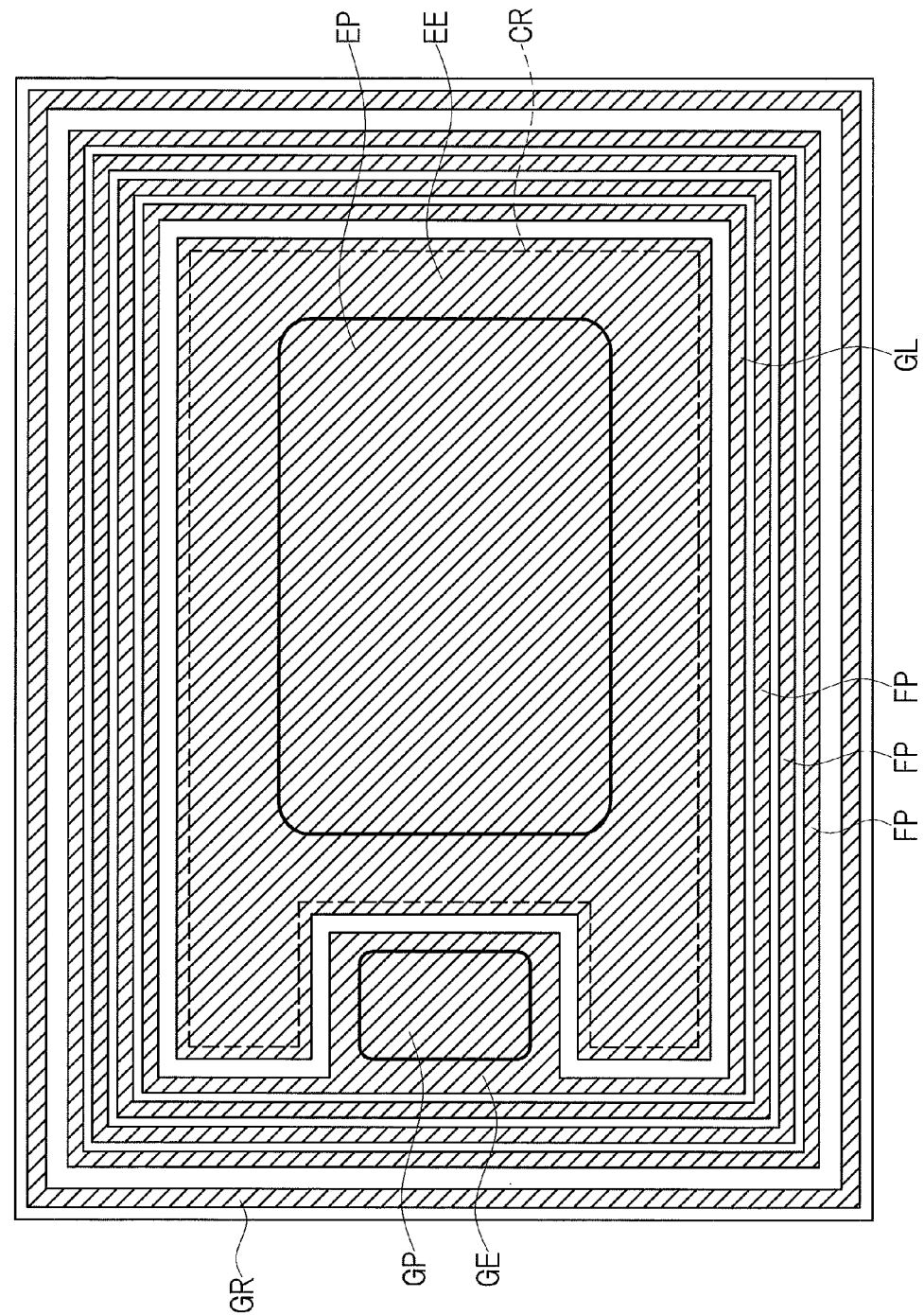
FIG. 1 is a plan view of a principal part of a semiconductor chip forming an IE-type trench gate IGBT according to a first embodiment.
Figure 2:
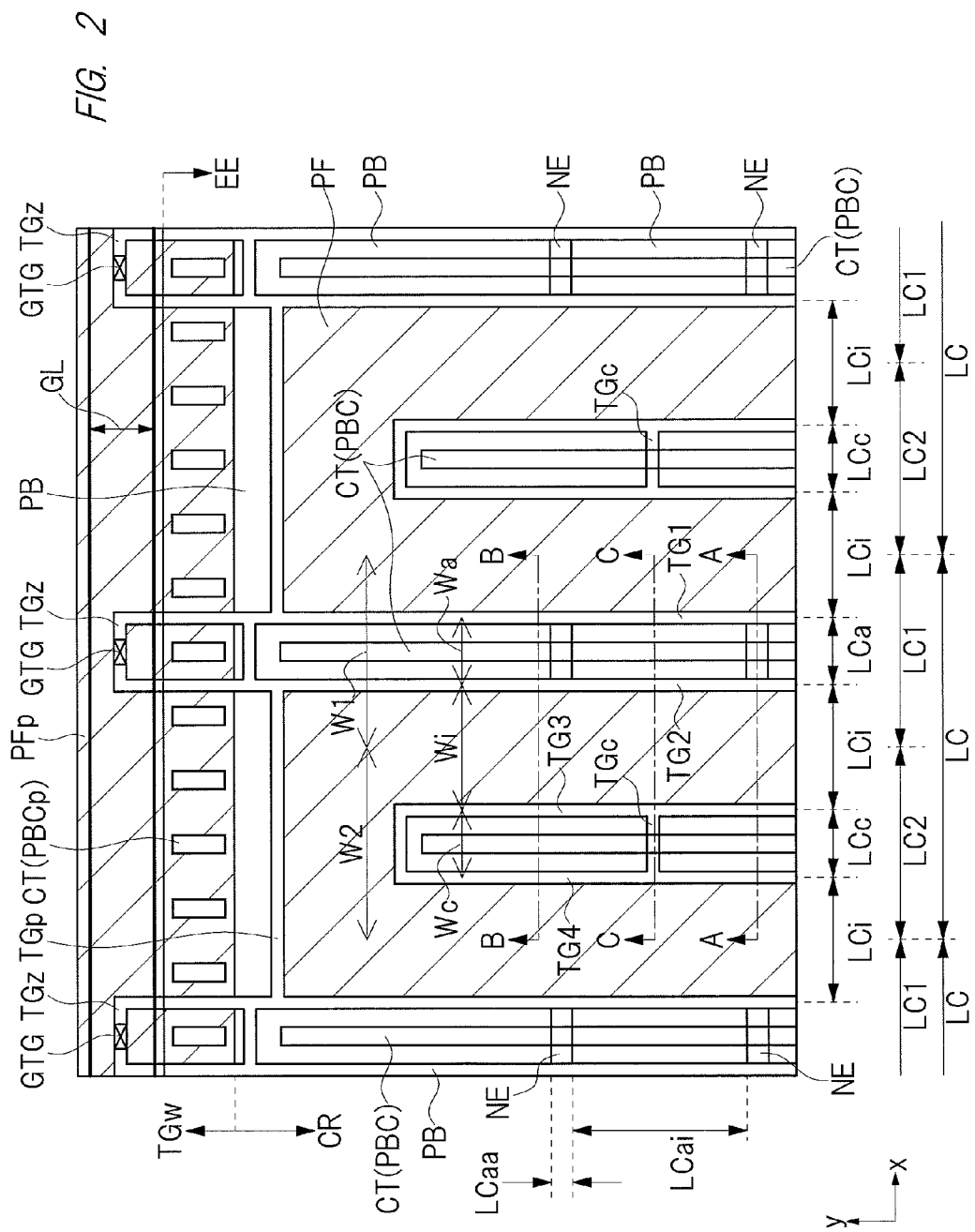
FIG. 2 is a plan view of a principal part showing a partially-enlarged active portion of the semiconductor chip according to the first embodiment.
Figure 3:
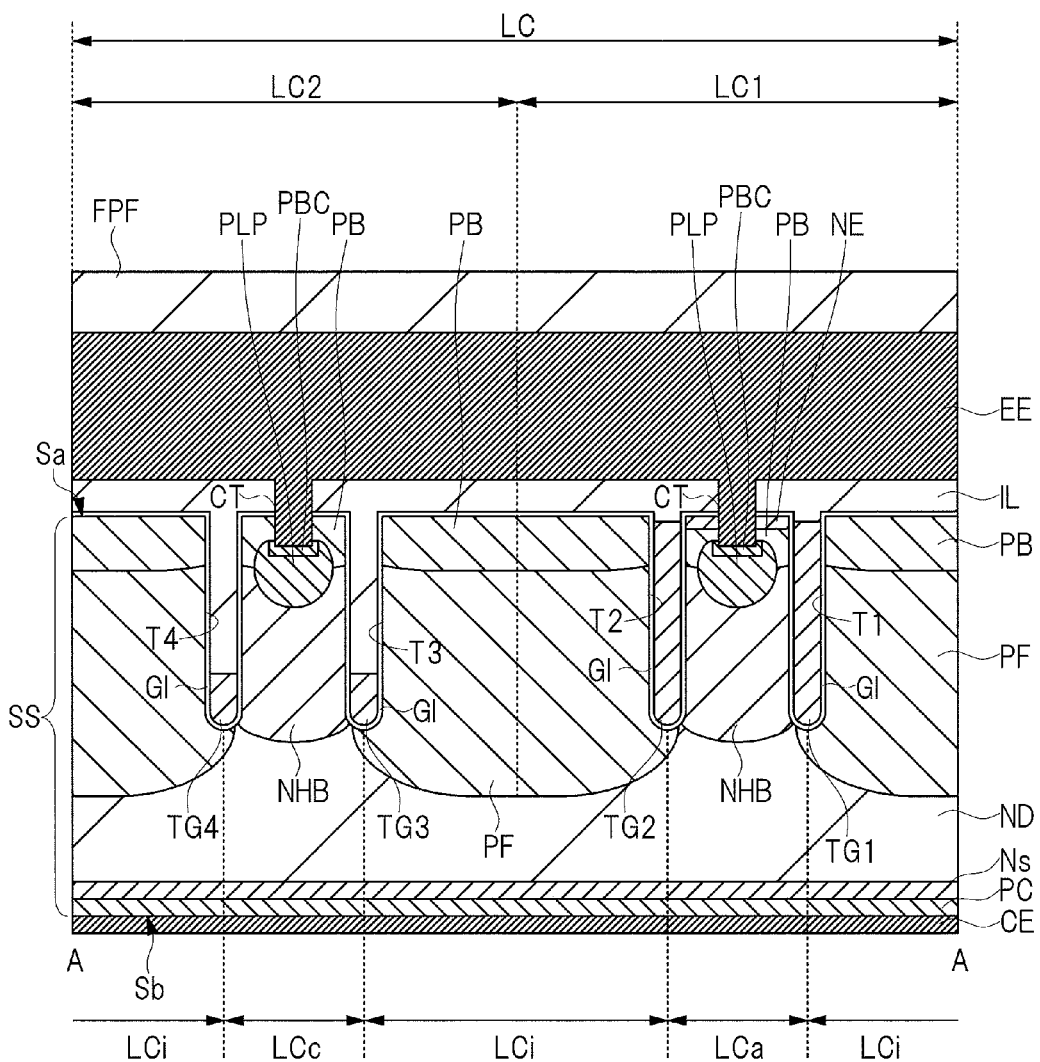
FIG. 3 is a cross-sectional view of a principal part (a cross-sectional view of a principal part taken along a line A-A shown in FIG. 2) of the IE-type trench gate IGBT according to the first embodiment.
Figure 4:
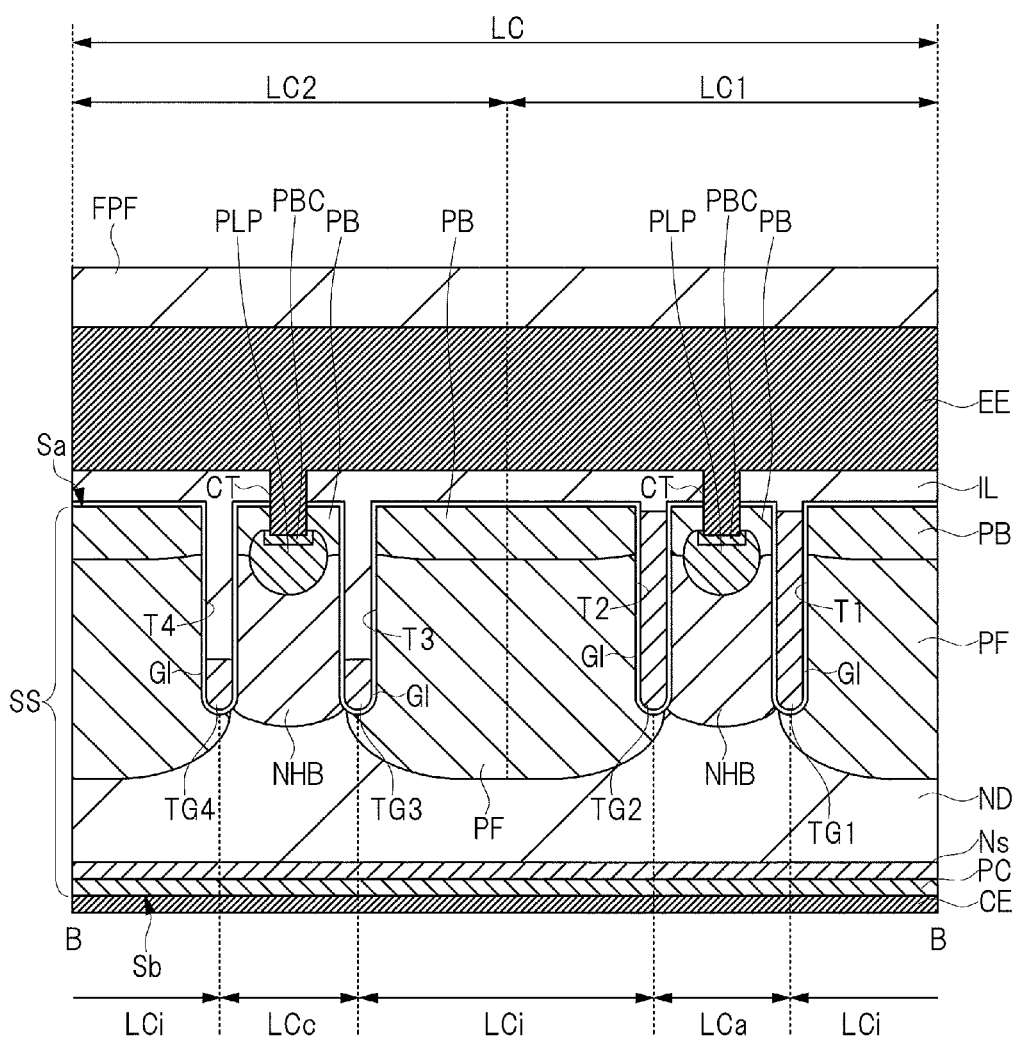
FIG. 4 is a cross-sectional view of a principal part (a cross-sectional view of a principal part taken along a line B-B shown in FIG. 2) of the IE-type trench gate IGBT according to the first embodiment.
Figure 5:
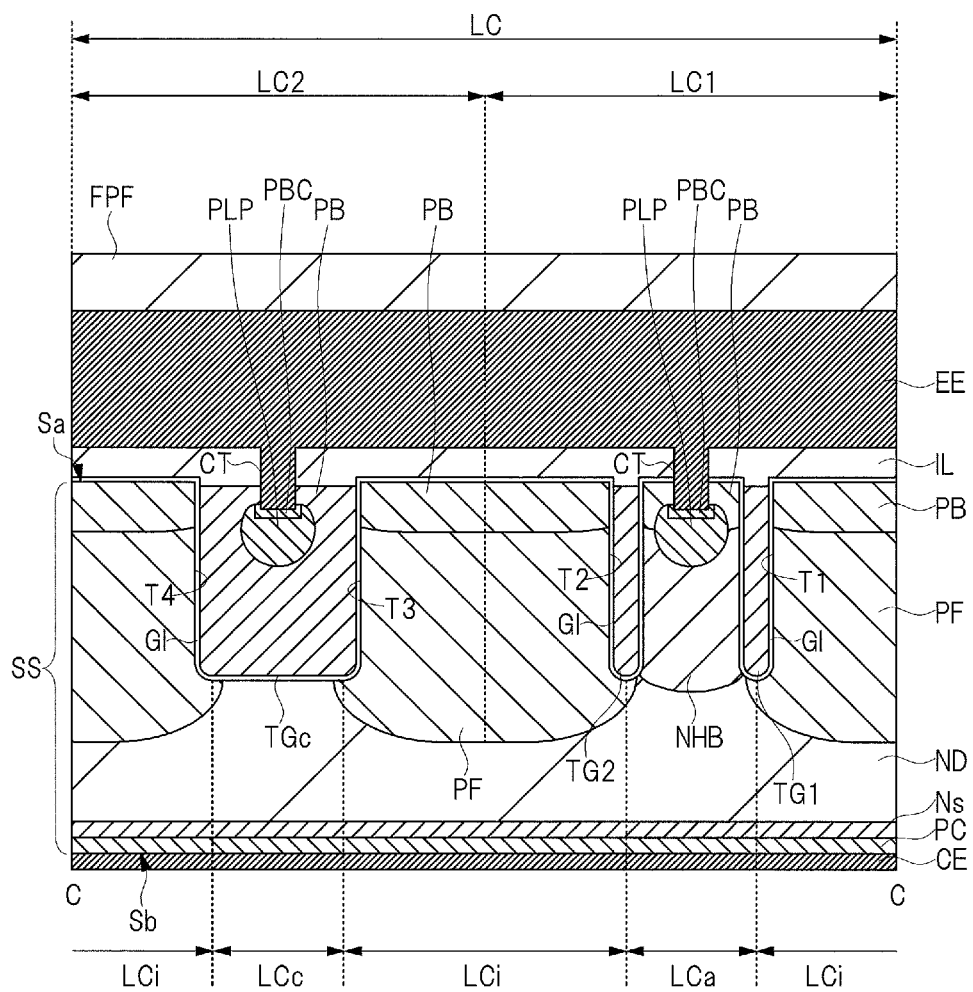
FIG. 5 is a cross-sectional view of a principal part (a cross-sectional view of a principal part taken along a line C-C shown in FIG. 2) of the IE-type trench gate IGBT according to the first embodiment.

A semiconductor device including an IE type trench gate IGBT according to the present first embodiment will be described using FIGS. 1 to 5. FIG. 1 is a plane view of a principal part of a semiconductor chip which configures the IE type trench gate IGBT according to the present first embodiment. FIG. 2 is a plane view of a principal part illustrating a part of an active part of a semiconductor chip according to the present first embodiment so as to be enlarged. FIGS. 3 to 5 are cross-sectional views of a principal part of the IE type trench gate IGBT according to the present first embodiment, FIG. 3 is a cross-sectional view of a principal part along an A-A line illustrated in FIG. 2, FIG. 4 is a cross-sectional view of a principal part along a B-B line illustrated in FIG. 2, and FIG. 5 is a cross-sectional view of a principal part along a C-C line illustrated in FIG. 2. The IE type trench gate IGBT according to the present first embodiment has, for example, a breakdown voltage of about 600 V.

As illustrated in FIG. 1, an annular guard ring GR is provided on the upper surface of a peripheral part of a semiconductor chip SC, and several (single or a plurality of) annular field plate FP connected to an annular floating field ring, etc., are provided inside the guard ring. The guard ring GR and field plate FP are made up of, for example, a metal film containing aluminum as a main component.

A cell formation region CR is provided in a main part of the active part of the semiconductor chip SC which is located inside the annular field plate FP, and an emitter electrode EE is provided over the outer peripheral part of the semiconductor chip SC on the upper surface of the active part of the semiconductor chip SC. The emitter electrode EE is made up of a metal film containing, for example, aluminum as a main component. A central part of the emitter electrode EE is an emitter pad EP for connecting a bonding wire, etc.

A gate wire GL is arranged between the emitter electrode EE and the field plate FP, and the gate wire GL is connected to a gate electrode GE. The gate wire GL and the gate electrode GE are made up of, for example, a metal film containing aluminum as a main component. A central part of the gate electrode GE is a gate pad GP for connecting a bonding wire, etc.

As illustrated in FIG. 2, a linear unit cell region LC is periodically arranged in the first direction (x direction) in the cell formation region CR. Each linear unit cell region LC is configured of a first linear unit cell region LC1 and a second linear unit cell region LC2. In the present first embodiment, a width W1 of the first linear unit cell region LC1 and a width W2 of the second linear unit cell region LC2 are the same or substantially the same as each other.

Each first linear unit cell region LC1 is configured of a linear active cell region LCa in the center and a pair of linear inactive cell regions LCi each of which has a half width surrounding the linear active cell region LCa. Between the linear active cell region LCa and the linear inactive cell regions LCi, there is a first linear trench gate electrode TG1 or a second linear trench gate electrode TG2 electrically connected to the gate electrode (gate electrode GE illustrated in the FIG. 1).

On the other hand, each second linear unit cell region LC2 is configured of a linear hole collector cell region LCc in the center and a pair of the linear inactive cell regions LCi each of which has a half width surrounding the linear hole collector cell region LCc. Between the linear hole collector cell region LCc and the linear inactive cell regions LCi, there is a third linear trench gate electrode TG3 or a fourth linear trench gate electrode TG4 electrically connected to the emitter electrode EE.

A width Wa of the linear active cell region LCa and a width Wc of the linear hole collector cell region LCc are formed so as to be narrower than a width Wi of the linear inactive cell region LCi, and the IE type trench gate IGBT according to the present first embodiment is so-called a "narrow-active-cell type unit cell".

In addition, the linear unit cell region LC is configured by alternately arranging the linear inactive cell region LCi and the linear active cell region LCa or the linear hole collector cell region LCc, and the IE type trench gate IGBT according to the present first embodiment is so-called an "alternate arrangement system".

In the linear active cell region LCa and the linear hole collector cell region LCc, a contact groove CT is provided in their central parts along the second direction (y direction, longitudinal direction) each orthogonal to the first direction (x direction), and a bottom end of the contact groove reaches a $P^+$-type body contact region PBC formed in a semiconductor substrate.

In the linear active cell region LCa, a region in which an $N^+$-type emitter region NE is formed, that is an active section LCaa, and a region (P-type body region PB) in which the $N^+$-type emitter region NE is not formed, that is an inactive section LCai, are alternately provided to each other periodically in the second direction (y direction, longitudinal direction).

In the linear hole collector cell region LCc, a coupling trench gate electrode (emitter connection part) TGc which connects the third linear trench gate electrode TG3 with the fourth linear trench gate electrode TG4 is provided periodically in the second direction (y direction, longitudinal direction). Then, at an intersection between the coupling trench gate electrode (emitter connection part) TGc and the contact groove CT ($P^+$-type body contact region PBC), the third linear trench gate electrode TG3 and the fourth linear trench gate electrode TG4 are connected to each other, and are electrically connected to the emitter electrode EE.

In the present first embodiment, note that a width Wc of the linear hole collector cell region LCc and a width Wa of the linear active cell region LCa are the same or substantially the same as each other, whereas this is not indispensable. However, the same or substantially the same manner has an advantage that hole distribution becomes uniform.

A P-type floating region PF is provided in the linear inactive cell region LCi. In the present first embodiment, a depth of the P-type floating region PF is deeper than the bottom end of the trench in which the first, second, third and fourth linear trench gate electrodes TG1, TG2, TG3 and TG4 are formed, and the bottom end has a structure to be covered. Such a structure is not indispensable. However, by adopting such a structure, there is an advantage that it becomes easy to maintain a breakdown voltage even if a width Wi of the linear inactive cell region LCi in the first direction (x direction) is made larger than a width Wa of the linear active cell region LCa in the first direction (x direction). In the present first embodiment, note that a width Wa of the linear active cell region LCa in the first direction (x direction) is made narrower than a width Wi of the linear inactive cell region LCi in the first direction (x direction), whereas this is not indispensable. However, by adopting the narrowing, an IE effect can be enhanced.

The outside of the periphery of the cell formation region CR has, for example, a part in which the P-type floating region PFp is provided so as to surround the periphery thereof, and this P-type floating region PFp is electrically connected to the emitter electrode EE by the contact groove CT (P$^+$-type body contact region PBCp).

In addition, for example, the gate wire GL is arranged outside the periphery of the cell formation region CR, and the first linear trench gate electrode TG1 and the second linear trench gate electrode TG2 have extended from the inside of the cell formation region CR toward this gate wire GL. Then, an end-part coupling trench gate electrode TGz of apart (that is, gate leading-out part TGw) to which the first linear trench gate electrode TG1 and second linear trench gate electrode TG2 have extended is electrically connected to the gate wire GL via a gate-wire/trench-gate-electrode connection part GTG. Note that a gap between the linear inactive cell region LCi and the outside of the periphery of the cell formation region CR is partitioned by an end-part trench gate electrode TGp.

Next, a cross-sectional structure taken along a line A-A in FIG. 2 will be described by using FIG. 3.

As illustrated in FIG. 3, a principal part of a semiconductor substrate SS is occupied by an N$^-$-type drift region ND, and an N-type field stop region Ns and a P$^+$-type collector region PC are provided on a rear surface (second main surface, lower surface) Sb side of the semiconductor substrate SS from the side close to the N$^-$-type drift region ND. In addition, a collector electrode CE electrically connected to the P$^+$-type collector region PC is provided on the rear surface Sb of the semiconductor substrate SS.

On the other hand, the P-type body region PB is provided on almost the whole surface of the front surface (first main surface, upper surface) Sa side of the semiconductor substrate SS (almost whole surface of the cell formation region CR).

A first trench T1 and a second trench T2 are provided on the front surface Sa side of the semiconductor substrate SS in the boundary section between the linear active cell region LCa and the linear inactive cell region LCi, and have insides in which the first linear trench gate electrode TG1 and the second linear trench gate electrode TG2 are provided via a gate insulation film GI, respectively.

The first linear trench gate electrode TG1 and the second linear trench gate electrode TG2 are electrically connected to the gate electrode (gate electrode GE illustrated in the FIG. 1). In addition, the first linear trench gate electrode TG1 is embedded from the bottom end of the first trench T1 formed in the semiconductor substrate SS to the top part. Similarly, the second linear trench gate electrode TG2 is embedded from the bottom end of the second trench T2 formed in the semiconductor substrate SS to the top part.

On the other hand, the third trench T3 and the fourth trench T4 are provided on the front surface Sa side of the semiconductor substrate SS in the boundary section between the linear hole collector cell region LCc and the linear inactive cell region LCi, and have insides in which the third linear trench gate electrode TG3 and the fourth linear trench gate electrode TG4 are provided via the gate insulation film GI, respectively.

The third linear trench gate electrode TG3 and the fourth linear trench gate electrode TG4 are electrically connected to the emitter electrode EE. In addition, while the third linear trench gate electrode TG3 is embedded in the bottom part of the third trench T3 formed in the semiconductor substrate SS, the upper surface thereof is positioned to be lower than the upper surface of the first linear trench gate electrode TG1 and the upper surface of the second linear trench gate electrode TG2, and besides, is positioned to be lower than the bottom surface of the P-type body region PB. Similarly, while the fourth linear trench gate electrode TG4 is embedded in the bottom part of the fourth trench T4 formed in the semiconductor substrate SS, the upper surface thereof is positioned to be lower than the upper surface of the first linear trench gate electrode TG1 and the upper surface of the second linear trench gate electrode TG2, and besides, is positioned to be lower than the bottom surface of the P-type body region PB.

In the linear active cell region LCa, the N$^+$-type emitter region NE is provided on the front surface Sa side of the semiconductor substrate SS, and the P$^+$-type body contact region PBC is provided in the bottom end of the contact groove CT. A P$^+$-type latch-up prevention region PLP is provided below this P$^+$-type body contact region PBC, and an N-type hole barrier region NHB is provided below the P$^+$-type latch-up prevention region PLP. Note that an impurity doped structure in the linear hole collector cell region LCc is the same as that of the linear active cell region LCa except that the N$^+$-type emitter region NE is not provided.

In the linear inactive cell region LCi, for example, the P-type floating region PF deeper than the first, second, third and fourth trenches T1, T2, T3 and T4 is provided below the P-type body region PB on the front surface Sa side of the semiconductor substrate SS.

As illustrated here, in the present first embodiment, while the N-type hole barrier region NHB and the P$^+$-type latch-up prevention region PLP, etc. are provided also in the linear hole collector cell region LCc as similar to the linear active cell region LCa, they are not indispensable. However, a hole flow as a whole can be balanced by providing them.

On almost the whole front surface Sa of the semiconductor substrate SS, an interlayer insulation film IL made of, for example, silicon oxide, etc. is formed. On the interlayer insulation film IL, the emitter electrode EE made of, for example, a metal film containing aluminum as a main component is provided, and is connected to the N$^+$-type emitter region NE and the P$^+$-type body contact region PBC via the contact groove CT.

On the emitter electrode EE, a final passivation film FPF made of, for example, a polyimide-based organic insulating film, etc., is further formed.

Next, a cross-sectional structure along a B-B line of FIG. 2 will be described by using FIG. 4.

As illustrated in FIG. 4, since the N$^+$-type emitter region NE is not provided also in the linear active cell region LCa in this cross-sectional surface, the linear active cell region LCa and the linear hole collector cell region LCc become the same as each other on a drawing. Structures of other parts are the same as the parts described in the FIG. 3. As a matter of course, as similar to the FIG. 3, it is different that the first linear trench gate electrode TG1 and the second linear trench gate electrode TG2 are electrically connected to a gate electrode (gate electrode GE illustrated in the FIG. 1) and that the third linear trench gate electrode TG3 and the fourth linear trench gate electrode TG4 are electrically connected to the emitter electrode EE.

Next, a cross-sectional structure taken along a line C-C of FIG. 2 will be described by using FIG. 5.

As illustrated in FIG. 5, structures other than the linear hole collector cell region LCc are the same as structures described with respect to the FIG. 4. The part of the linear hole collector cell region LCc has a structure which is occupied by almost only the coupling trench gate electrode TGc (emitter connection part).

Note that the IE type trench gate IGBT which has the "narrow-active-cell type unit cell" has been specifically described in the present first embodiment. However, it is needless to say that the present first embodiment is not limited to this, and is applicable also to an IE type trench gate IGBT which has the "non-narrow-active-cell type unit cell".

In addition, although the IE type trench gate IGBT which has the "alternate arrangement system" has been specifically described in the present first embodiment, it is needless to say that the present first embodiment is not limited to this, and is applicable also to an IE type trench gate IGBT which has a "non-alternate arrangement system".

Here, in order to more specifically exemplify a structure of the IE type trench gate IGBT, one example of main dimensions of each part (see FIGS. 1 to 5) of the IE type trench gate IGBT will be shown.

A width Wa of the linear active cell region LCa is about 1.3 μm, and a width Wi of the linear inactive cell region LCi is about 3.3 μm. Here, a width Wa of the linear active cell region LCa is desired to be narrower than a width Wi of the linear inactive cell region LCi, and a value of Wi/Wa is particularly preferred to be in a range of, for example, 2 to 3.

In addition, a width of the contact groove CT is about 0.3 μm. Each width of the first, second, third and fourth trenches T1, T2, T3 and T4 is about 0.7 μm (particularly preferably 0.8 μm or less), and a depth of each of them is about 3 μm. A depth of the $N^+$-type emitter region NE from the front surface Sa of the semiconductor substrate SS is about 0.25 μm, a depth of the P-type body region PB (channel region) is about 0.8 μm, a depth of the $P^+$-type latch-up prevention region PLP is about 1.4 μm, and a depth of the P-type floating region PF is about 4.5 μm. A depth of the N-type field stop region Ns from the rear face Sb of the semiconductor substrate SS is about 2.0 μm, and a depth of the $P^+$-type collector region PC is about 0.5 μm.

In addition, a thickness of the semiconductor substrate SS is about 70 μm (here, a breakdown voltage of about 600 V is exemplified). Note that a thickness of the semiconductor substrate SS depends strongly on a requested breakdown voltage. Therefore, for example, the thickness is about 120 μm at a breakdown voltage of 1200 V, and the thickness is about 40 μm at a breakdown voltage of 400 V.

Note that dimensions of corresponding parts are almost the same as what are shown here also in the following examples, and therefore, descriptions thereof are not repeated.

<<Effect of IE Type Trench Gate IGBT>>

1. Gate Capacitance of IE Type Trench Gate IGBT

As a method of enhancing further an ON-state voltage performance of the IE type trench gate IGBT, it is effective to shrink a cell and to enhance an IE effect. However, when a cell is shrunk simply, a switching loss is deteriorated by increase in a gate capacitance accompanied by a high trench density. Accordingly, the present inventor has studied various structures of the IE type trench gate IGBT which can reduce the gate capacitance.

Figure 6:
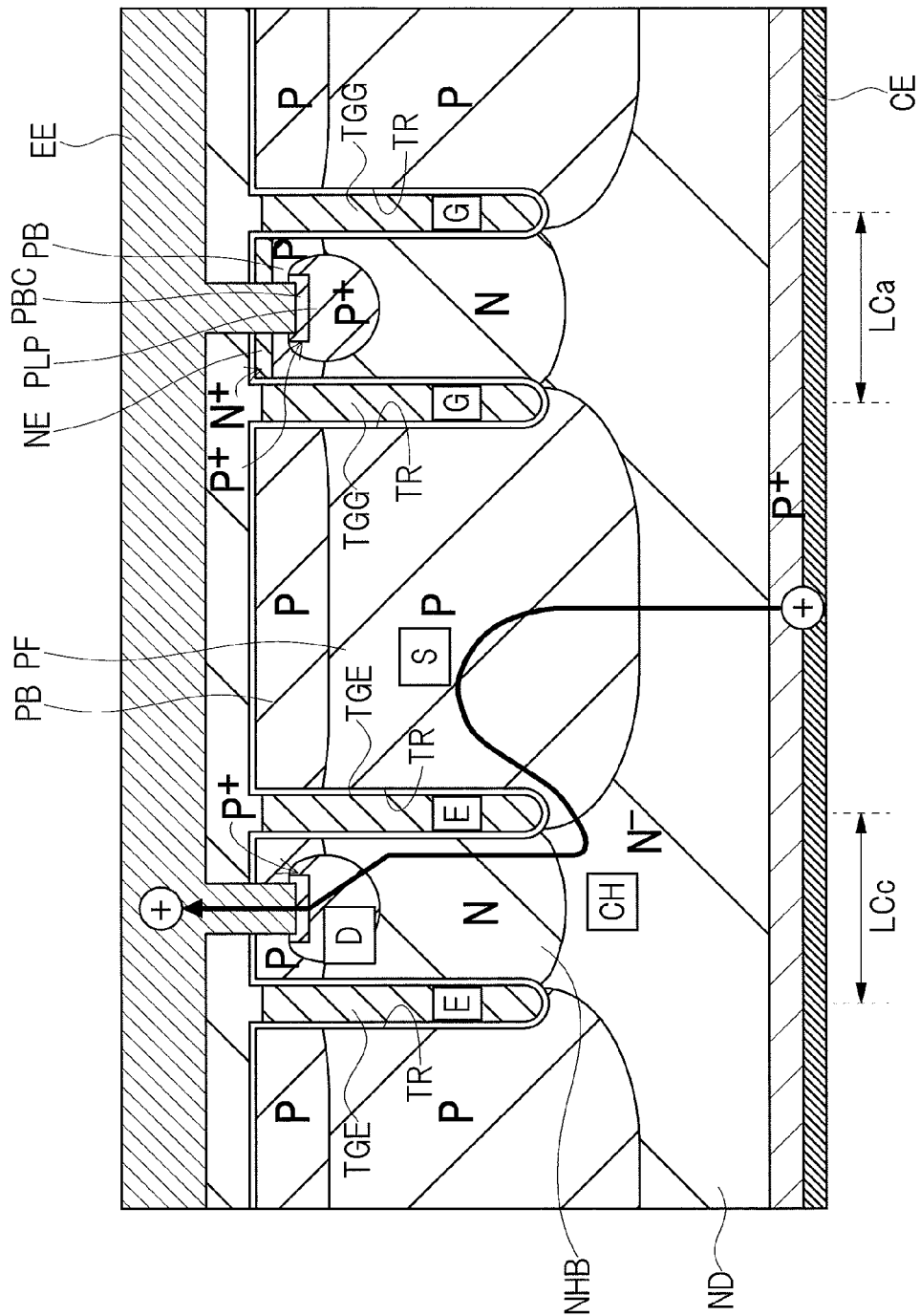
FIG. 6 is a schematic view explaining a structure of an IE-type trench gate IGBT studied by the present inventor and shown as a comparative example.

First, before an effect of the IE type trench gate IGBT according to the present first embodiment is described, a structure of an IE type trench gate IGBT which the present inventor has studied prior to the present first embodiment will be described briefly by using FIG. 6 as a comparative example. FIG. 6 is a schematic diagram illustrating a structure of an IE type trench gate IGBT shown as the comparative example and studied by the present inventor.

As similar to the present first embodiment, the IE type trench gate IGBT based on the comparative example has a structure in which the linear active cell regions LCa are replaced in, for example, every other region by the linear hole collector cell region LCc (that is, an apparently-formed linear active cell region obtained by removing the $N^+$-type emitter region NE (source of an FET) so that an FET (Field Effect Transistor) part is not operated as an FET).

Then, in a trench TR formed on both sides of the linear active cell region LCa, a trench gate electrode TGG is embedded from the bottom end of the trench TR up to the upper part, and this trench gate electrode TGG is electrically connected to a gate electrode (gate electrode GE illustrated in the FIG. 1). In addition, in a trench TR formed on both sides of the linear hole collector cell region LCc, the trench gate electrode TGE is embedded from the bottom end of the trench TR up to the upper part, and this trench gate electrode TGE is electrically connected to an emitter electrode.

Incidentally, a parasitic PMOS transistor is formed in the IE type trench gate IGBT based on this comparative example. That is, a parasitic PMOS transistor is formed so that the P-type floating region PF is assumed to be a source "S", and the $N^-$-type drift region ND and the N-type hole barrier region NHB are assumed to be a channel "CH", and the $P^+$-type latch-up prevention region PLP and the $P^+$-type body contact region PBC are assumed to be a drain "D", and the trench gate electrode TGE formed on both sides of the linear hole collector cell region LCc is assumed to be a gate "E". Note that the trench gate electrode TGE formed on both sides of the linear hole collector cell region LCc is indicated as a gate "E" and the trench gate electrode TGG formed on both sides of the linear active cell region LCa is indicated as a gate "G" so that both of them are distinguished from each other.

Therefore, when a hole is implanted into the P-type floating region PF in the IE type trench gate IGBT based on this comparative example, an electric potential of the source "S" of the parasitic PMOS transistor increases, and a negative electric potential difference is generated between the gate "E" and source "S" of the parasitic PMOS transistor. As a result, the parasitic PMOS transistor is turned on, and the hole implanted into the P-type floating region PF is discharged to the drain "D" of the parasitic MOSFET.

As described above, the IE type trench gate IGBT based on the comparative example has a feature that excessive holes are difficult to remain and accumulated in the P-type floating region PF in a transient state at the time of a switching operation because the hole implanted into the P-type floating region PF is discharged from the P-type floating region PF. In this manner, an uncontrollable potential variation in a transient state of the P-type floating region PF can be suppressed, and therefore, a low noise performance becomes excellent.

However, when the cell shrink is further studied in the IE type trench gate IGBT based on the comparative example, it has become clear that a capacitance (feedback capacitance) between the gate and collector can be reduced while a capacitance (input capacitance) between the gate and emitter cannot be reduced. A capacitance between the gate and the collector mainly affects a switching-off loss, and a capacitance between the gate and the emitter mainly affects a switching-on loss. That is, even if the cell shrink is further performed, the switching-on loss is deteriorated when a capacitance between the gate and emitter cannot be reduced.

Accordingly, in the present first embodiment, as illustrated in the FIG. 3 and the FIG. 4, a height from the bottom ends of the third linear trench gate electrode TG3 and the fourth linear trench gate electrode TG4 which are formed inside the third trench T3 and the fourth trench T4 which are formed on both sides of the linear hole collector cell region LCc is adjusted, respectively.

That is, the upper surface of the third linear trench gate electrode TG3 is made lower than the upper surface of the first linear trench gate electrode TG1 and the upper surface of the second linear trench gate electrode TG2, and besides, is made lower than the bottom surface of the P-type body region PB. Similarly, the upper surface of the fourth linear trench gate electrode TG4 is made lower than the upper surface of the first linear trench gate electrode TG1 and the upper surface of the second linear trench gate electrode TG2, and besides, is made lower than the bottom surface of the P-type body region PB.

In this manner, an area obtained when the third linear trench gate electrode TG3 and the fourth linear trench gate electrode TG4 contributes to the input capacitance can be reduced, and therefore, the input capacitance can be reduced. However, as a height from the bottom end of the third trench to the upper surface of the third linear trench gate electrode TG3 and a height from the bottom end of the fourth trench to the upper surface of the fourth linear trench gate electrode TG4, a height at which an emitter potential for turning on the parasitic PMOS transistor can be supplied is required. That is, when an existence of the parasitic PMOS transistor itself is excluded by etching all the third linear trench gate electrode TG3 and the fourth linear trench gate electrode TG4 in order to make the input capacitance as small as possible, the advantage resulting from the existence of the parasitic PMOS transistor described above cannot be obtained.

Figure 7:
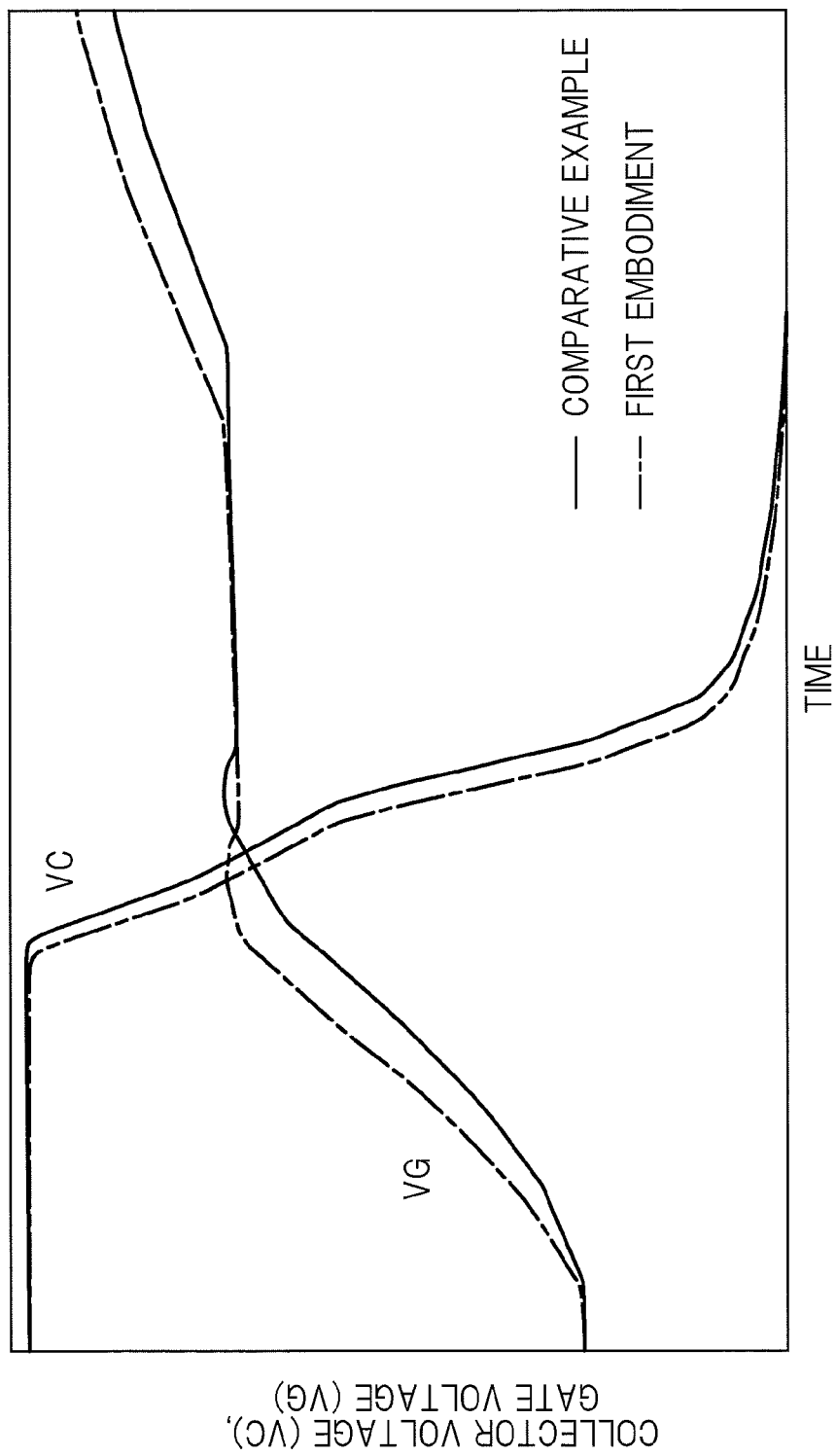
FIG. 7 is a graph diagram showing a switching property (turn-on waveform) of the IE-type trench gate IGBT according to the first embodiment.

FIG. 7 is a graph chart illustrating switching characteristics (turn-on waveform) of the IE type trench gate IGBT according to the present first embodiment.

As illustrated in FIG. 7, the IE type trench gate IGBT according to the present first embodiment has the smaller input capacitance and an early rising-up of a gate voltage than that of the IE type trench gate IGBT based on the comparative example. In this manner, it is found out that the IE type trench gate IGBT according to the present first embodiment can be improved in the switching loss more than the IE type trench gate IGBT based on the comparative example.

Note that there is no difference between a feedback capacitance of the IE type trench gate IGBT and a feedback capacitance of the IE type trench gate IGBT based on the comparative example, and an equivalent turn-off waveform is obtained.

2. ON-State Voltage of IE Type Trench Gate IGBT

In addition, the IE type trench gate IGBT according to the present first embodiment can be lower in an ON-state voltage than the IE type trench gate IGBT based on the comparative example.

Figure 8:
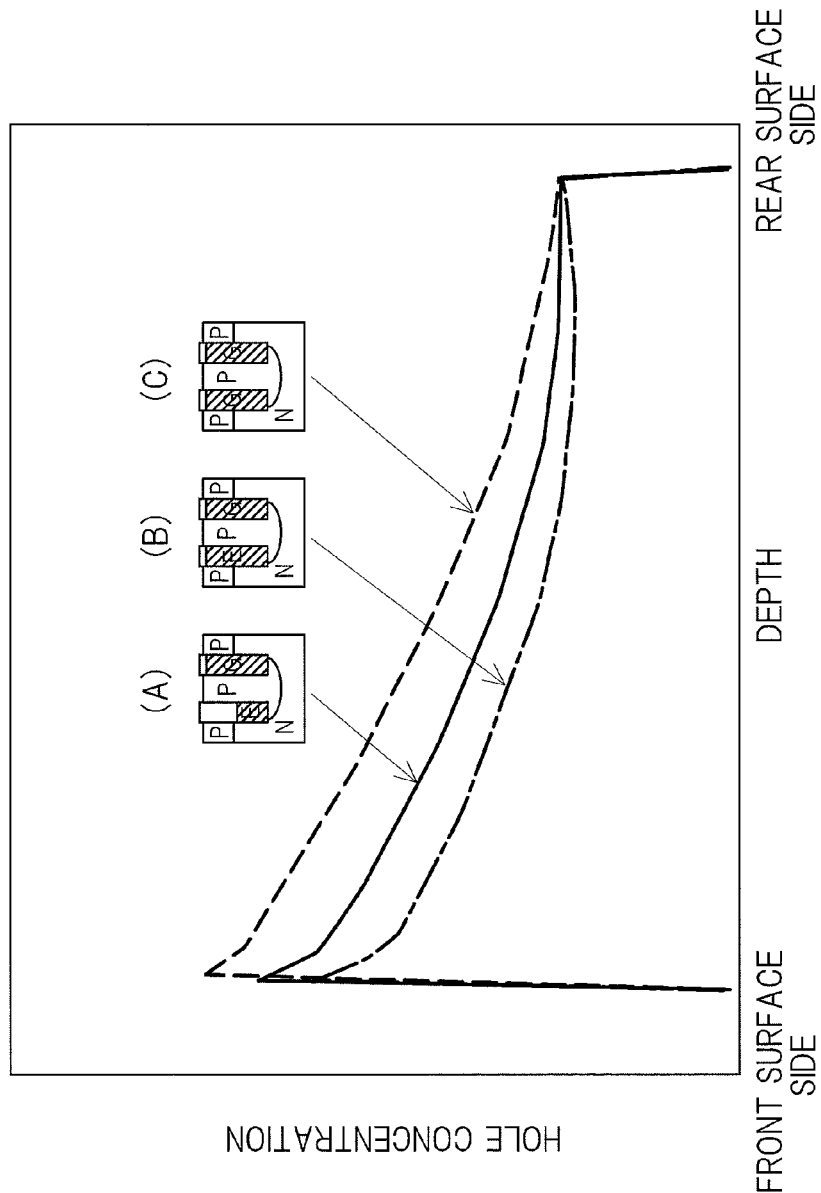
FIG. 8 is a graph diagram explaining the hole accumulation effect of the IE-type trench gate IGBT according to the first embodiment.

FIG. 8 is a graph chart for explaining a hole accumulation effect of the IE type trench gate IGBT according to the present first embodiment. An item (A) indicates a hole concentration distribution of the IE type trench gate IGBT according to the present first embodiment, and (B) indicates a hole concentration distribution of the IE type trench gate IGBT based on the comparative example, and (C) indicates a hole concentration distribution of an IE type trench gate IGBT where only the linear active cell region is formed.

As illustrated in FIG. 8, the IE type trench gate IGBT (A) according to the present first embodiment is higher in a hole accumulation effect on the front surface side of the semiconductor substrate than the IE type trench gate IGBT (B) based on the comparative example. In this manner, it is considered that an ON-state voltage becomes low.

It is considered that this is because the upper surface of the third linear trench gate electrode TG3 and the upper surface of the fourth linear trench gate electrode TG4 in the IE type trench gate IGBT according to the present first embodiment are positioned to be lower than the bottom surface of the P-type body region PB. That is, since the gate "E" and the drain "D" have an offset structure in the parasitic PMOS transistor, a driving ability of the parasitic PMOS transistor is suppressed, and excessive hole exclusion can be suppressed.

3. With Respect to Active Cell Thinning Rate

In the present first embodiment, an active cell thinning rate is defined as a rate obtained by dividing a width of various cell regions (hole non-outflow cell part) which do not configure a hole outflow path by a width of various cell regions (hole outflow cell part) which configures the hole outflow path in a principal part of the cell formation region.

Therefore, for example, in an example of the FIG. 2, the hole outflow cell part is the linear active cell region LCa and the linear hole collector cell region LCc, and the hole non-outflow cell part is the linear inactive cell region LCi. Here, since a width Wa of the linear active cell region LCa and a width Wc of the linear hole collector cell region LCc are equal to each other, a relation of "an active cell thinning rate=Wi/Wa" is provided.

Since the IE effect is weak in a region where an active cell thinning rate is lower than about 1, an ON-state voltage becomes high. On the other hand, since a hole discharge resistance becomes large in a region where an active cell thinning rate is higher than about 5, a switching loss increases rapidly in spite of no change in the ON-state voltage so much. Accordingly, in the present first embodiment, a range of 1.5 to 4 (more preferably, 2 to 3) is set as the active cell thinning rate.

In the present first embodiment, for example, a width Wa of the linear active cell region LCa (width Wc of the linear hole collector cell region LCc) is assumed to be about 1.3 μm, and a width Wi of the linear inactive cell region LCi is assumed to be about 3.3 μm, and an active cell thinning rate Wi/Wa is as about 2.5.

In this manner, the present first embodiment provides a structure in which the linear active cell region LCa is replaced in, for example, every other one by the linear hole collector cell region LCc (that is, an apparently-formed linear active cell region obtained by removing the $N^+$-type emitter region NE (source of an FET) so that an FET part is not operated as FET). In addition, the third linear trench gate electrode TG3 and the fourth linear trench gate electrode TG4 which are formed on both sides of the linear hole collector cell region LCc are electrically connected to the emitter electrode EE, and the upper surfaces of them are set at a position lower than the upper surfaces of the first linear trench gate electrode TG1 and the second linear trench gate electrode TG2 which are formed on both sides of the linear active cell region LCa and lower than the bottom surface of the P-type body region PB.

In this manner, even a cell shrink is performed, deterioration of a switching-on loss resulting from the increase in the gate capacitance (particularly, capacitance (input capacitance) between the gate and the emitter) can be avoided, and a low noise performance is also maintainable because of the existence of the parasitic PMOS transistor having a drain offset structure.

<<Method of Manufacturing IE Type Trench Gate IGBT>>

A method of manufacturing the IE type trench gate IGBT according to the present first embodiment will be described by using FIGS. 9 to 28. FIGS. 9 to 28 are cross-sectional views of a principal part illustrating a manufacturing process of the IE type trench gate IGBT according to the present first embodiment. The following is explanation mainly for a cell formation region. However, the FIG. 1 will be referred to as needed for peripheries, etc. In addition, the following is specific explanation for the first linear unit cell region LC1 including the linear active cell region LCa and the linear inactive cell region LCi, and the second linear unit cell region LC2 including the linear hole collector cell region LCc and the linear inactive cell region LCi.

Figure 9:
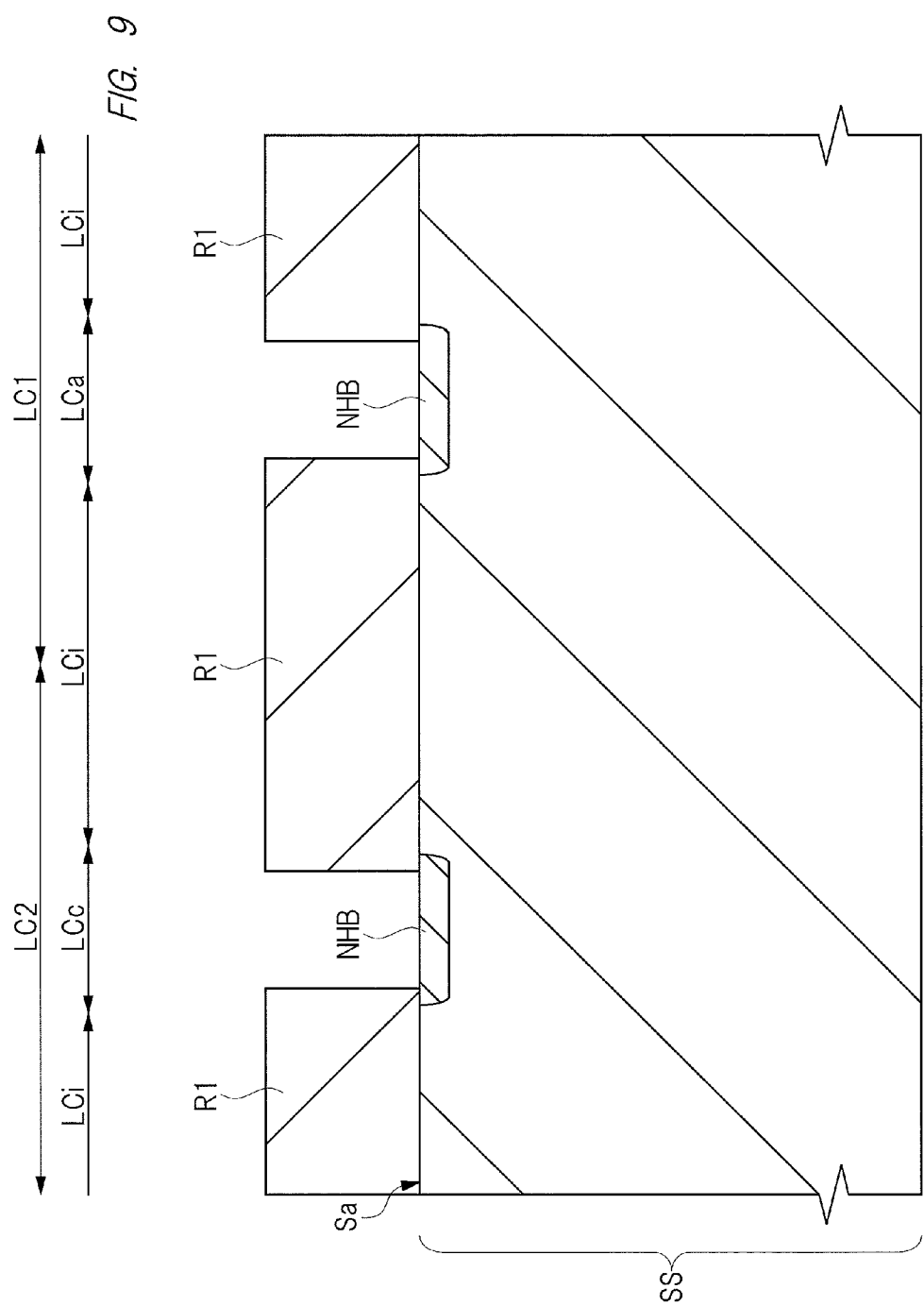
FIG. 9 is a cross-sectional view of a principal part showing a manufacturing process of the IE-type trench gate IGBT according to the first embodiment.

First, as illustrated in FIG. 9, a semiconductor substrate (in this stage, semiconductor thin plate having a plane substantially-circle shape, referred to as a wafer) SS made of N⁻-type silicon single crystal (containing, for example, phosphorus concentration of about $2\times10^{14}/cm^3$) is prepared. The semiconductor substrate SS is a wafer of, for example, 200 φ (or may be wafers having various diameters of 150 φ, 100 φ, 300 φ and 450 φ, etc.). In addition, a thickness of a wafer is, for example, about 800 μm (as a preferred range, about 450 μm to 1000 μm). Here, for example, a wafer based on a FZ (Floating Zone) method is the most preferable. However, a wafer based on a CZ (Czochralski) method may be applicable.

Next, a resist film R1 for introducing the N-type hole barrier region is formed by coating, etc., on the whole surface on the front surface Sa of the semiconductor substrate SS, and is patterned by usual lithography. By introducing an N-type impurity into the front surface Sa of the semiconductor substrate SS by, for example, ion implantation with the patterned resist film R1 as a mask, the N-type hole barrier region NHB is formed. For example, ion species: phosphorus, a dose amount: about $6\times10^{12}/cm^2$ and an implanting energy: about 80 KeV can be exemplified as the preferred ion implantation conditions at this time. Subsequently, the unnecessary resist film R1 removed by ashing, etc.

Figure 10:
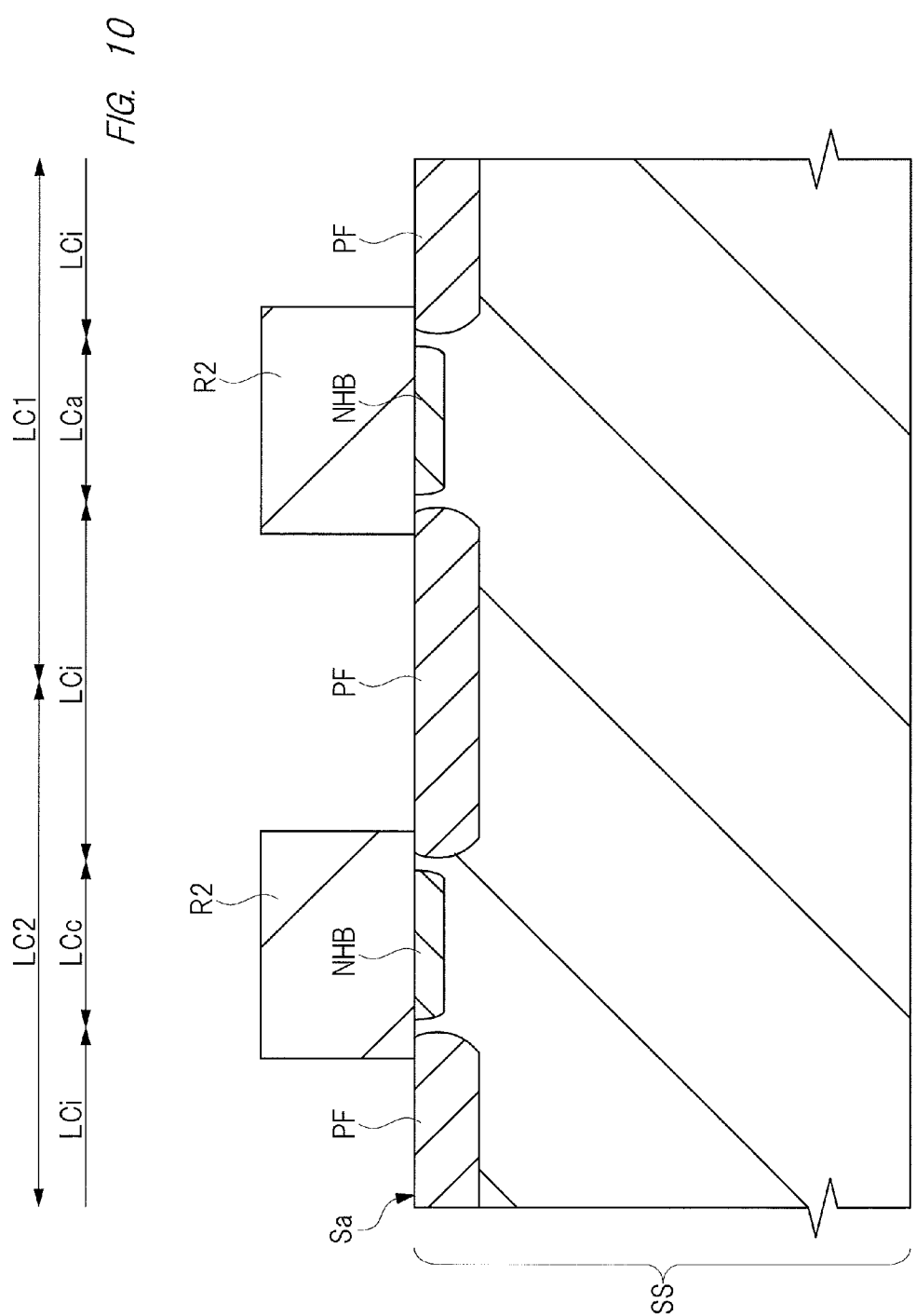
FIG. 10 is a cross-sectional view of a principal part in the manufacturing process of the IE-type trench gate IGBT, continued from FIG. 9.

Next, as illustrated in FIG. 10, a resist film R2 for introducing the P-type floating region is formed by coating, etc., on the whole surface on the front surface Sa of the semiconductor substrate SS, and is patterned by usual lithography. By introducing a P-type impurity into the front surface Sa of the semiconductor substrate SS by, for example, ion implantation with the patterned resist film R2 as a mask, the P-type floating region PF is formed. For example, ion species: boron, a dose amount: about $3.5\times10^{13}/cm^2$ and an implanting energy: about 75 KeV can be exemplified as preferred ion implantation conditions at this time. Subsequently, the unnecessary resist film R2 is removed by ashing, etc. Note that, for example, a cell peripheral junction region and floating field ring are also introduced at the same time when the P-type floating region PF is introduced.

Figure 11:
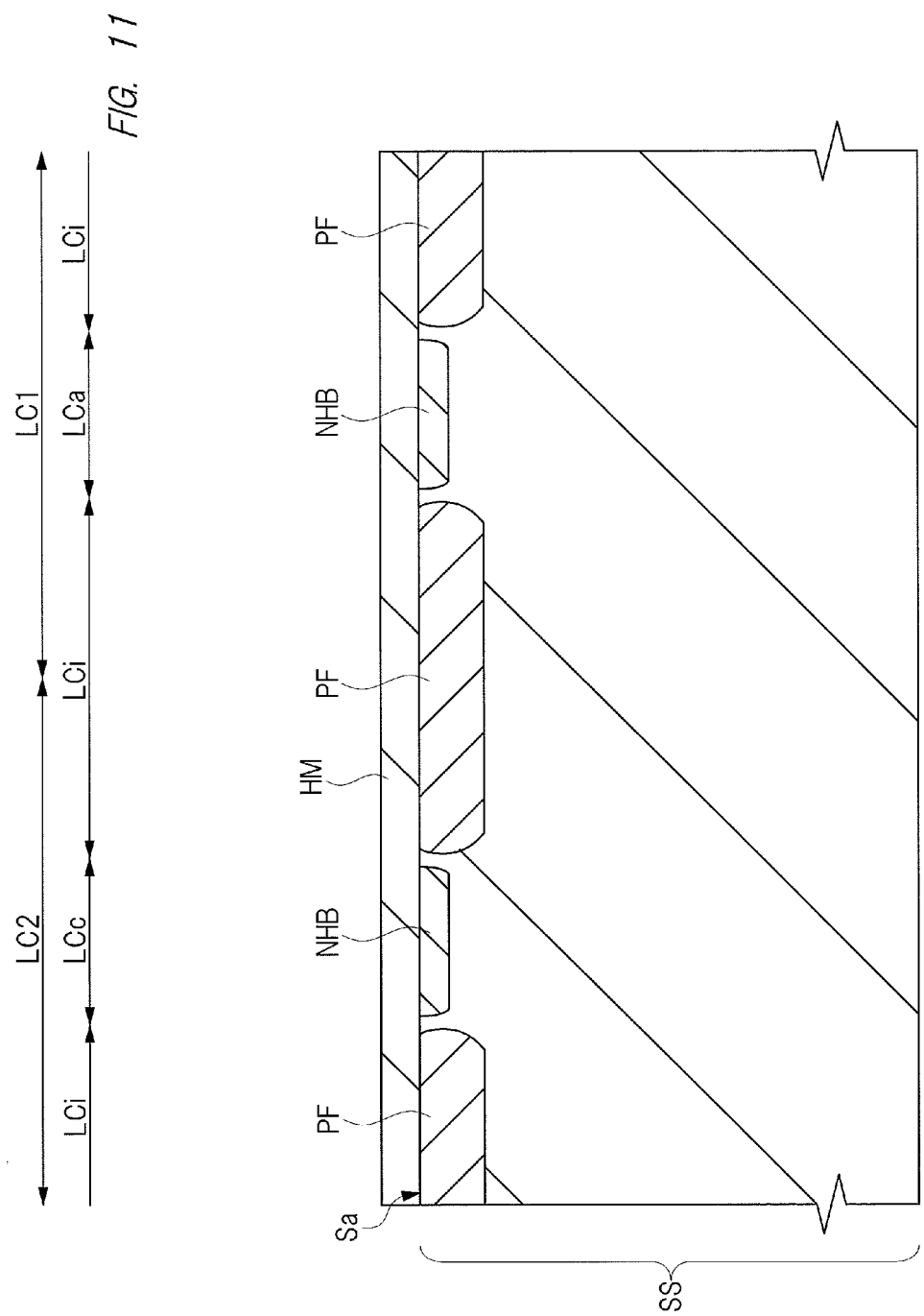
FIG. 11 is a cross-sectional view of a principal part in a manufacturing process of the IE-type trench gate IGBT, continued from FIG. 10.

Next, as illustrated in FIG. 11, a hard mask film HM of, for example, silicon oxide is formed by, for example, CVD (Chemical Vapor Deposition), etc. on the whole surface on the front surface Sa of the semiconductor substrate SS. A thickness of the hard mask film HM is, for example, about 450 nm.

Figure 12:
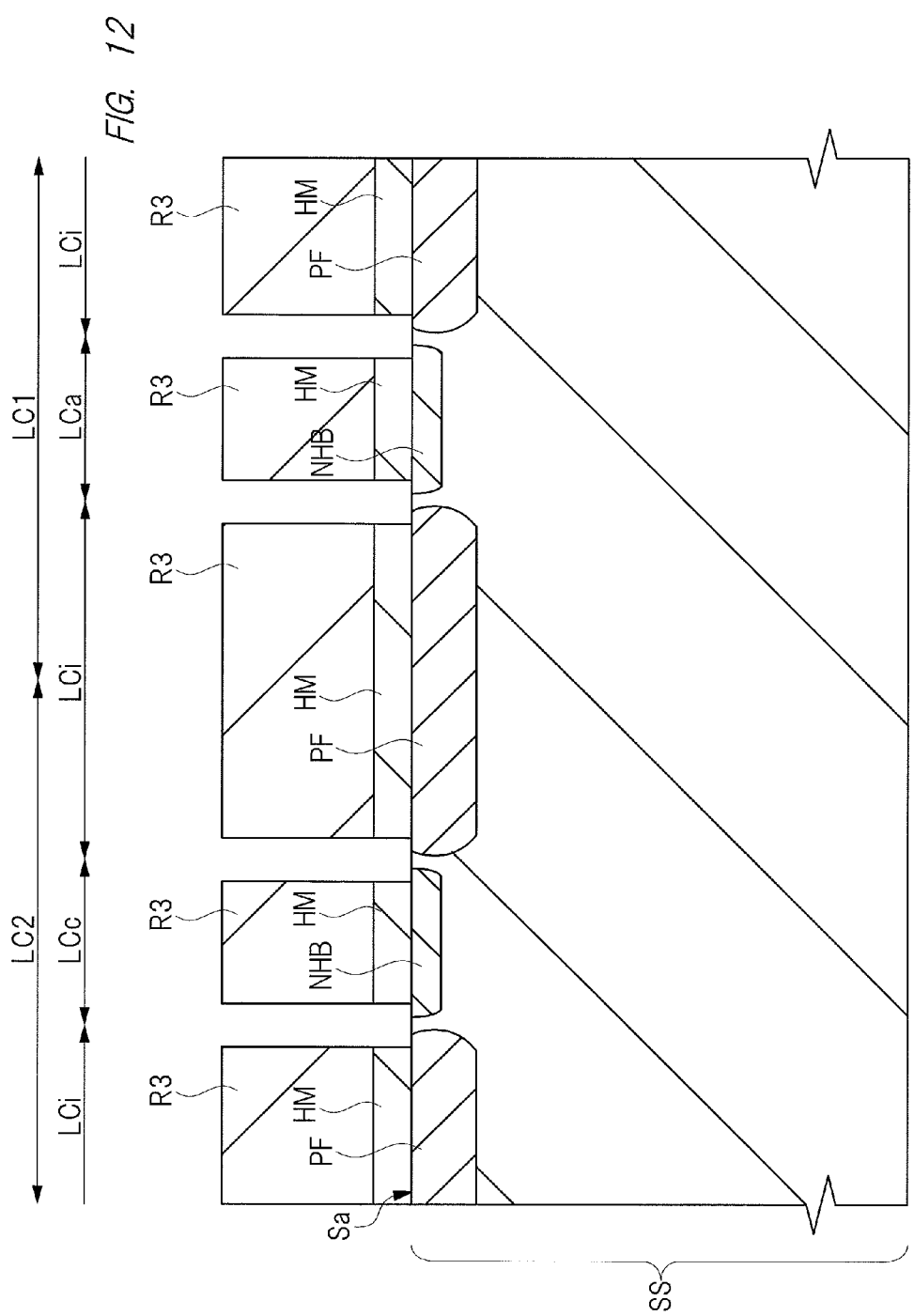
FIG. 12 is a cross-sectional view of a principal part in the manufacturing process of the IE-type trench gate IGBT, continued from FIG. 11.

Next, as illustrated in FIG. 12, a resist film R3 for processing a hard mask film is formed on the whole surface on the front surface Sa of the semiconductor substrate SS by coating, etc., and is patterned by usual lithography. The hard mask film HM is patterned by, for example, dry etching with the patterned resist film R3 as a mask.

Figure 13:
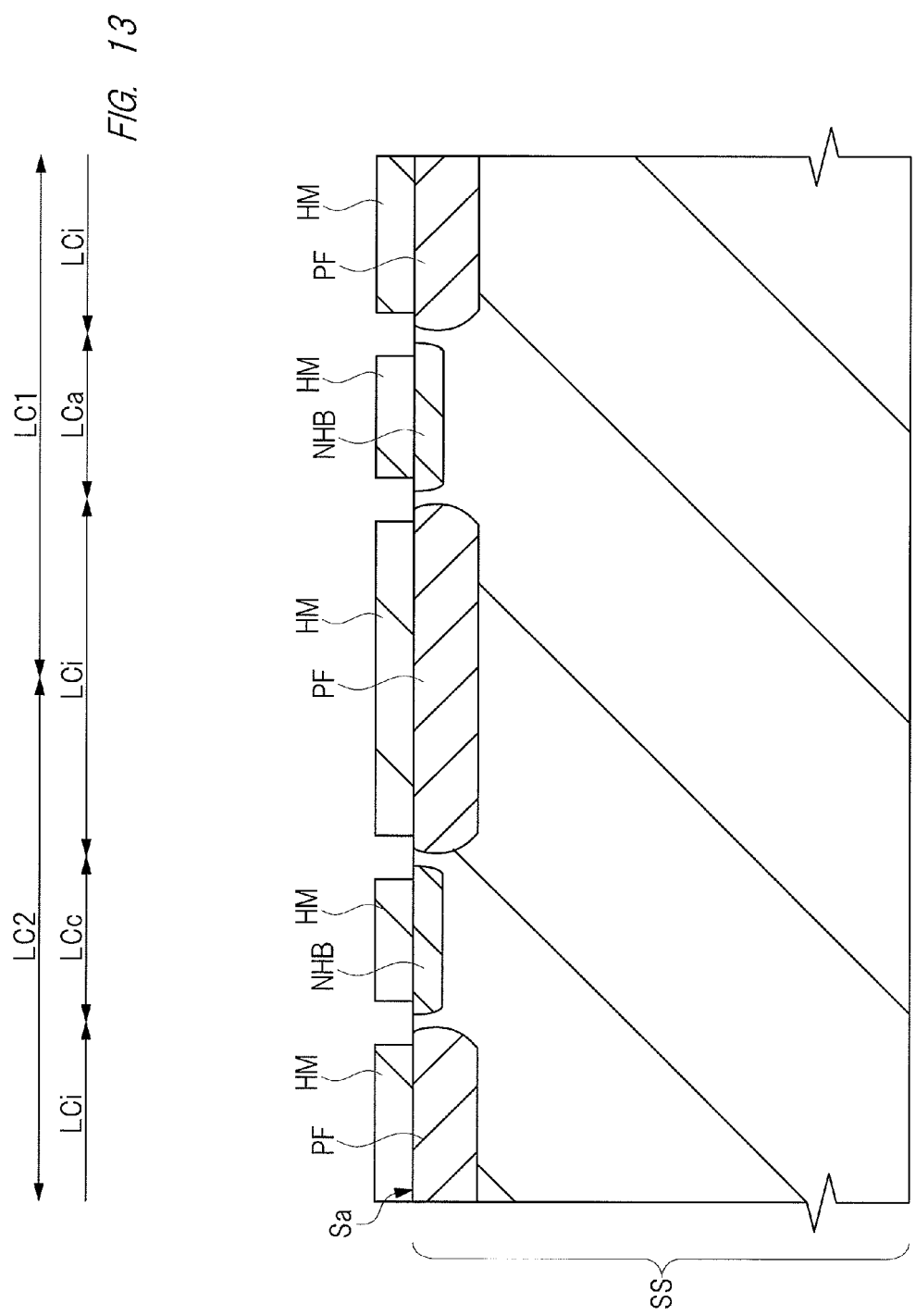
FIG. 13 is a cross-sectional view of a principal part in the manufacturing process of the IE-type trench gate IGBT, continued from FIG. 12.

Subsequently, as illustrated in FIG. 13, the unnecessary resist film R3 is removed by ashing, etc.

Figure 14:
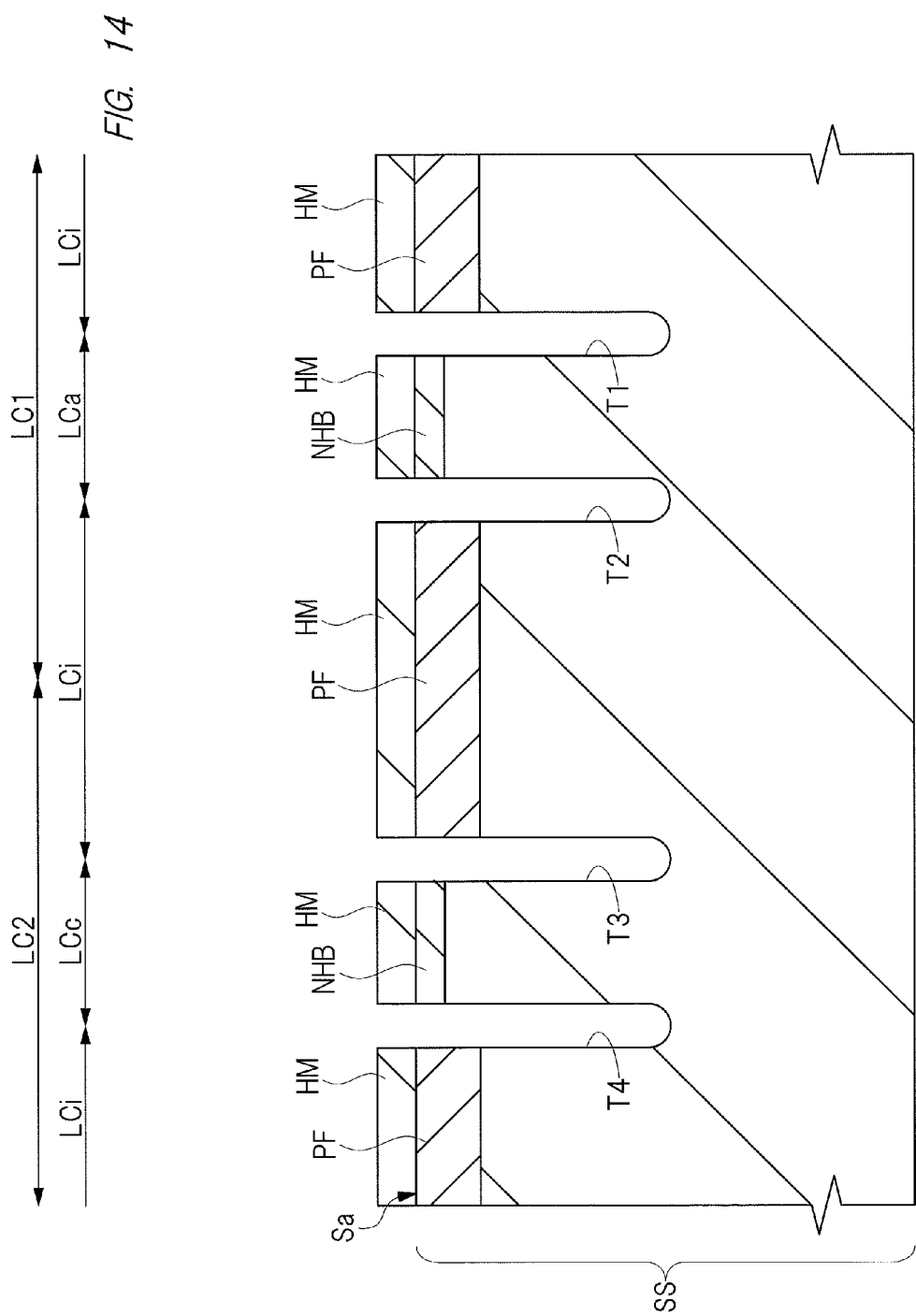
FIG. 14 is a cross-sectional view of a principal part in the manufacturing process of the IE-type trench gate IGBT, continued from FIG. 13.

Next, as illustrated in FIG. 14, the first, second, third and fourth trenches T1, T2, T3 and T4 are formed by, for example, anisotropic dry etching using the patterned hard mask film HM. As a gas system of this anisotropic dry etching, for example, $Cl_2/O_2$-based gas can be exemplified as a preferred gas.

Figure 15:
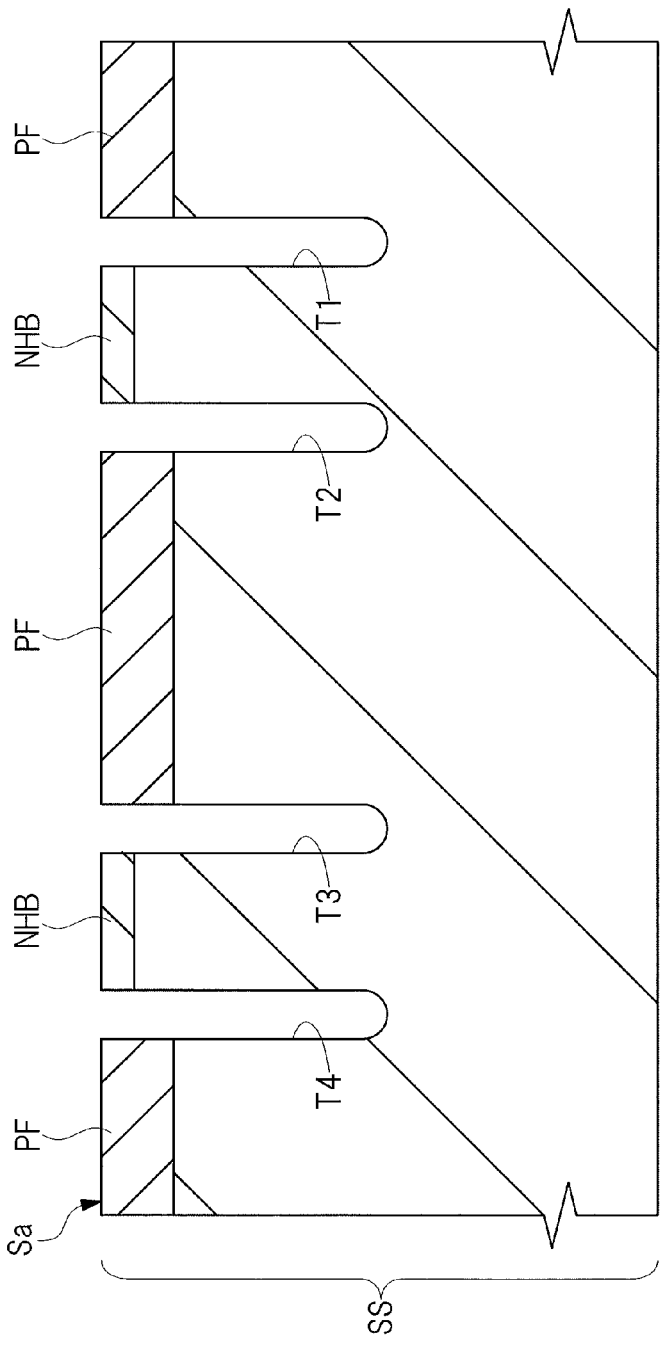
FIG. 15 is a cross-sectional view of a principal part in the manufacturing process of the IE-type trench gate IGBT, continued from FIG. 14.

Subsequently, as illustrated in FIG. 15, the unnecessary hard mask film HM is removed by wet etching using, for example, a fluoric acid-based etching solution, etc.

Figure 16:
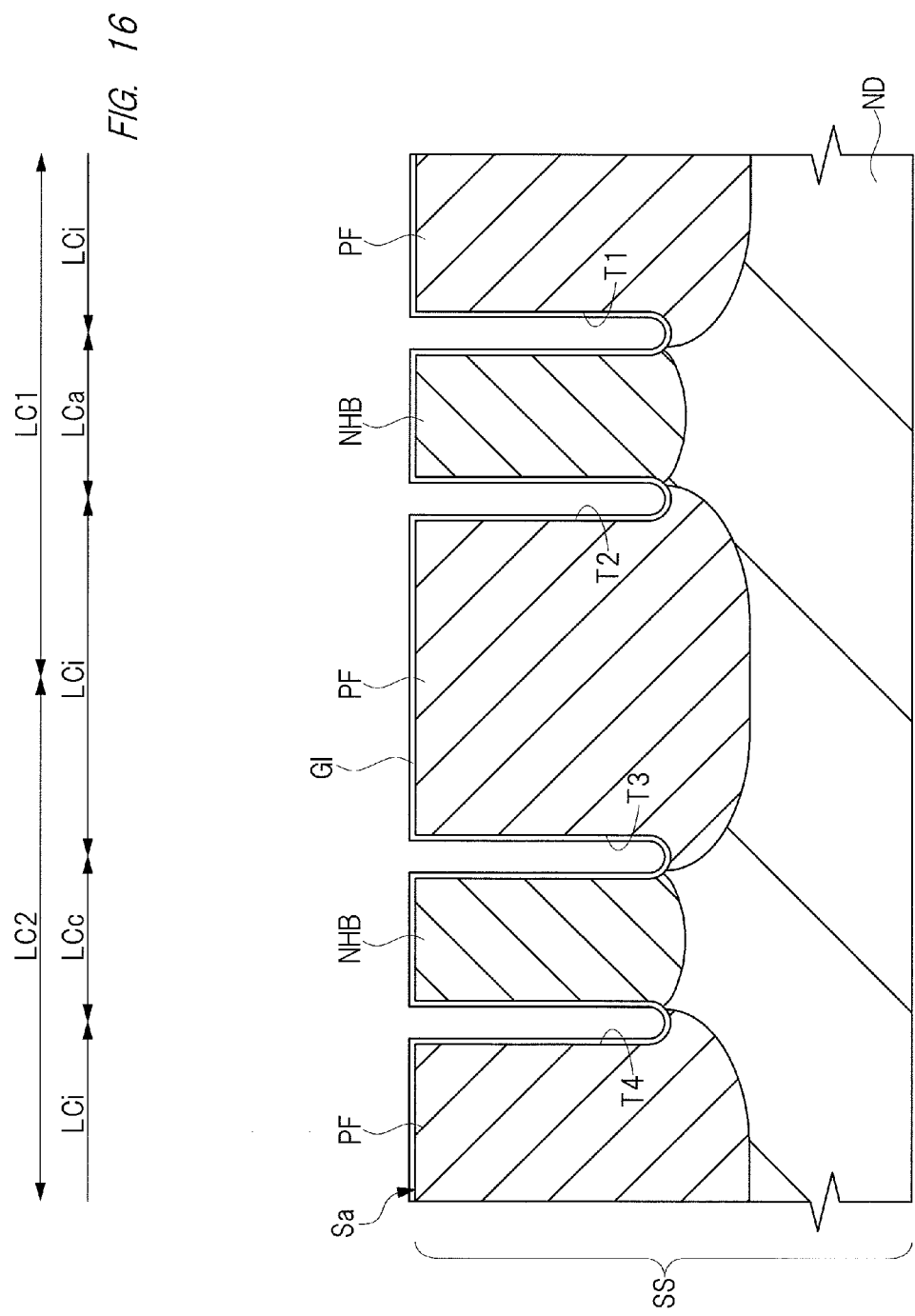
FIG. 16 is a cross-sectional view of a principal part in the manufacturing process of the IE-type trench gate IGBT, continued from FIG. 15.

Next, as illustrated in FIG. 16, a diffusion process (for example, at 1200° C. for about 30 minutes) is performed for the P-type floating region PF and the N-type hole barrier region NHB. In this manner, a depth of the P-type floating region PF is formed to be deeper than the bottom ends of the first, second, third and fourth trenches T1, T2, T3, and T4 where the first, second, third and fourth linear trench gate electrodes TG1, TG2, TG3 and TG4 are formed so as to cover the bottom ends. A region of the semiconductor substrate SS where the P-type floating region PF and the N-type hole barrier region NHB are not formed becomes the N⁺-type drift region ND.

Next, by, for example, thermal oxidation, etc., the gate insulation film GI is formed on the whole surface on the front surface Sa of the semiconductor substrate SS and on inner walls of the first, second, third and fourth trenches T1, T2, T3 and T4. A thickness of the gate insulation film GI is, for example, about 0.12 μm.

Figure 17:
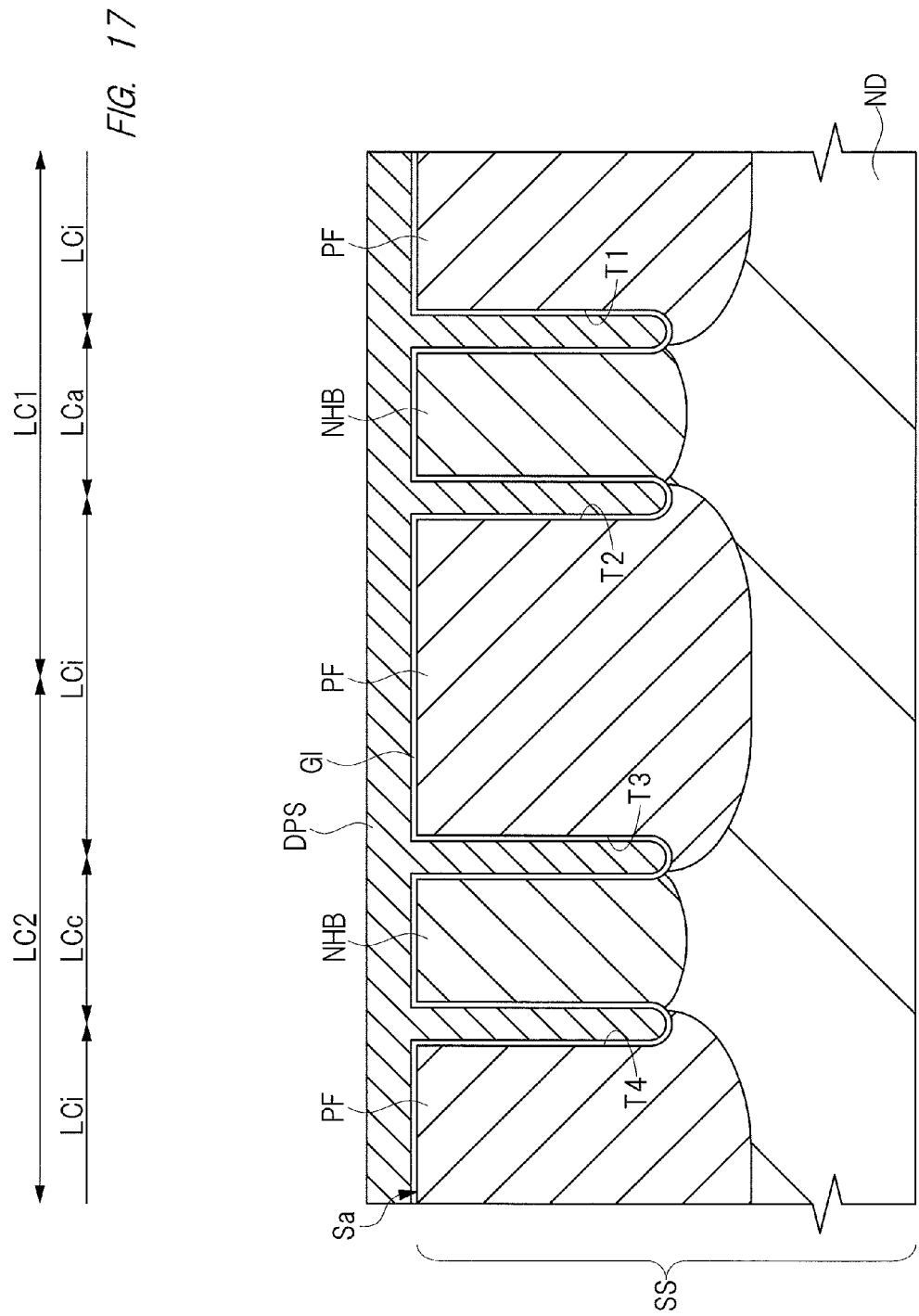
FIG. 17 is a cross-sectional view of a principal part in the manufacturing process of the IE-type trench gate IGBT, continued from FIG. 16.

Next, as illustrated in FIG. 17, a polycrystalline silicon (Doped Poly-Silicon) film DPS to which phosphorus is doped is formed by, for example, CVD, etc., on the whole surface on the front surface Sa of the semiconductor substrate SS and inside the first, second, third and fourth trenches T1, T2, T3 and T4. A thickness of the polycrystalline silicon film DPS is, for example, about 0.6 μm.

Figure 18:
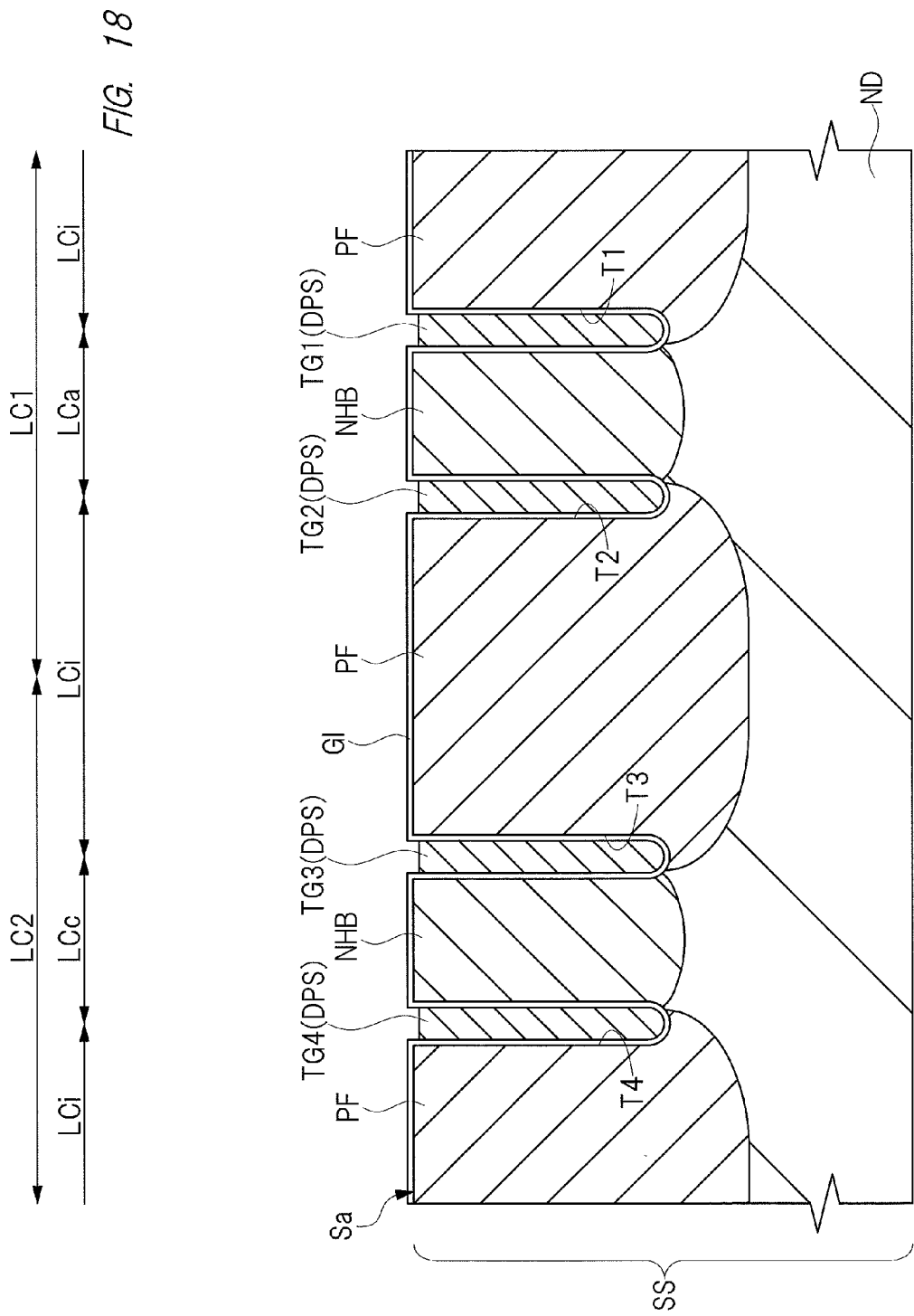
FIG. 18 is a cross-sectional view of a principal part in the manufacturing process of the IE-type trench gate IGBT, continued from FIG. 17.

Next, as illustrated in FIG. 18, the polycrystalline silicon film DPS is etched back by, for example, dry etching, etc. In this manner, the first linear trench gate electrode TG1 is formed inside the first trench T1, and the second linear trench gate electrode TG2 is formed inside the second trench T2, and the third linear trench gate electrode TG3 is formed inside the third trench T3, and the fourth linear trench gate electrode TG4 is formed inside the fourth trench T4. For example, $SF_6$, etc., can be exemplified as a gas system of this etching back.

Figure 19:
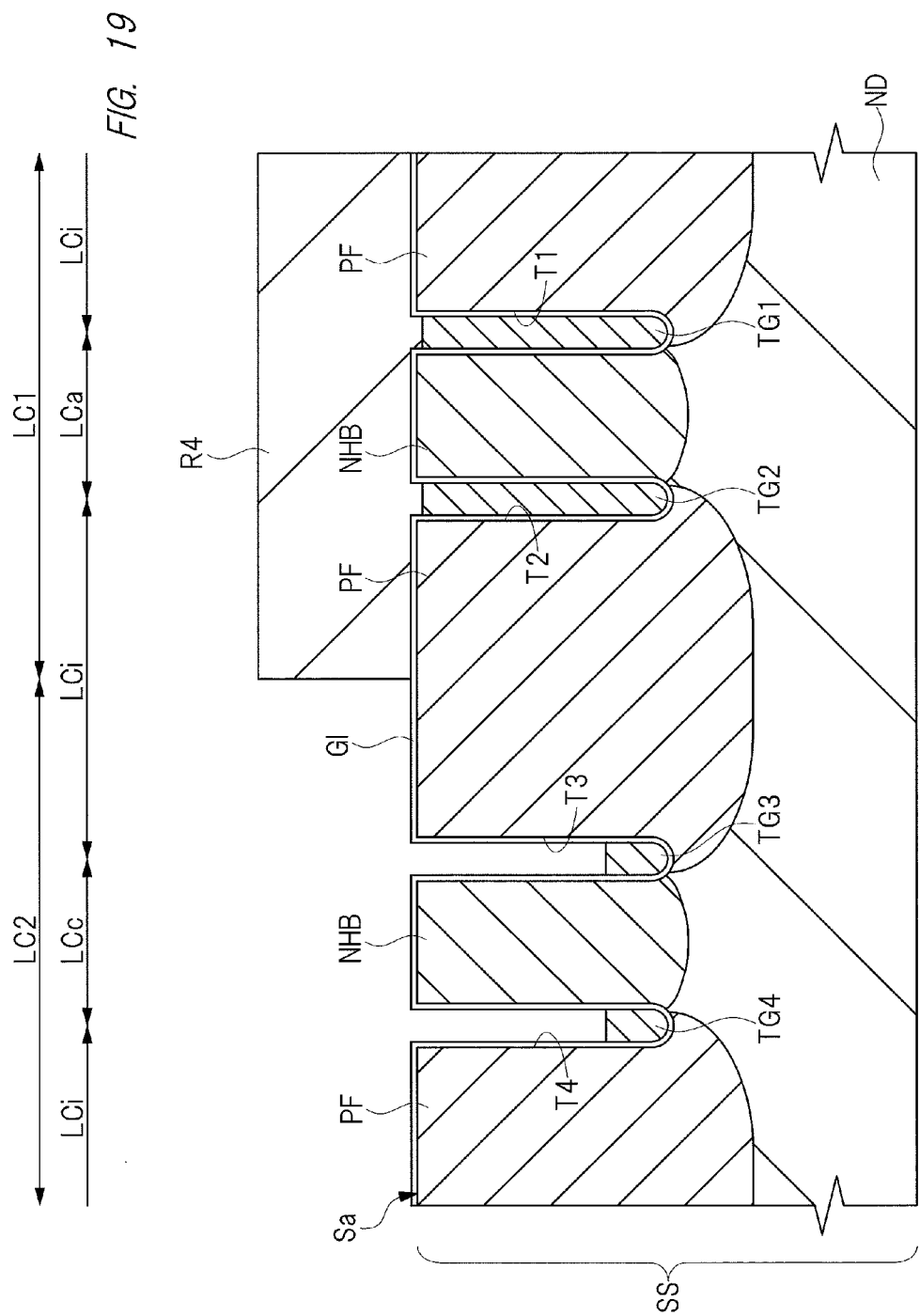
FIG. 19 is a cross-sectional view of a principal part in the manufacturing process of the IE-type trench gate IGBT, continued from FIG. 18.

Next, as illustrated in FIG. 19, a resist film R4 for processing a polycrystalline silicon film is formed by coating, etc., on the whole surface on the front surface Sa of the semiconductor substrate SS, and is patterned by usual lithography so that the first linear unit cell region LC1 is covered. The third linear trench gate electrode TG3 and the fourth linear trench gate electrode TG4 are etched back by, for example, dry etching, etc., with the patterned resist film R4 as a mask, and the third linear trench gate electrode TG3 and the fourth linear trench gate electrode TG4 are left in the bottom parts of the third trench T3 and the fourth trench T4, respectively. In this manner, a position of each upper surface of the third linear trench gate electrode TG3 and the fourth linear trench gate electrode TG4 becomes lower than a position of each upper surface of the first linear trench gate electrode TG1 and the second linear trench gate electrode TG2.

Figure 20:
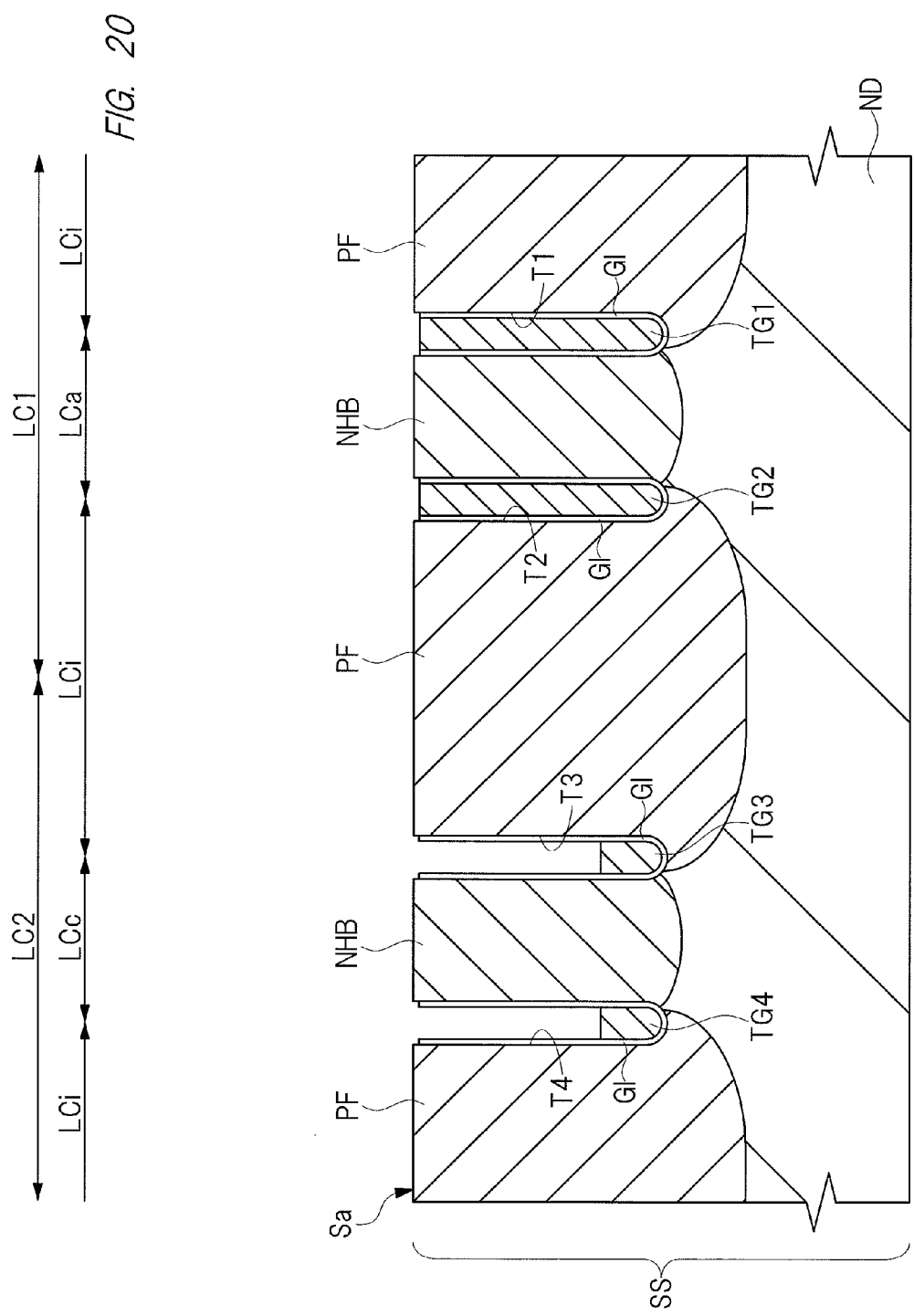
FIG. 20 is a cross-sectional view of a principal part in the manufacturing process of the IE-type trench gate IGBT, continued from FIG. 19.

Next, as illustrated in FIG. 20, the unnecessary resist film R4 is removed by ashing, etc. Subsequently, the gate insulation film GI except for an inner portion of the first, second, third and fourth trenches T1, T2, T3, and T4 is removed by dry etching, etc.

Figure 21:
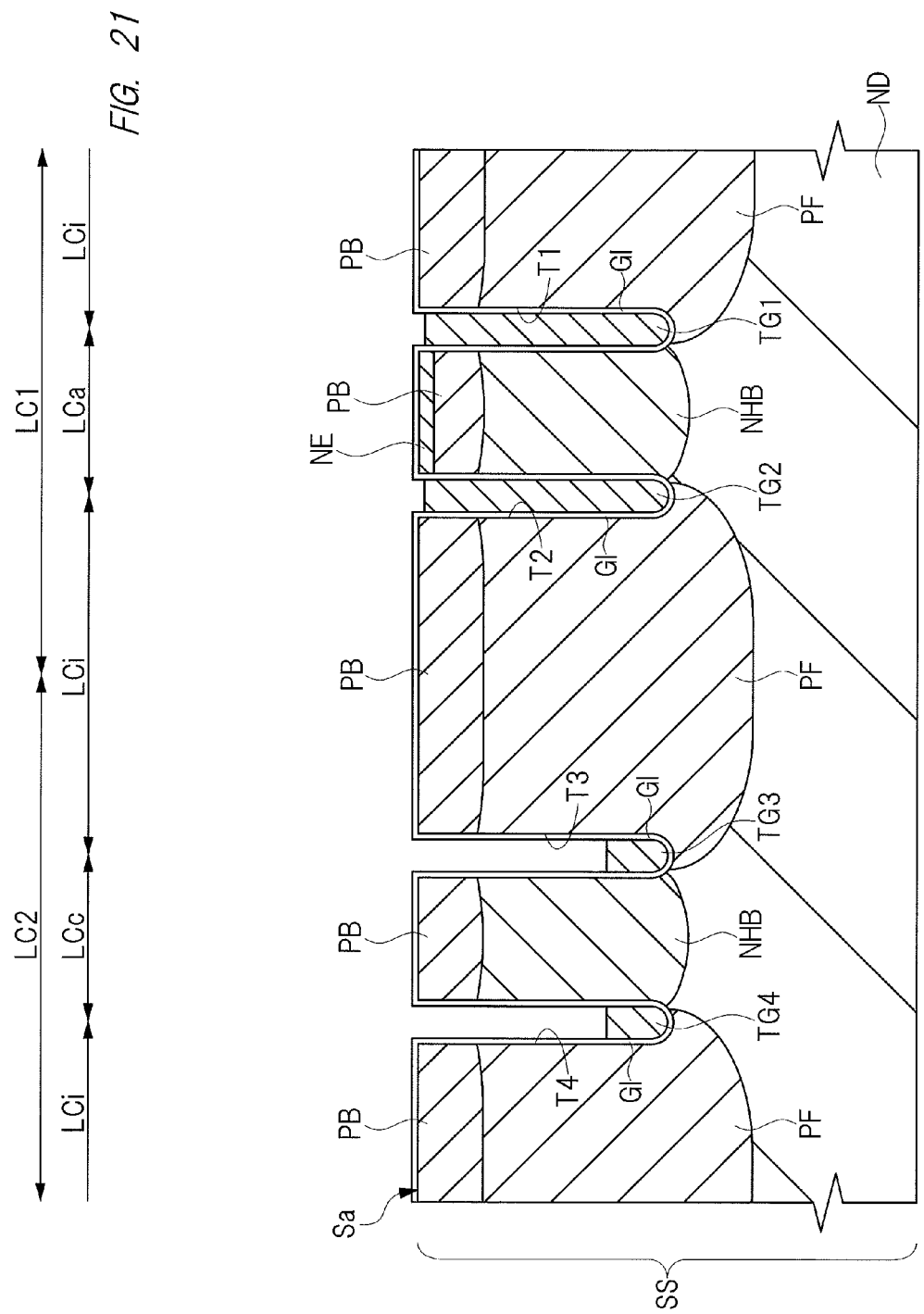
FIG. 21 is a cross-sectional view of a principal part in the manufacturing process of the IE-type trench gate IGBT, continued from FIG. 20.

Next, as illustrated in FIG. 21, a relatively thin silicon oxide film for subsequent ion implantation (for example, as thin as the gate insulation film GI) is formed on the whole surface on the front surface Sa of the semiconductor substrate SS by, for example, thermal oxidation or CVD. Subsequently, a resist film for introducing the P-type body region (illustration is omitted) is formed on the front surface Sa of the semiconductor substrate SS by usual lithography. The P-type body region PB is formed by introducing a P-type impurity on the whole surface of the cell formation region CR and on the other necessary part by, for example, ion implantation with the resist film for introducing this P-type body region as a mask. For example, ion species: boron, a dose amount: about $3\times10^{13}/cm^2$, and an implanting energy: about 75 KeV can be exemplified as ion implantation conditions at this time. Subsequently, a resist film for introducing the unnecessary P-type body region is removed by ashing, etc.

In addition, a resist film for introducing the N$^+$-type emitter region (illustration is omitted) is formed on the front surface Sa of the semiconductor substrate SS by usual lithography. With the resist film for introducing this N$^+$-type emitter region as a mask, the N$^+$-type emitter region NE is formed by introducing an N-type impurity into the whole surface of the upper surface of the P-type body region PB of the linear active cell region LCa by, for example, ion implantation. For example, ion species: arsenic, a dose amount: about $5 \times 10^{15}$/cm$^2$ and an implanting energy: about 80 KeV can be exemplified as the preferred ion implantation conditions at this time. Subsequently, an unnecessary resist film for introducing the N$^+$-type emitter region is removed by ashing, etc.

Figure 22:
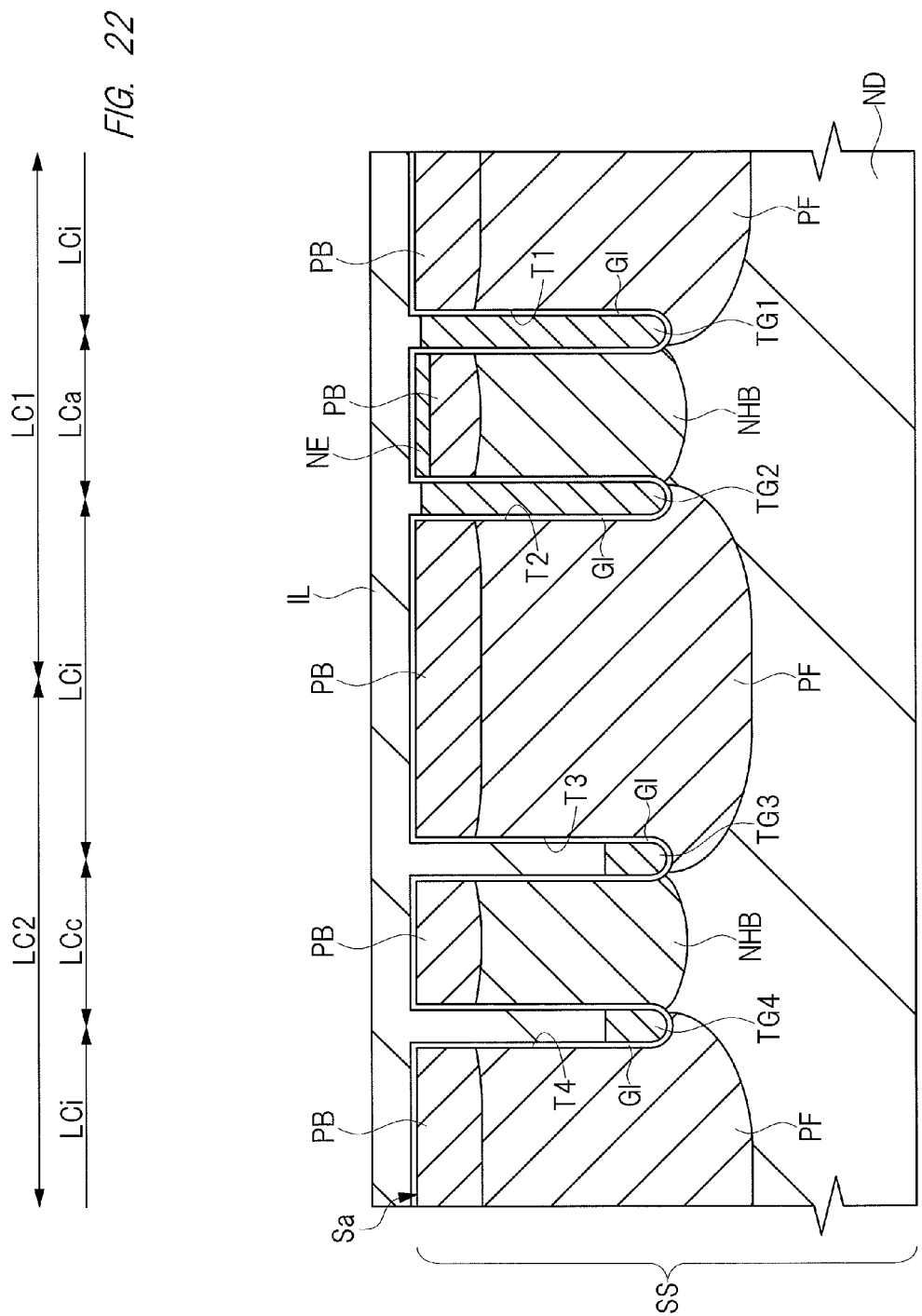
FIG. 22 is a cross-sectional view of a principal part in the manufacturing process of the IE-type trench gate IGBT, continued from FIG. 21.

Next, as illustrated in FIG. 22, for example, a PSG (Phosphosilicate Glass) film is formed on the whole surface on the front surface Sa of the semiconductor substrate SS as an interlayer insulation film IL by, for example, CVD, etc. A thickness of the interlayer insulation film IL is, for example, about 0.6 μm. As a preferred material of this interlayer insulation film IL, not only a PSG film but also a BPSG (Borophosphosilicate Glass) film, a NSG (Non-doped Silicate Glass) film, a SOG (Spin-On-Glass) film, or their combination film can be exemplified.

Figure 23:
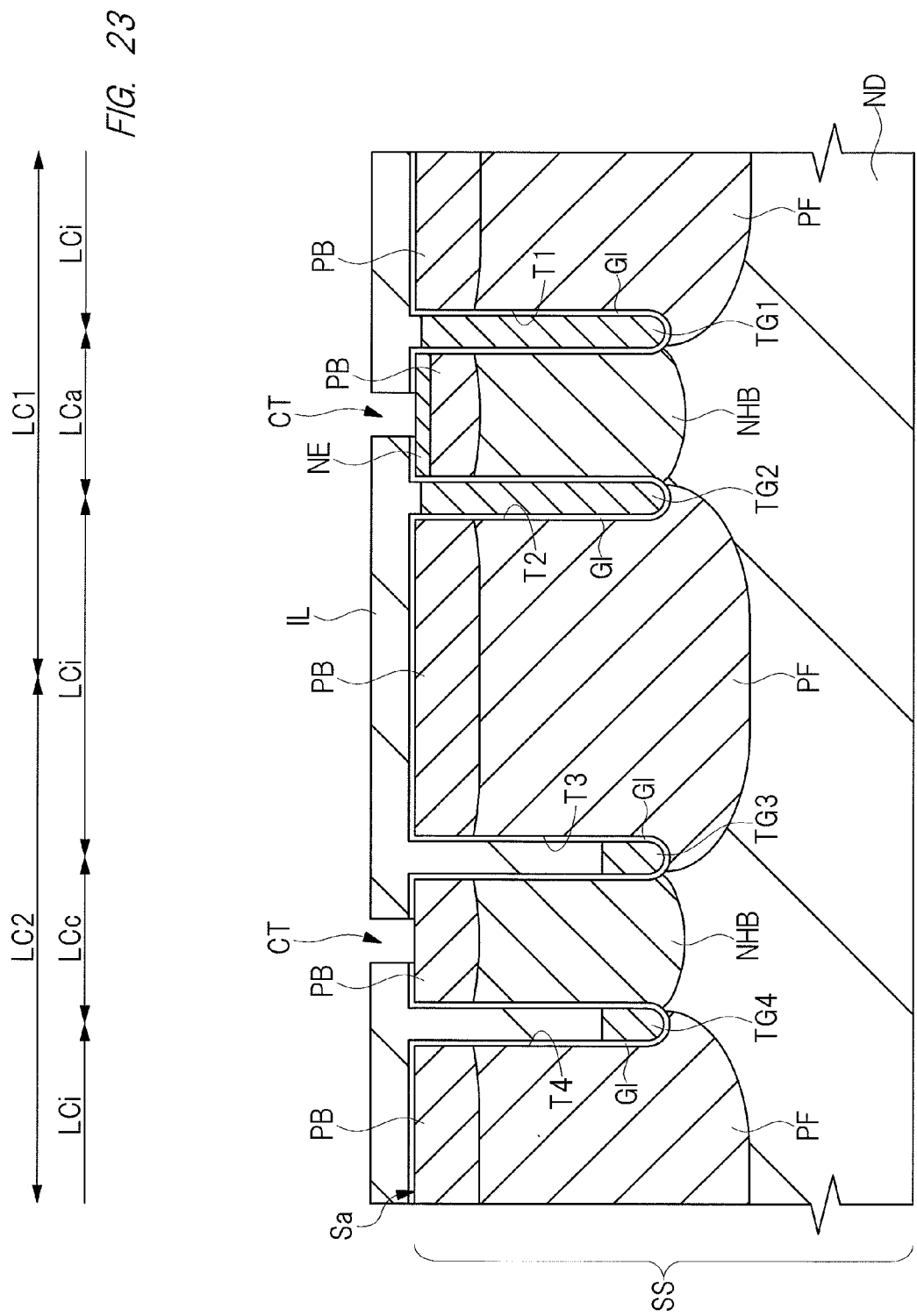
FIG. 23 is a cross-sectional view of a principal part in the manufacturing process of the IE-type trench gate IGBT, continued from FIG. 22.

Next, as illustrated in FIG. 23, a resist film for forming a contact groove (illustration is omitted) is formed on the interlayer insulation film IL by usual lithography. Subsequently, the contact groove CT is formed by, for example, anisotropic dry etching, etc. For example, Ar/CHF$_3$/CF$_4$-based gas, etc. can be exemplified as a gas system of this anisotropic dry etching.

Figure 24:
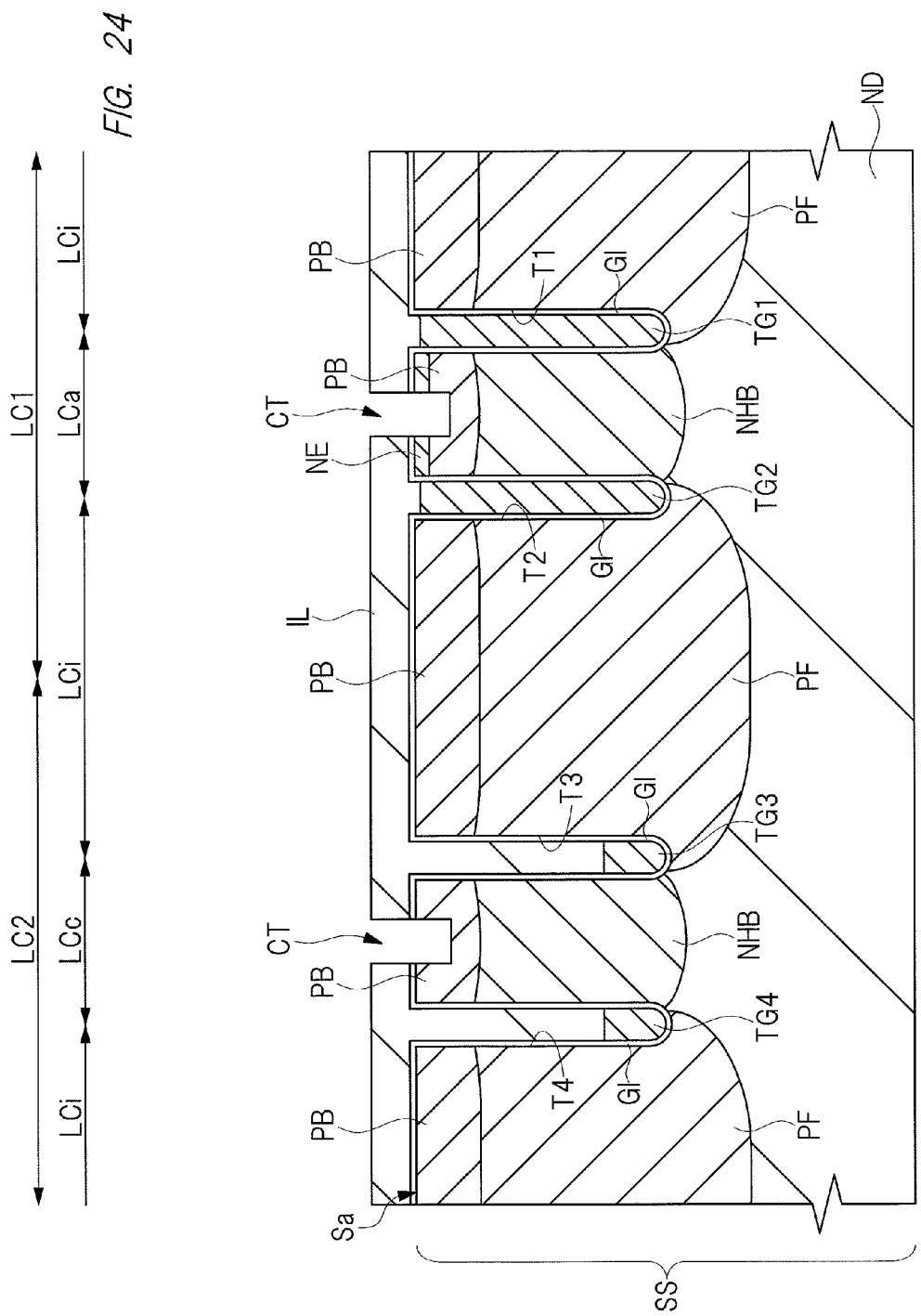
FIG. 24 is a cross-sectional view of a principal part in the manufacturing process of the IE-type trench gate IGBT, continued from FIG. 23.

Next, as illustrated in FIG. 24, an unnecessary resist film is removed by ashing, etc. Subsequently, the contact groove CT (or contact hole) is extended into the semiconductor substrate SS by, for example, anisotropic dry etching. For example, Cl$_2$/O$_2$-based gas can be exemplified as the preferred gas system of this anisotropic dry etching.

Figure 25:
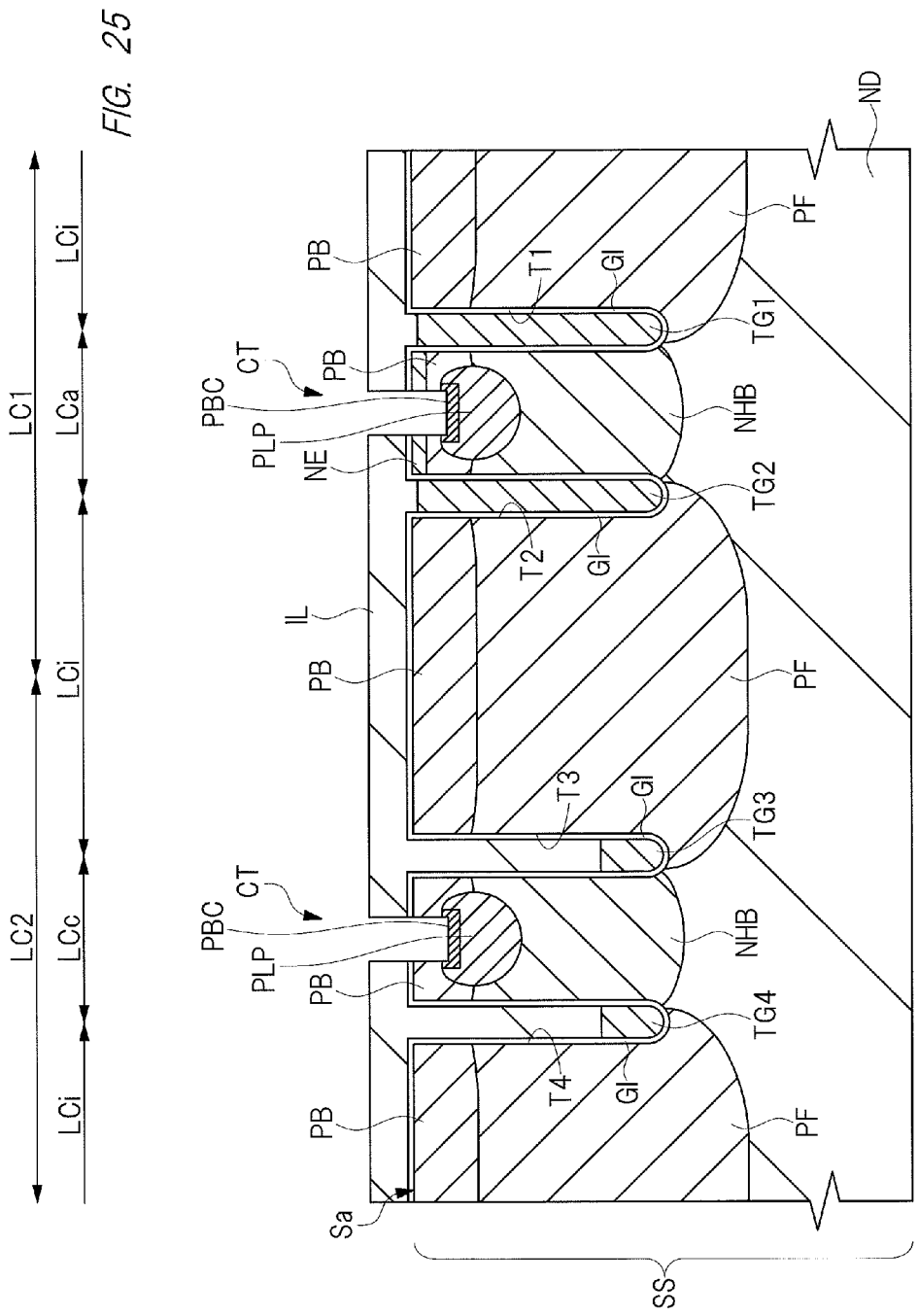
FIG. 25 is a cross-sectional view of a principal part in the manufacturing process of the IE-type trench gate IGBT, continued from FIG. 24.

Next, as illustrated in FIG. 25, the P$^+$-type body contact region PBC is formed by, for example, ion-implanting a P-type impurity via the contact groove CT. Here, for example, ion species: BF$_2$, a dose amount: $5 \times 10^{15}$/cm$^2$, an implanting energy: about 80 KeV can be exemplified as the preferred ion implantation conditions.

Similarly, the P$^+$-type latch-up prevention region PLP is formed by, for example, ion-implanting a P-type impurity via a contact groove CT. Here, for example, ion species: boron, a dose amount: about $5 \times 10^{15}$/cm$^2$ and an implanting energy: about 80 KeV can be exemplified as the preferred ion implantation conditions.

Figure 26:
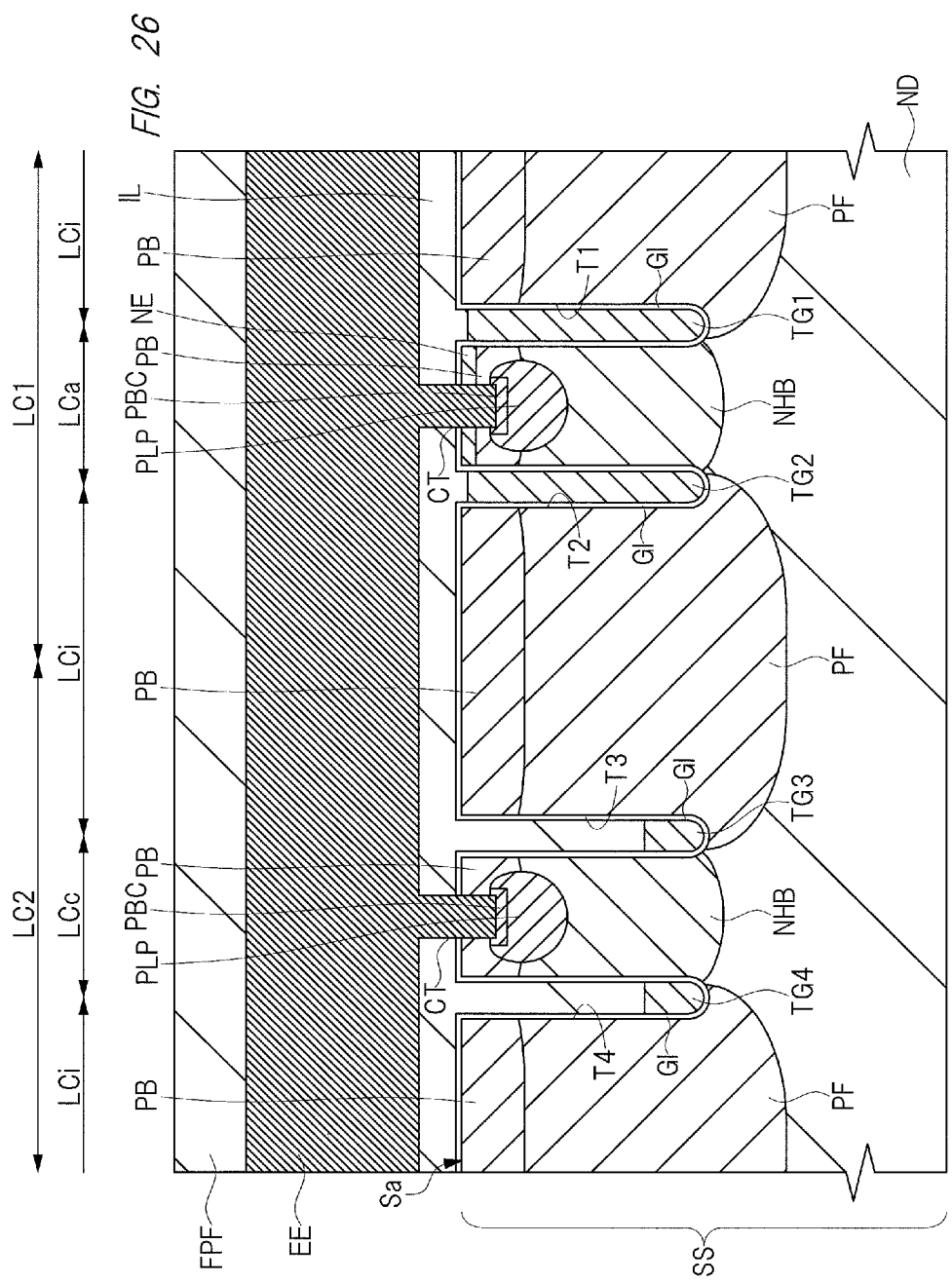
FIG. 26 is a cross-sectional view of a principal part in the manufacturing process of the IE-type trench gate IGBT, continued from FIG. 25.

Next, as illustrated in FIG. 26, the emitter electrode EE is formed. Specifically, the forming is performed by, for example, the following procedures. First, a TiW film is formed on the whole surface on the front surface Sa of the semiconductor substrate SS as a barrier metal film by, for example, sputtering. A thickness of the TiW film is about 0.2 μm, for example. Most of titanium in the TiW film move to a silicon boundary and form a silicide by subsequent heat treatment so as to contribute to improvement of contact characteristics. However, these processes are not illustrated on drawings because being complicated.

Next, an aluminum-based metal film (for example, in which several percent silicon is added, and the residual is aluminum) is formed by, for example, silicide annealing, for example, at about 600° C. for about 10 minutes under a nitrogen atmosphere, and then, sputtering so that the contact groove CT is embedded in the whole surface on the barrier metal film. A thickness of the aluminum-based metal film is, for example, about 5 μm.

Next, a resist film (illustration is omitted) for forming the emitter electrode is formed by usual lithography. Subsequently, the emitter electrode EE made of an aluminum-based metal film and a barrier metal film is patterned by, for example, dry etching. For example, Cl$_2$/BCl$_3$-based gas, etc., can be exemplified as the preferred gas system of this dry etching. Subsequently, an unnecessary resist film for forming the emitter electrode is removed by ashing, etc.

In addition, a final passivation film FPF made of, for example, an organic film, etc., containing polyimide as a main component is formed on the emitter electrode EE. A thickness of the final passivation film FPF is, for example, about 2.5 μms. Subsequently, a resist film (illustration is omitted) for forming an opening part is formed by usual lithography. Subsequently, the final passivation film FPF is patterned by, for example, dry etching, so that the emitter pad EP, etc., illustrated in the FIG. 1 is opened. Subsequently, an unnecessary resist film for forming the opening part is removed by ashing, etc.

Figure 27:
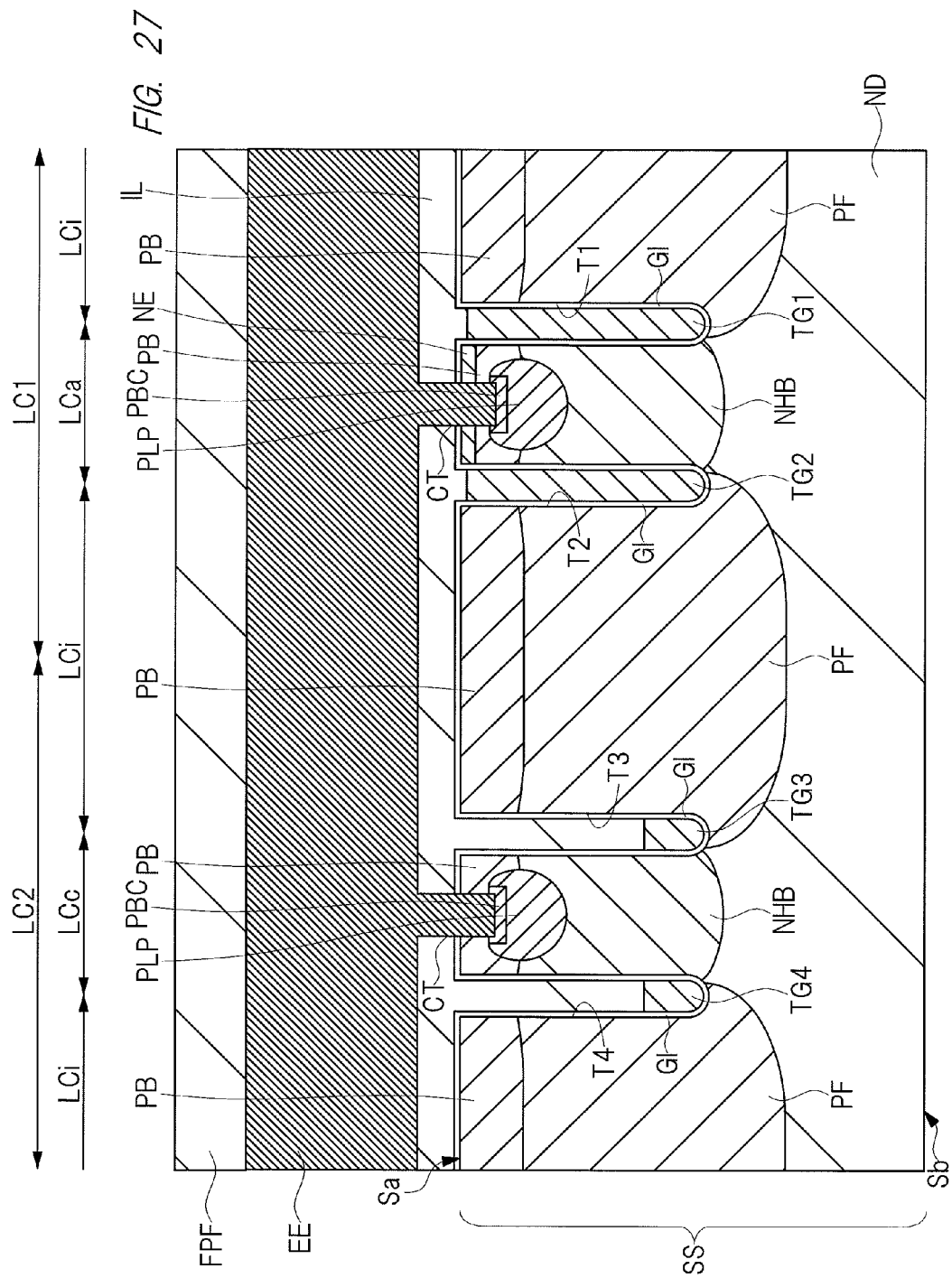
FIG. 27 is a cross-sectional view of a principal part in the manufacturing process of the IE-type trench gate IGBT, continued from FIG. 26.

Next, as illustrated in FIG. 27, the rear surface Sb of the semiconductor substrate SS is subjected to back-grinding process so that a thickness of, for example, about 800 μm is thinned to be a thickness of, for example, about 30 μm to 200 μm as needed. When a breakdown voltage is assumed to be, for example, about 600 V, the final thickness is about 70 μm. In addition, it is subjected to chemical etching, etc. for removing a damage on the rear face Sb as needed.

Figure 28:
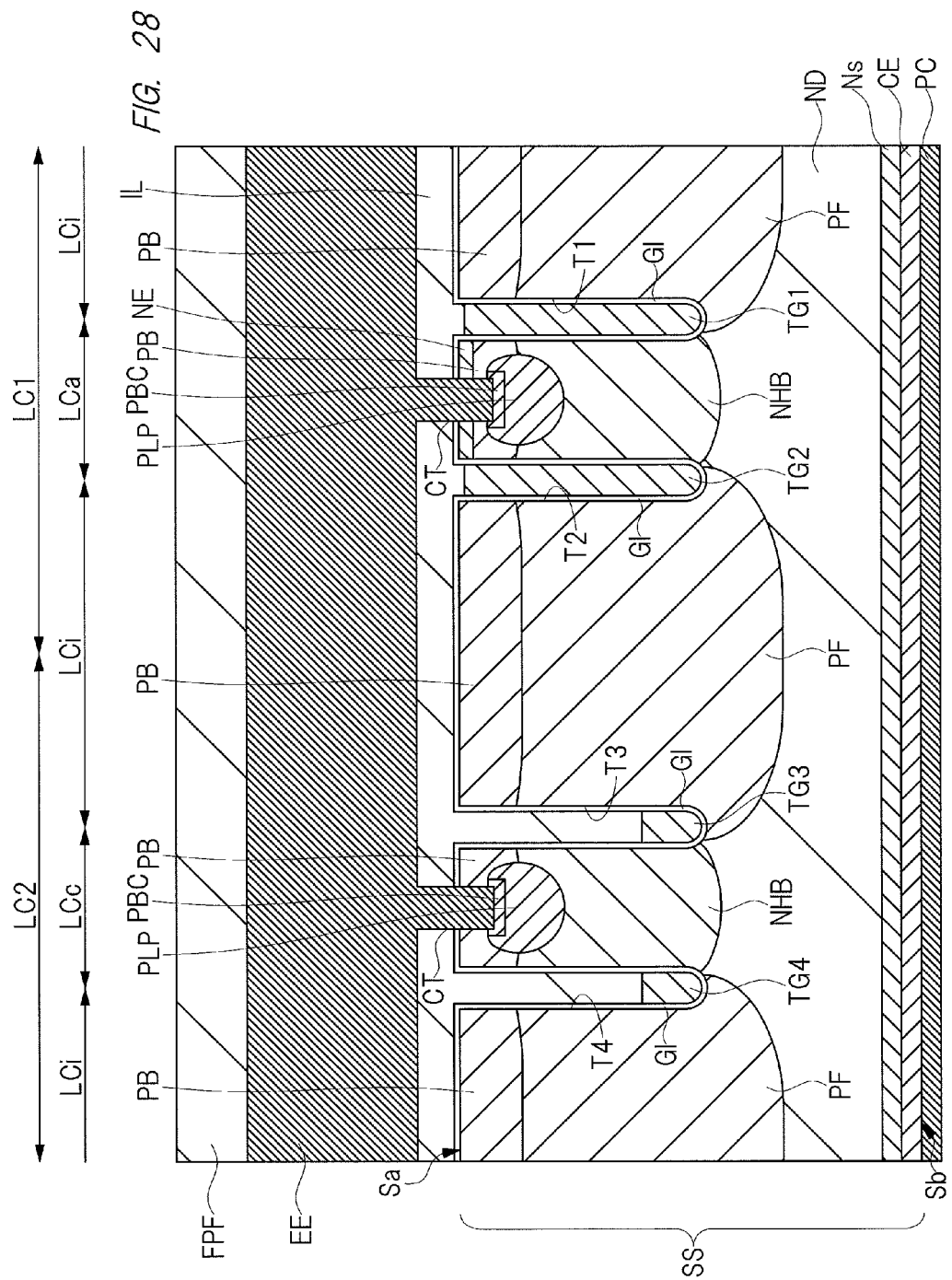
FIG. 28 is a cross-sectional view of a principal part in the manufacturing process of the IE-type trench gate IGBT, continued from FIG. 27.

Next, as illustrated in FIG. 28, the N-type field stop region Ns is formed by introducing an N-type impurity into the whole surface of the rear surface Sb of the semiconductor substrate SS by, for example, ion implantation. Here, for example, ion species: phosphorus, a dose amount: about $7 \times 10^{12}$/cm$^2$, an implanting energy: about 350 KeV can be exemplified as the preferred ion implantation conditions. Subsequently, the rear surface Sb of the semiconductor substrate SS is subjected to laser annealing, etc., as needed for impurity activation.

Next, the P$^+$-type collector region PC is formed by introducing an N-type impurity into the whole surface of the rear surface Sb of the semiconductor substrate SS by, for example, ion implantation. Here, for example, ion species:boron, a dose amount: about $1 \times 10^{12}$/cm$^2$, an implanting energy: about 40 KeV can be exemplified as the preferred ion implantation conditions. Subsequently, the rear surface Sb of the semiconductor substrate SS is subjected to laser annealing, etc., as needed for impurity activation.

Next, the collector electrode CE is formed on the rear surface Sb of the semiconductor substrate SS by, for example, sputtering. Subsequently, the semiconductor substrate SS is divided into chip regions by dicing, etc., and is sealed into a package as needed, so that a semiconductor device including the IE type trench gate IGBT is completed.

(Second Embodiment)

Figure 29:
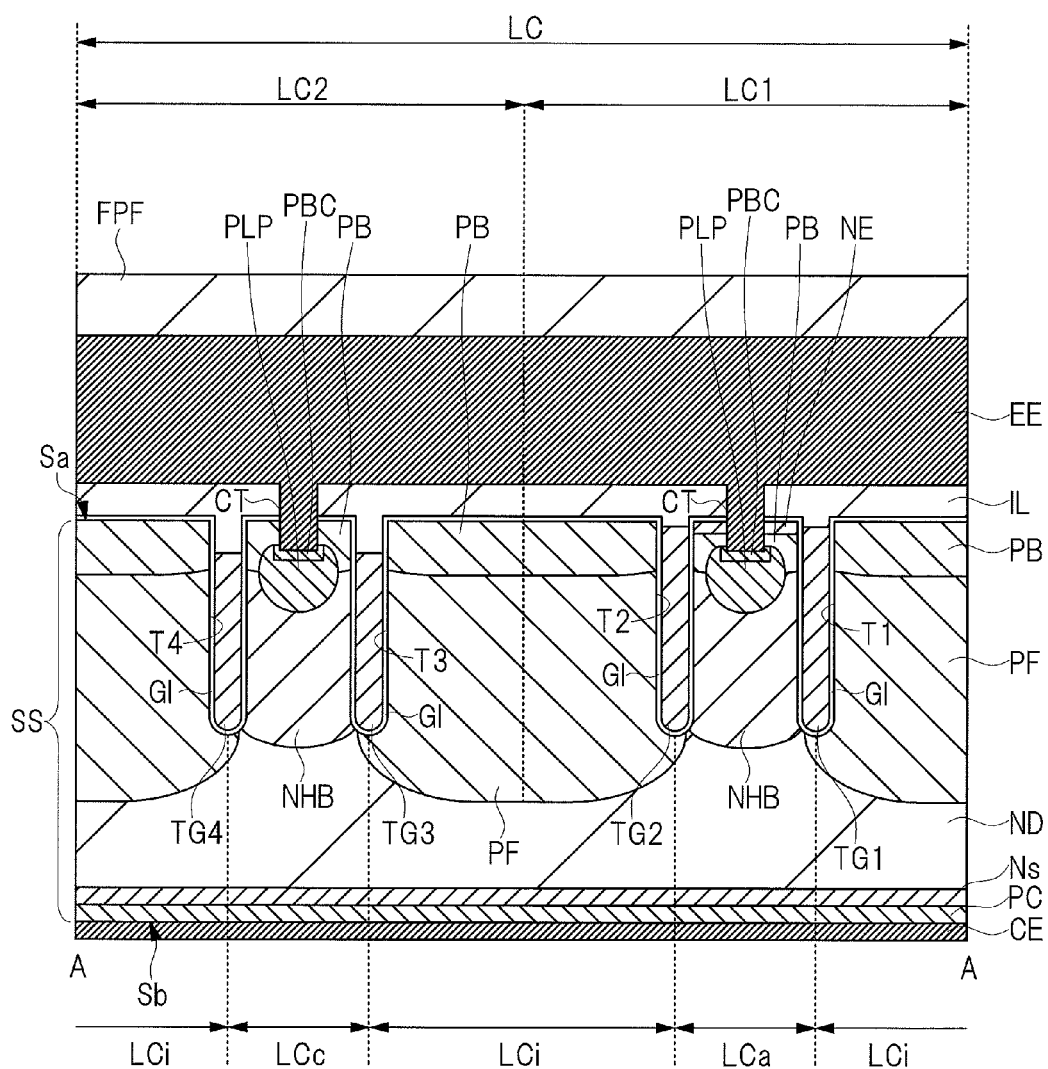
FIG. 29 is a cross-sectional view of a principal part (a cross-sectional view of a principal part taken along a line A-A shown in FIG. 2) of an IE-type trench gate IGBT according to a second embodiment.

An IE type trench gate IGBT according to the present second embodiment will be described by using FIG. 29. FIG. 29 illustrates a cross-sectional view of a principal part (cross-sectional view of a principal part taken along a line A-A of the FIG. 2) of the IE type trench gate IGBT according to the present second embodiment. The IE type trench gate IGBT described here is different from the IE type trench gate IGBT according to the above-described first embodiment in structures of the third linear trench gate electrode TG3 and the fourth linear trench gate electrode TG4. Therefore, in the following descriptions, only a different part from the IE type trench gate IGBT according to the above-described first embodiment will be described as a principle.

In the IE type trench gate IGBT according to the above-described first embodiment, each upper surface of the third linear trench gate electrode TG3 and the fourth linear trench gate electrode TG4 which are electrically connected to the emitter electrode EE is positioned to be lower than each upper surface of the first linear trench gate electrode TG1 and the second linear trench gate electrode TG2 which are electrically connected to the gate electrode GE.

In addition, in the IE type trench gate IGBT according to the above-described first embodiment, each upper surface of the third linear trench gate electrode TG3 and the fourth linear trench gate electrode TG4 which are electrically connected to the emitter electrode EE is positioned to be lower than the bottom surface of the P-type body region PB. That is, the IE type trench gate IGBT according to the above-described first embodiment has a drain offset structure.

In the IE type trench gate IGBT according to the present second embodiment, as illustrated in FIG. 29, each upper surface of the third linear trench gate electrode TG3 and the fourth linear trench gate electrode TG4 which are electrically connected to the emitter electrode EE is positioned to be lower than each upper surface of the first linear trench gate electrode TG1 and the second linear trench gate electrode TG2 which are electrically connected to the gate electrode GE.

However, in the IE type trench gate IGBT according to the present second embodiment, each upper surface of the third linear trench gate electrode TG3 and fourth linear trench gate electrode TG4 which are electrically connected to the emitter electrode EE is positioned to be higher than the bottom surface of the P-type body region PB. That is, the parasitic PMOS transistor formed in the IE type trench gate IGBT according to the present second embodiment does not have the drain offset structure.

In this manner, by providing each upper surface of the third linear trench gate electrode TG3 and fourth linear trench gate electrode TG4 which are electrically connected to the emitter electrode EE at a position higher than the bottom surface of the P-type body region PB, a hole discharging effect is improved because the parasitic PMOS transistor does not have a gate-drain offset structure. However, as for the IE type trench gate IGBT according to the present second embodiment is higher in a capacitance between the gate and the emitter than the IE type trench gate IGBT according to the above-described first embodiment, and therefore, a switching performance resulting from an MOS structure of IGBT is speeded down. On the other hand, a switching performance depending on a bipolar-like factor such as a behavior of a residue carrier is speeded up. In addition, since hole discharging capability is high, a hole accumulation effect on the front surface Sa side of the semiconductor substrate SS is reduced, and an ON-state voltage performance is deteriorated.

(Third Embodiment)

Figure 30:
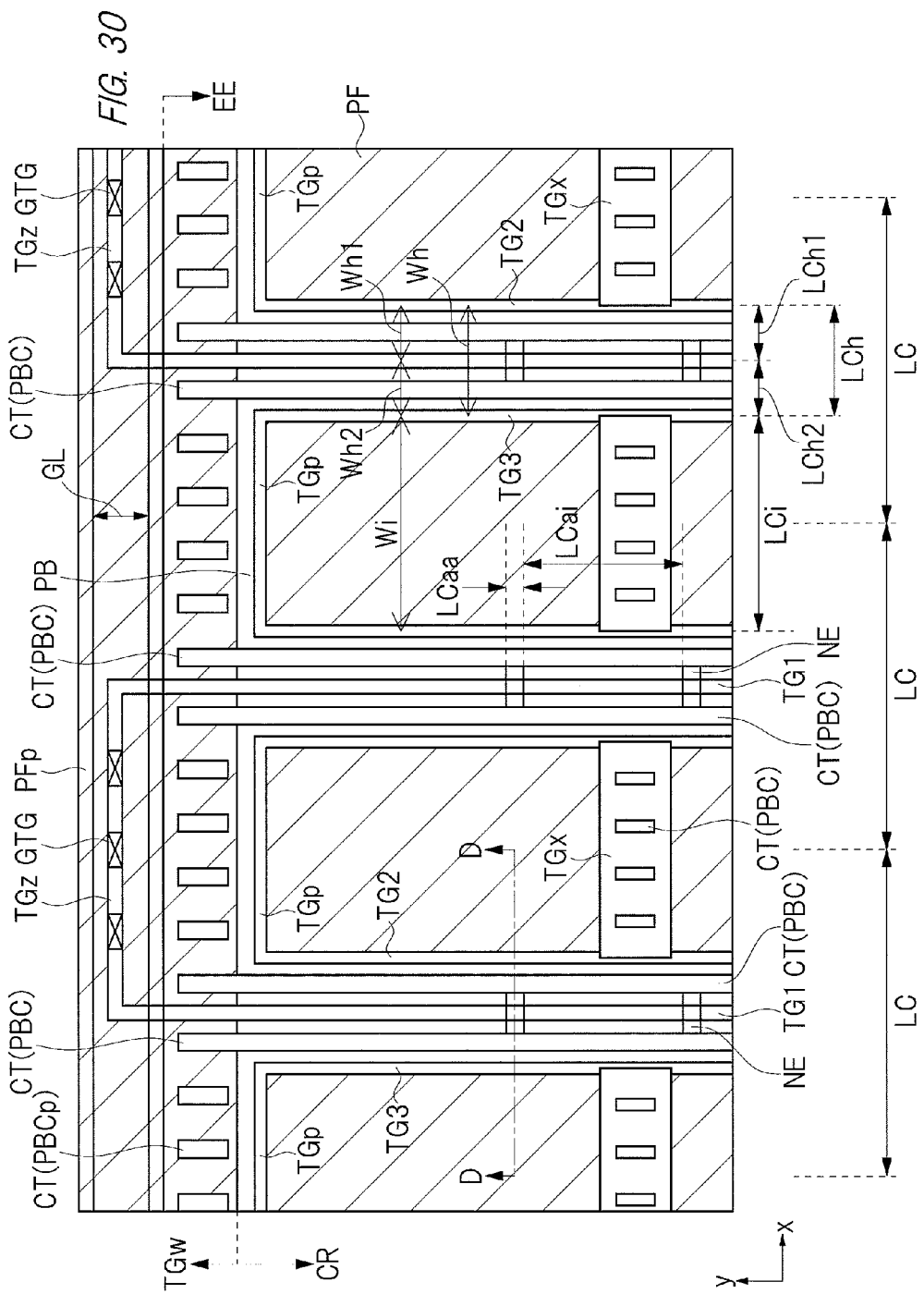
FIG. 30 is a plan view of a principal part showing a partially-enlarged active portion of a semiconductor chip according to a third embodiment.
Figure 31:
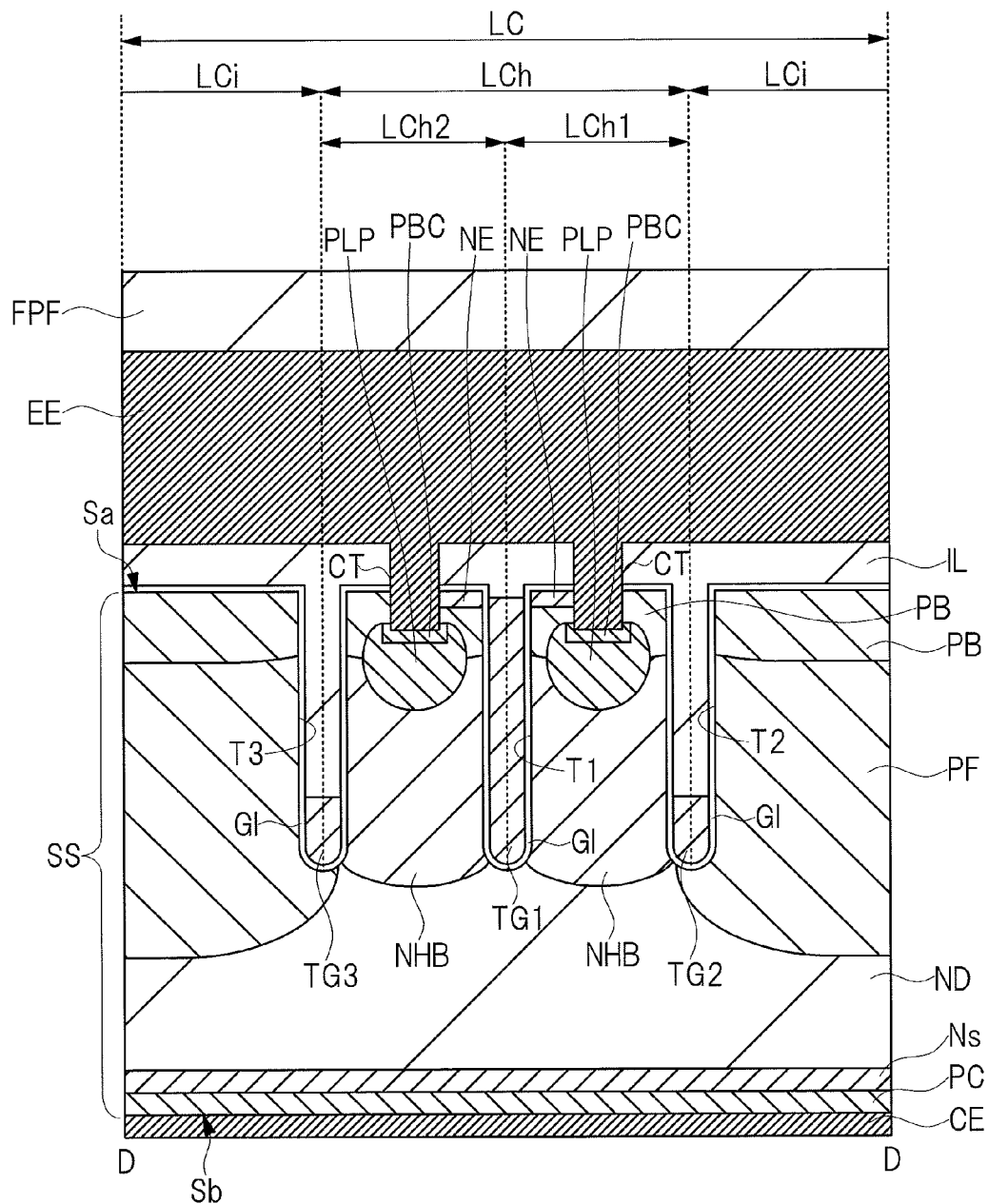
FIG. 31 is a cross-sectional view of a principal part (a cross-sectional view of a principal part taken along a line D-D shown in FIG. 30) of an IE-type trench gate IGBT according to a third embodiment.

An IE type trench gate IGBT according to the present third embodiment will be described by using FIGS. 30 and 31. FIG. 30 is a plane view of a principal part illustrating a part of an active part of a semiconductor chip according to the present third embodiment while expanded. FIG. 31 is a cross-sectional view of a principal part (cross-sectional view of a principal part taken along a line D-D illustrated in FIG. 30) illustrating a part of an expanded active part of a semiconductor chip according to the present third embodiment. The IE type trench gate IGBT described here is different from the IE type trench gate IGBT according to the above-described first embodiment in structures of the linear active cell region LCa, the linear inactive cell region LCi and the linear hole collector cell region LCc. Therefore, in the following descriptions, only a different part from the IE type trench gate IGBT according to the above-described first embodiment will be described as a principle.

As illustrated in FIG. 30, the linear unit cell region LC according to the present third embodiment is configured of a linear hybrid cell region LCh and the linear inactive cell region LCi having a half width on the both sides thereof, and a width Wh of the linear hybrid cell region LCh is narrower than a width Wi of the linear inactive cell region LCi.

The linear hybrid cell region LCh is configured of the first linear hybrid sub cell region LCh1 and the second linear hybrid sub cell region LCh2 which are symmetrical to each other on a plane. The first linear hybrid sub cell region LCh1 is a hybrid cell obtained by integrating a right half cell of the linear active cell region LCa and a left half cell of the linear hole collector cell region LCc which are illustrated in the FIG. 2. On the other hand, the second linear hybrid sub cell region LCh2 is a hybrid cell obtained by integrating a left half cell of the linear active cell region LCa and a right half cell of the linear hole collector cell region LCc which are illustrated in the FIG. 2.

That is, it can be said that the linear hybrid cell region LCh is obtained by combining the first linear hybrid sub cell region LCh1 and the second linear hybrid sub cell region LCh2 so that the first linear trench gate electrode TG1 electrically connected to the gate electrode (gate electrode GE illustrated in the FIG. 1) is positioned in the center. Therefore, in the present third embodiment, a width Wh1 of the first linear hybrid sub cell region LCh1 and a width Wh2 of the second linear hybrid sub cell region LCh2 are the same or substantially the same as each other.

In addition, the second linear trench gate electrode TG2 and the third linear trench gate electrode TG3 which are electrically connected to the emitter electrode EE are separated from each other across the linear inactive cell region LCi on the both sides. Therefore, the interconnection is achieved by providing a connection-use gate leading-out pad (emitter connection part) TGx made of a polycrystalline silicon film in the same layer as those of the second linear trench gate electrode TG2 and the third linear trench gate electrode TG3 in addition to the end part trench gate electrode TGp. Then, a (in this case, plurality of) contact grooves CT for electrically connecting the second linear trench gate electrode TG2 and the third linear trench gate electrode TG3 to the emitter electrode EE are included in the connection-use gate leading-out pad for connection (emitter connection part) TGx when seen in a plan view. A connection reliability can be further improved by providing such a structure.

Next, a cross-sectional structure taken along a line D-D of FIG. 30 will be described by using FIG. 31.

As illustrated in FIG. 31, the $N^-$-type drift region ND occupies a principal part of the semiconductor substrate SS, and the N-type field stop region Ns and the $P^+$-type collector region PC are provided on the rear surface Sb side of the semiconductor substrate SS from the side closer to the $N^-$-type drift region ND. In addition, the collector electrode CE electrically connected to the $P^+$-type collector region PC is provided on the rear surface Sb of the semiconductor substrate SS.

On the other hand, on the front surface Sa side of the semiconductor substrate SS, the P-type body region PB is provided on almost the whole surface (almost whole surface of cell formation region CR).

The first trench T1 is provided on the front surface Sa side of the semiconductor substrate SS in the boundary section between the first linear hybrid sub cell region LCh1 and the second linear hybrid sub cell region LCh2, and the inside thereof is provided with the first linear trench gate electrode TG1 via the gate insulation film GI.

Here, the first linear trench gate electrode TG1 is electrically connected to the gate electrode (gate electrode GE illustrated in the FIG. 1). In addition, the first linear trench gate electrode TG1 is embedded from the bottom end to the upper part of the first trench T1 formed in the semiconductor substrate SS.

On the other hand, the second trench T2 and the third trench T3 are provided on the front surface Sa side of the semiconductor substrate SS in the boundary section between the linear hybrid cell region LCh and the linear inactive cell region LCi, and the insides thereof are provided with the second linear trench gate electrode TG2 and the third linear trench gate TG3 via the gate insulation film GI, respectively.

The second linear trench gate electrode TG2 and the third linear trench gate electrode TG3 are electrically connected to the emitter electrode EE. In addition, the second linear trench gate electrode TG2 is embedded in the bottom part of the second trench T2 formed in the semiconductor substrate SS. However, the upper surface thereof is positioned to be lower than the upper surface of the first linear trench gate electrode TG1, and besides, is positioned to be lower than the bottom surface of the P-type body region PB. Similarly, the third linear trench gate electrode TG3 is embedded in the bottom part of the third trench T3 formed in the semiconductor substrate SS. However, the upper surface thereof is positioned to be lower than the upper surface of the first linear trench gate electrode TG1, and besides, is positioned to be lower than the bottom surface of the P-type body region PB.

In the first linear hybrid sub cell region LCh1 and the second linear hybrid sub cell region LCh2, the $N^+$-type emitter region NE is provided only on the first linear trench gate electrode TG1 side on the front surface Sa side of the semiconductor substrate SS, and the $P^+$-type body contact region PBC is provided in the bottom end of the contact groove CT. The $P^+$-type latch-up prevention region PLP is provided below this $P^+$-type body contact region PBC, and the N-type hole barrier region NHB is provided below the $P^+$-type latch-up prevention region PLP.

In the linear inactive cell region LCi, the P-type floating region PF which is deeper than, for example, the first, second and third trenches T1, T2 and T3 are provided below the P-type body region PB on the front surface Sa side of the semiconductor substrate SS.

The interlayer insulation films IL made of, for example, silicon oxide, etc., is formed on almost the whole surface on the front surface Sa of the semiconductor substrate SS. The emitter electrode EE made of, for example, a metal film containing aluminum as a main component is provided on the interlayer insulation film IL, and is connected to the $N^+$-type emitter region NE and the $P^+$-type body contact region PBC via the contact groove CT.

On the emitter electrode EE, the final passivation film FPF made of, for example, the polyimide-based organic insulating film, etc., is further formed.

(Fourth Embodiment)

Figure 32:
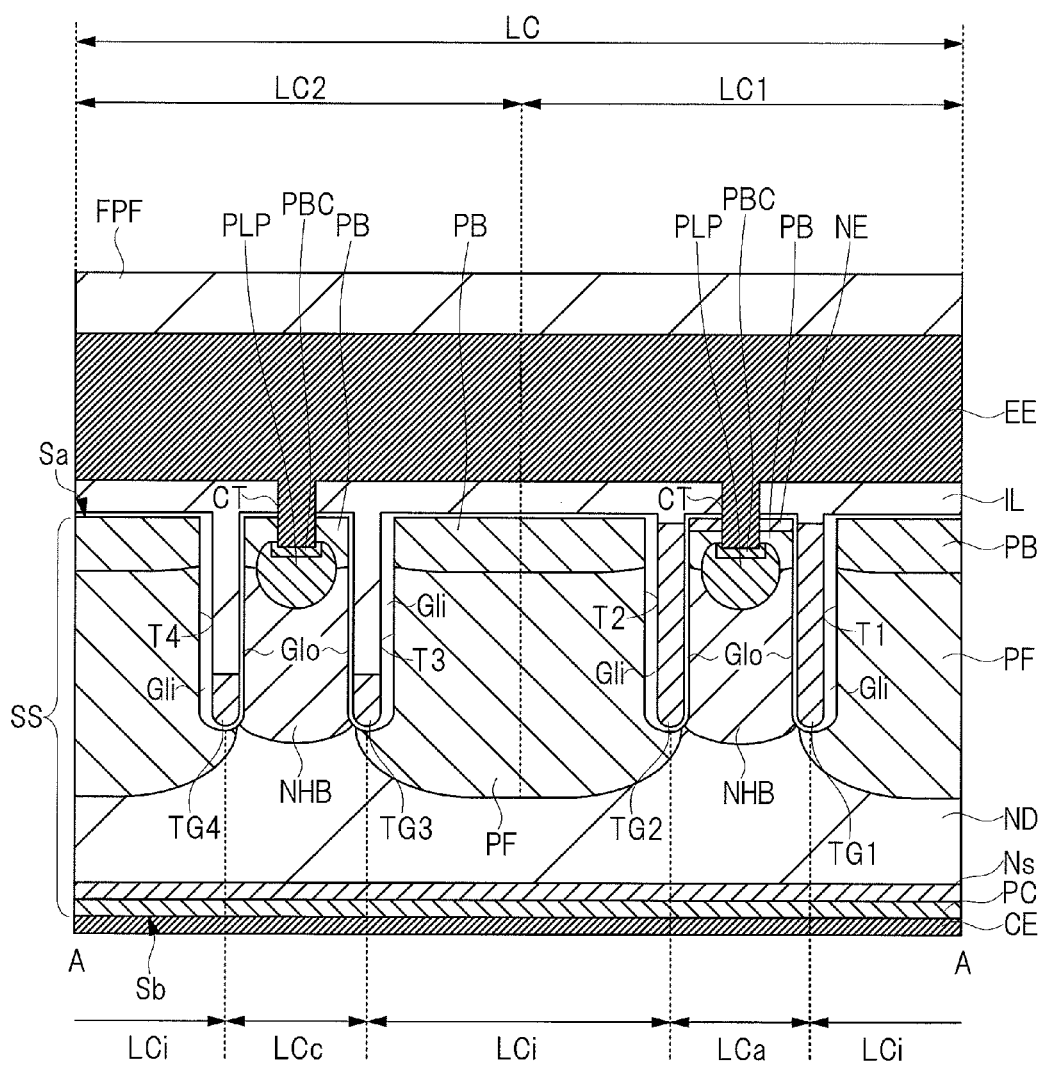
FIG. 32 is a cross-sectional view of a principal part (a cross-sectional view of a principal part taken along a line A-A shown in FIG. 2) of an IE-type trench gate IGBT according to a fourth embodiment.

An IE type trench gate IGBT according to the present fourth embodiment will be described by using FIG. 32. FIG. 32 illustrates a cross-sectional view of a principal part (cross-sectional view of a principal part taken along a line A-A of the FIG. 2) of the IE type trench gate IGBT according to the present fourth embodiment. The IE type trench gate IGBT described here is different from the IE type trench gate IGBT according to the above-described first embodiment in a structure of the gate insulation film formed in the inner walls of the first, second, third and fourth trenches T1, T2, and T3 and T4. Therefore, in the following descriptions, only a different part from the IE type trench gate IGBT according to the above-described first embodiment will be described as a principle.

In the IE type trench gate IGBT according to the above-described first embodiment, the gate insulation film GI having a uniform thickness is formed on almost the whole surface of the inner walls of the first, second, third and fourth trenches T1, T2, T3 and T4.

In the IE type trench gate IGBT according to the present fourth embodiment, as illustrated in FIG. 32, a thickness of the gate insulation film GIi formed on the inner walls of the first trench T1 and the second trench T2 on the linear inactive cell region LCi side is made thicker than a thickness of the gate insulation film GIo formed in the inner walls thereof on the linear active cell region LCa side. Similarly, a thickness of the gate insulation film GIi formed in the inner walls of the third trench T3 and the fourth trench T4 on the linear inactive cell region LCi side is made thicker than a thickness of the gate insulation film GIo formed in the inner walls thereof on the linear hole collector cell region LCc side. In other words, a thickness of the gate insulation film GIi formed in the inner walls of the first, second, third and fourth trenches T1, T2, T3 and T4 which contact the P-type floating region PF is made thicker than a thickness of the gate insulation film GIo formed on the inner walls thereof which contact the N-type hole barrier region NI-TB.

In this manner, in the IE type trench gate IGBT according to the present fourth embodiment, a capacitance between the gate and the emitter can be reduced more than that in the IE type trench gate IGBT according to the above-described first embodiment, and therefore, deterioration of a switching loss can be improved.

(Fifth Embodiment)

Figure 33:
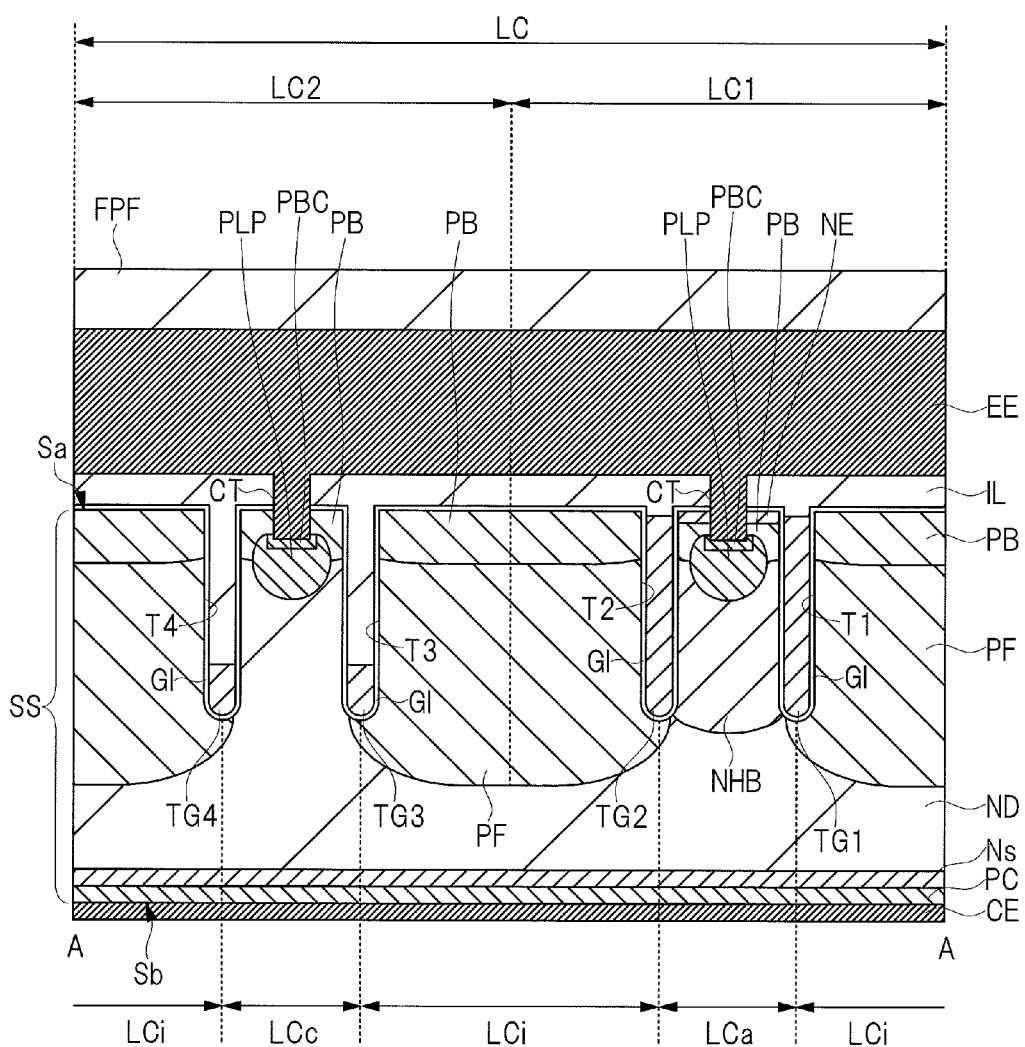
FIG. 33 is a cross-sectional view of a principal part (a cross-sectional view of a principal part taken along a line A-A shown in FIG. 2) of a first example of an IE-type trench gate IGBT according to a fifth embodiment.
Figure 34:
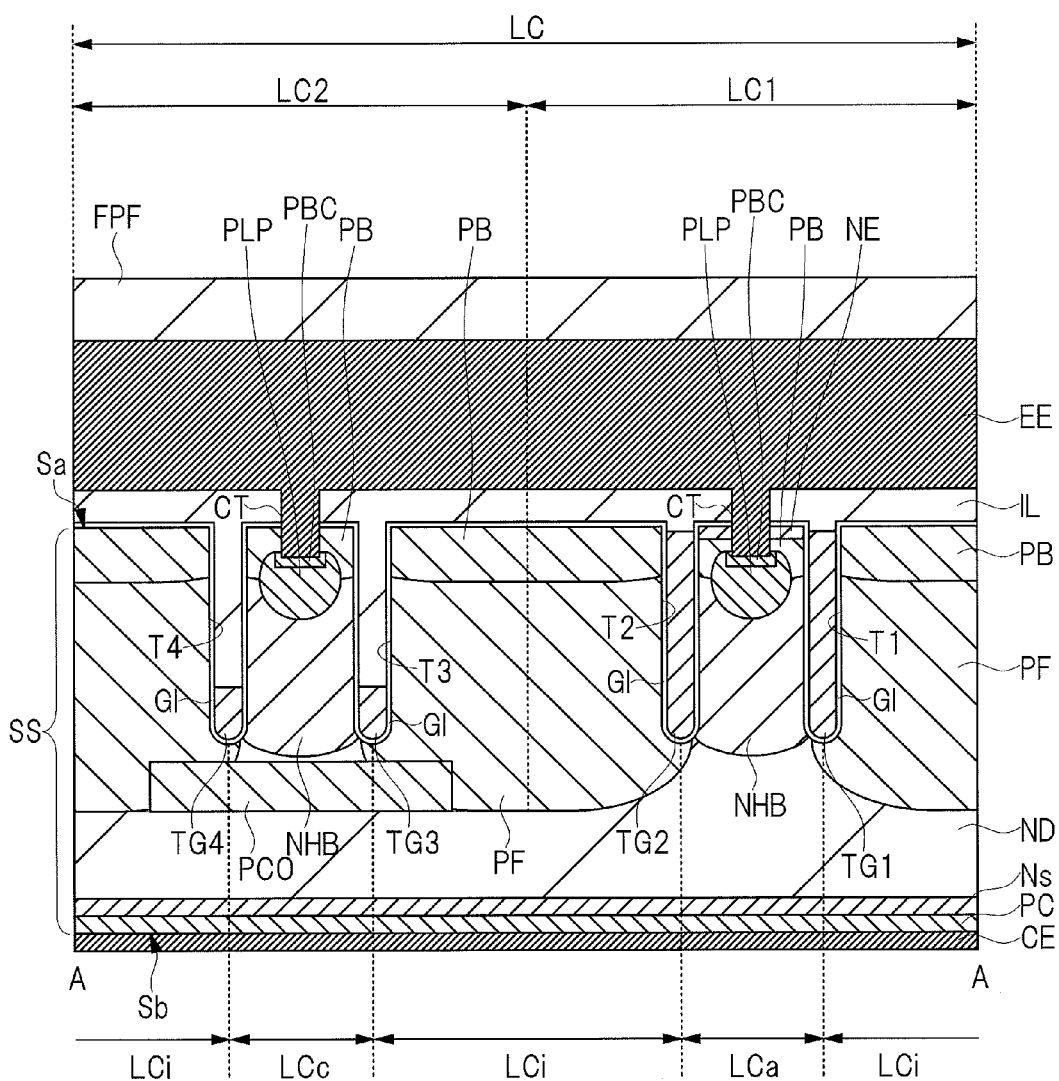
FIG. 34 is a cross-sectional view of a principal part (a cross-sectional view of a principal part taken along a line A-A shown in FIG. 2) of a second example of the IE-type trench gate IGBT according to the fifth embodiment.

An IE type trench gate IGBT according to the present fifth embodiment will be described by using FIGS. 33 and 34. FIGS. 33 and 34 are a cross-sectional view of a principal part (cross-sectional view of a principal part taken along a line A-A of the FIG. 2) of a first example of the IE type trench gate IGBT according to the present the fifth embodiment and a cross-sectional view of a principal part (cross-sectional view of a principal part taken along a line A-A of the FIG. 2) of a second example of the IE type trench gate IGBT, respectively. The IE type trench gate IGBT described here is different from the IE type trench gate IGBT according to the above-described first embodiment in a structure of the linear hole collector cell region LCc. Therefore, in the following descriptions, only a different part from the IE type trench gate IGBT according to the above-described first embodiment will be described as a principle.

As for the first example of the IE type trench gate IGBT according to the present the fifth embodiment, as illustrated in FIG. 33, the N-type hole barrier region NHB of the linear hole collector cell region LCc is not formed. Note that the N-type hole barrier region NHB of the linear hole collector cell region LCc may be formed so that a concentration thereof is made lower than a concentration of the N-type hole barrier region NHB of the linear active cell region LCa although illustration is omitted.

As for the second example of the IE type trench gate IGBT according to the present the fifth embodiment, as illustrated in FIG. 34, a P-type connection region PCO is formed so as to be positioned below the bottom ends of the third trench T3 and the fourth trench T4, so that the P-type floating regions PF of the linear inactive cell regions LCi positioned on both sides of the linear hole collector cell region LCc are connected to each other.

In this manner, a hole discharging effect of a parasitic PMOS transistor is improved. Therefore, in the IE type trench gate IGBT according to the present the fifth embodiment, a switching loss can be reduced more than that in the IE type trench gate IGBT according to the above-described first embodiment. However, an ON-state voltage performance is deteriorated.

(Sixth Embodiment)

Figure 35:
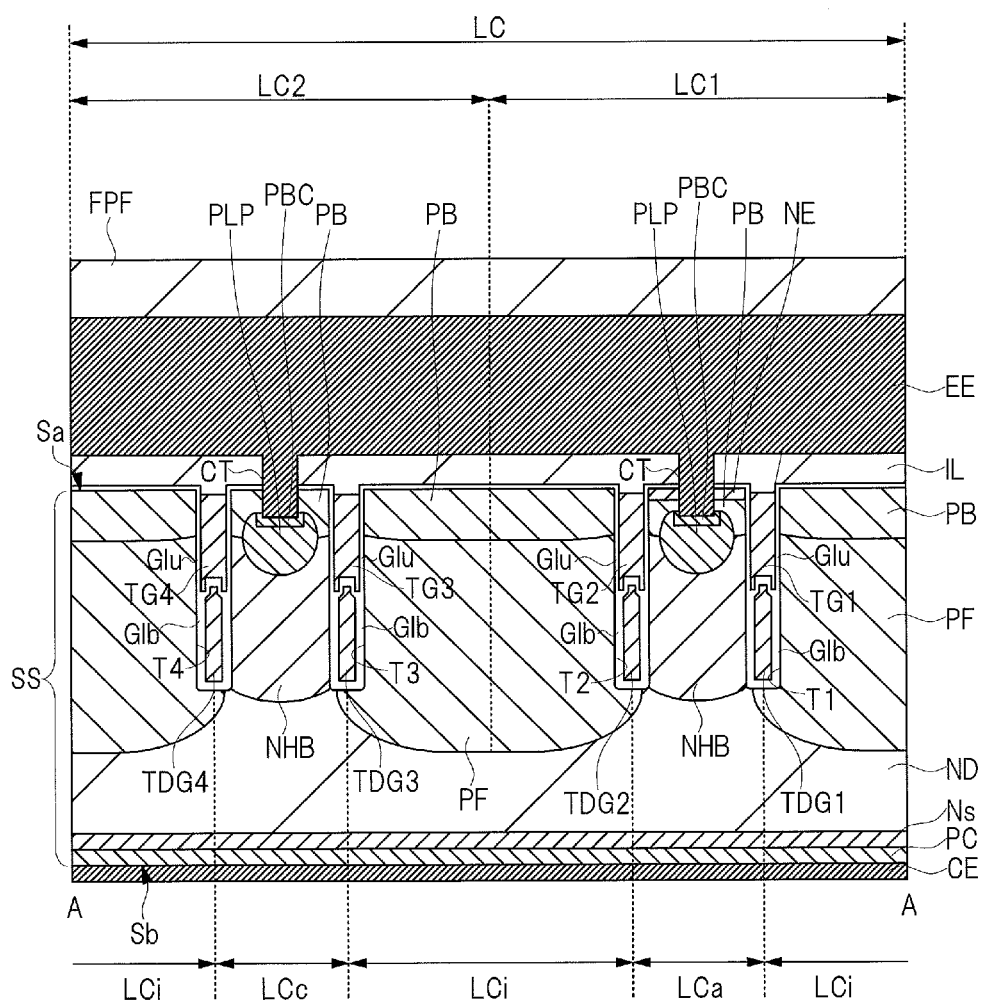
FIG. 35 is a cross-sectional view of a principal part (a cross-sectional view of a principal part taken along a line A-A shown in FIG. 2) of a first example of an IE-type trench gate IGBT according to a sixth embodiment.
Figure 36:
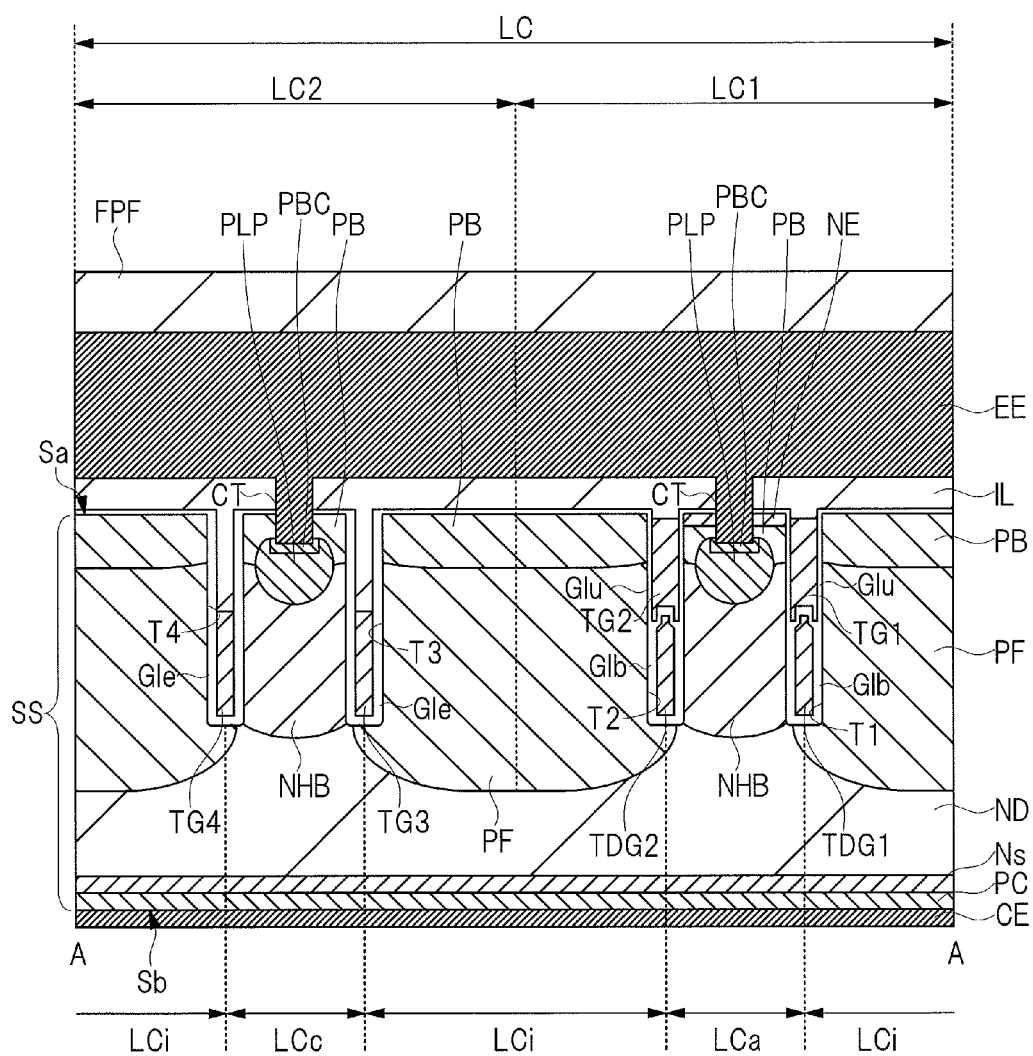
FIG. 36 is a cross-sectional view of a principal part (a cross-sectional view of a principal part taken along a line A-A shown in FIG. 2) of a second example of the IE-type trench gate IGBT according to the sixth embodiment.

An IE type trench gate IGBT according to the present sixth embodiment will be described by using FIGS. 35 and 36. FIGS. 35 and 36 are a cross-sectional view of a principal part (cross-sectional view of a principal part taken along a line A-A of the FIG. 2) of a first example of the IE type trench gate IGBT according to the present the sixth embodiment and a cross-sectional view of a principal part (cross-sectional view of a principal part taken along a line A-A of the FIG. 2) of a second example of the IE type trench gate IGBT, respectively. The IE type trench gate IGBT described here is different from the IE type trench gate IGBT according to the above-described first embodiment in structures of the first, second, third and fourth linear trench gate electrodes TG1, TG2, TG3 and TG4. Therefore, in the following descriptions, only a different part from the IE type trench gate IGBT according to the above-described first embodiment will be described as a principle.

As for the first example of the IE type trench gate IGBT according to the present sixth embodiment, as illustrated in FIG. 35, multi-stages of a trench gate electrode formed in each of the insides of the first trench T1 and second trench T2 formed between the linear active cell region LCa and the linear inactive cell region LCi are provided.

That is, a first linear dummy trench gate electrode TDG1 electrically connected to the emitter electrode EE is formed from the bottom end of the first trench T1 up to about a half depth thereof, and the first linear trench gate electrode TG1 electrically connected to the gate electrode (gate electrode GE illustrated in the FIG. 1) is formed above the first linear dummy trench gate electrode via an insulation film up to the upper part of the first trench T1. Similarly, a second linear dummy trench gate electrode TDG2 electrically connected to the emitter electrode EE is formed from the bottom end of the second trench T2 up to about a half depth thereof, and the second linear trench gate electrode TG2 electrically connected to the gate electrode (gate electrode GE illustrated in the FIG. 1) is formed above the second linear dummy trench gate electrode via an insulation film up to the upper part of the second trench T2.

In addition, a thickness of the gate insulation film GIb formed between the first linear dummy trench gate electrode TDG1 embedded in the lower part of the first trench T1 and the inner wall of the first trench T1 is thicker than a thickness of the gate insulation film GIu formed between the first linear trench gate electrode TG1 embedded in the upper part of the first trench T1 and the inner wall of the first trench T1. Similarly, a thickness of the gate insulation film GIb formed between the second linear dummy trench gate electrode TDG2 embedded in the lower part of the second trench T2 and the inner wall of the second trench T2 is thicker than a thickness of the gate insulation film GIu formed between the second linear trench gate electrode TG2 embedded in the upper part of the second trench T2 and the inner wall of the second trench T2.

In addition, multi-stages of the trench gate electrode formed in each of the insides of the third trench T3 and the fourth trench T4 formed between the linear hole collector cell region LCc and the linear inactive cell region LCi is provided.

That is, a third linear dummy trench gate electrode TDG3 electrically connected to the emitter electrode EE is formed from the bottom end of the third trench T3 up to about a half depth thereof, and the third linear trench gate electrode TG3 electrically connected to the emitter electrode EE is formed above the third linear dummy trench gate electrode via an insulation film up to the upper part of the third trench T3. Similarly, a fourth linear dummy trench gate electrode TDG4 electrically connected to the emitter electrode EE is formed from the bottom end of the fourth trench T4 up to about a half depth thereof, and the fourth linear trench gate electrode TG4 electrically connected to the emitter electrode EE is formed above the fourth linear dummy trench gate electrode via an insulation film up to the upper part of the fourth trench T4.

Each upper surface of the third linear trench gate electrode TG3 and the fourth linear trench gate electrode TG4 is positioned to be lower than each upper surface of the first linear trench gate electrode TG1 and the second linear trench gate electrode TG2, and is positioned to be higher than the bottom surface of the P-type body region PB.

In addition, a thickness of the gate insulation film GIb formed between the third linear dummy trench gate electrode TDG3 embedded in the lower part of the third trench T3 and the inner wall of the third trench T3 is thicker than a thickness of the gate insulation film GIu formed between the third linear trench gate electrode TG3 embedded in the upper part of the third trench T3 and the inner wall of the third trench T3. Similarly, a thickness of the gate insulation film GIb formed between the fourth linear dummy trench gate electrode TDG4 embedded in the lower part of the fourth trench T4 and the inner wall of the fourth trench T4 is thicker than a thickness of the gate insulation film GIu formed between the fourth linear trench gate electrode TG4 embedded in the upper part of the fourth trench T4 and the inner wall of the fourth trench T4.

In this manner, particularly, a capacitance (feedback capacitance) between the gate and the collector can be reduced more than that in the IE type trench gate IGBT according to the above-described first embodiment.

As for the second example of the IE type trench gate IGBT according to the present sixth embodiment, as illustrated in FIG. 36, structures of the trench gate electrode and the gate insulation film, etc., which are formed in each of the insides of the first trench T1 and the second trench T2 formed between the linear active cell region LCa and the linear inactive cell region LCi are the same as those of the first example.

However, structures of the trench gate electrode and the gate insulation film, etc., which are formed in each of the insides of the third trench T3 and the fourth trench T4 formed between the linear hole collector cell region LCc and the linear inactive cell region LCi are different from those of the first example. That is, only the third linear trench gate electrode TG3 and the fourth linear trench gate electrode TG4 are formed insides the third trench T3 and fourth trench T4, respectively.

Each upper surface of the third linear trench gate electrode TG3 and the fourth linear trench gate electrode TG4 is positioned to be lower than each upper surface of the first linear trench gate electrode TG1 and the second linear trench gate electrode TG2, and is positioned to be lower than the bottom surface of the P-type body region PB.

In addition, a thickness of the gate insulation film GIe formed in the inner walls of the third trench T3 and the fourth trench T4 is the same or substantially the same as a thickness of the gate insulation film GIb formed in the inner walls of the lower parts of the first trench T1 and the second trench T2.

In this manner, according to the present sixth embodiment, depths of the first linear trench gate electrode TG1 and the second linear trench gate electrode TG2 is made shallow, the first linear trench gate electrode TG1 and the second linear trench gate electrode TG2 being formed so as to be embedded inside the first trench T1 and the second trench T2 respectively between the linear active cell region LCa and the linear inactive cell regions LCi, and the gate insulation films GIb and GIe formed in the inner walls are made thick. In this manner, a gate capacitance can be smaller than that in the IE type trench gate IGBT according to the above-described first embodiment.

In addition, when depths of the first trench T1 and the second trench T2 according to the present sixth embodiment are made to be the same as depths of the first trench T1 and the second trench T2 according to the above-described first embodiment, the low ON-state voltage can be maintained.

(Seventh Embodiment)

Figure 37:
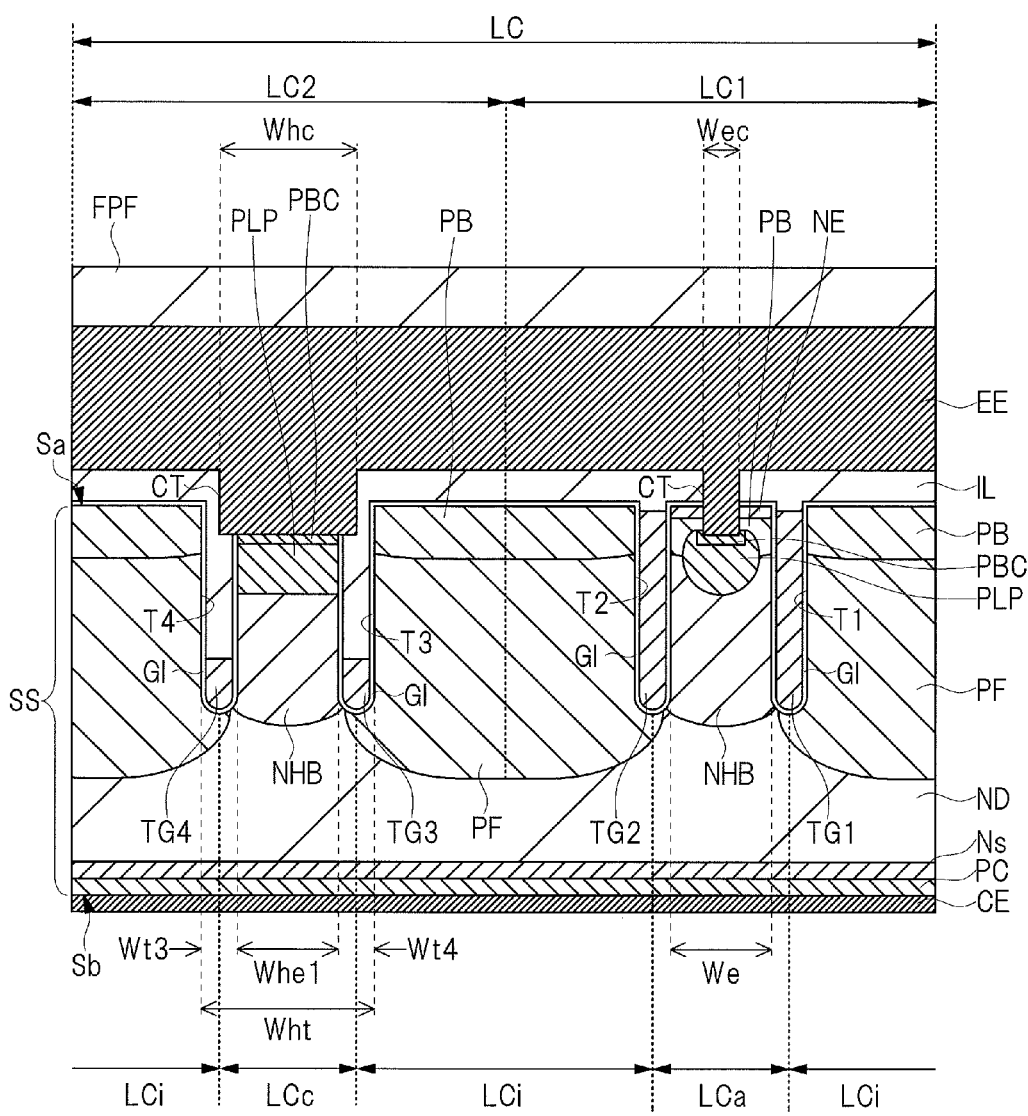
FIG. 37 is a cross-sectional view of a principal part of a first example of an IE-type trench gate IGBT according to a seventh embodiment.
Figure 38:
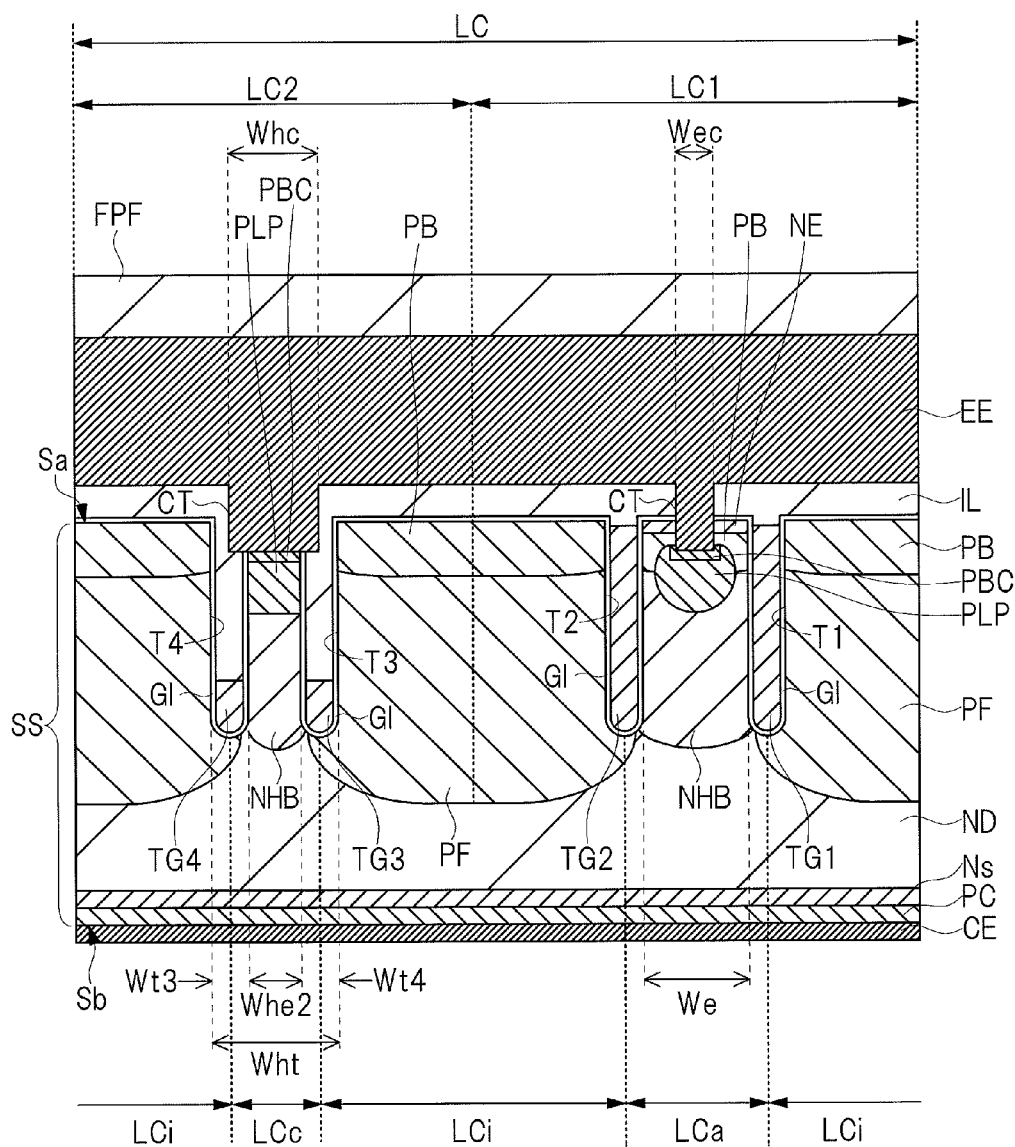
FIG. 38 is a cross-sectional view of a principal part of a second example of the IE-type trench gate IGBT according to the seventh embodiment.

An IE type trench gate IGBT according to the present seventh embodiment will be described by using FIGS. 37 and 38. FIGS. 37 and 38 illustrate a cross-sectional view of a principal part of a first example of the IE type trench gate IGBT according to the present seventh embodiment and a cross-sectional view of a principal part of a second example of the IE type trench gate IGBT, respectively. The IE type trench gate IGBT described here is different from the IE type trench gate IGBT according to the above-described first embodiment in a structure of the linear hole collector cell region LCc. Therefore, in the following descriptions, only a different part from the IE type trench gate IGBT according to the above-described first embodiment will be described as a principle.

As for the first example of the IE type trench gate IGBT according to the present seventh embodiment, as illustrated in FIG. 37, the contact groove CT of the linear hole collector cell region LCc is formed so that a width Whc of the contact groove CT of the linear hole collector cell region LCc is almost the same as a width Wc (see FIG. 2) of the linear hole collector cell region LCc.

Specifically, the contact groove CT of the linear hole collector cell region LCc is formed so that a width Whc of the contact groove CT of the linear hole collector cell region LCc is larger than a width Wec of the contact groove CT of the linear active cell region LCa (Whc>Wec). In addition, a width Whc of the contact groove CT of the linear hole collector cell region LCc may be made small than a total width Wht of a gap Whe1 between the third trench T3 and the fourth trench T4, a width Wt3 of the third trench T3 and a width Wt4 of the fourth trench T4, and may be made larger than the gap Whe1 between the third trench T3 and the fourth trench T4 ((Whe1+Wt3+Wt4)>Whc>Whe1).

That is, the contact groove CT of the linear hole collector cell region LCc may be formed on the third trench T3 and the fourth trench T4. However, the contact groove CT of the linear hole collector cell region LCc is formed so as not to be on the P-type floating region PF (P-type body region PB) over the third trench T3 and the fourth trench T4. This is because it is avoided that the emitter electrode EE and the P-type floating region PF are electrically connected so that the P-type floating region PF is at an emitter potential.

It is required to form an FET in a longitudinal direction on the first trench T1 side and the second trench T2 side of the linear active cell region LCa, and therefore, it is required to stably and accurately form an impurity concentration of the P-type body region PB. Therefore, it is required to secure a certain distance between the side walls of the first trench T1 and the second trench T2 and the $P^+$-type latch-up prevention region PLP formed by ion implantation after the contact groove CT of the linear active cell region LCa is opened. Note that a specific margin value for this depends on a processing technique of a manufacturing process and a factory management capability, and it is required to consider that a width Wec of the contact groove CT of the linear active cell region LCa is too large, and that an alignment in a lithography technique between the contact groove CT of the linear active cell region LCa and the first trench T1 and second trench T2 is shifted.

On the other hand, since the FET is not formed in the longitudinal direction on the third trench T3 side and the fourth trench T4 side of the linear hole collector cell region LCc, there is no $N^+$-type emitter region NE, and therefore, it is not required to take a margin between the $P^+$-type latch-up prevention region PLP and the side walls of the third trench T3 and the fourth trench T4.

As for the second example of the IE type trench gate IGBT according to the present seventh embodiment, as illustrated in FIG. 38, the gap Whe2 between the third trench T3 and the fourth trench T4 of the linear hole collector cell region LCc is smaller than the gap Whe1 between the third trench T3 and the fourth trench T4 of the linear hole collector cell region LCc shown in the first example.

That is, it is only required to provide a function to discharge holes implanted into the P-type floating region PF for the linear hole collector cell region LCc, and therefore, the gap Whe2 between the third trench T3 and the fourth trench T4 of the linear hole collector cell region LCc can be made smaller than the gap We between the first trench T1 and the second trench T2 of the linear hole collector cell region LCc (Whe2<We).

Note that, when the gap Whe2 between the third trench T3 and the fourth trench T4 of the linear hole collector cell region LCc is too narrow, it is difficult to discharge the holes implanted into the P-type floating region PF. However, on the other hand, there is an advantage that holes are accumulated in the $N^-$-type drift region ND so that a carrier concentration becomes high, which results in the low ON-state voltage. Therefore, the gap Whe2 between the third trench T3 and the fourth trench T4 of the linear hole collector cell region LCc is set in consideration of an effect of a PMOS transistor and a desired ON-state voltage.

In this manner, in the second example, an area of a semiconductor chip in which the IE type trench gate IGBT is formed can be made small by forming the gap Whe2 between the third trench T3 and the fourth trench T4 of the linear hole collector cell region LCc to be narrow. By forming the area of the semiconductor chip to be small, the number of semiconductor chips acquirable from a wafer is increased, and therefore, a manufacturing cost can be reduced.

In addition, without changing a width of the linear unit cell region LC, the gap Whe2 between the third trench T3 and the fourth trench T4 may be made small, and the gap We between the first trench T1 and the second trench T2 may be made large. That is, a width W2 (see FIG. 2) of the second linear unit cell region LC2 may be made small, and a width W1 (see FIG. 2) of the first linear unit cell region LC1 may be made large. In this case, the area of the semiconductor chip in which the IE type trench gate IGBT is formed does not change since the width of the linear unit cell region LC does not change. However, the switching characteristics of the IE type trench gate IGBT can be improved since the gate capacitance in the linear active cell region LCa is reduced.

In addition, the width W1 (see FIG. 2) of the first linear unit cell region LC1 and the width W2 (see FIG. 2) of the second linear unit cell region LC2 can also be set from a balanced point between the area of the semiconductor chip in which the IE type trench gate IGBT is formed and the performance of the IE type trench gate IGBT.

(Eighth Embodiment)

Figure 39:
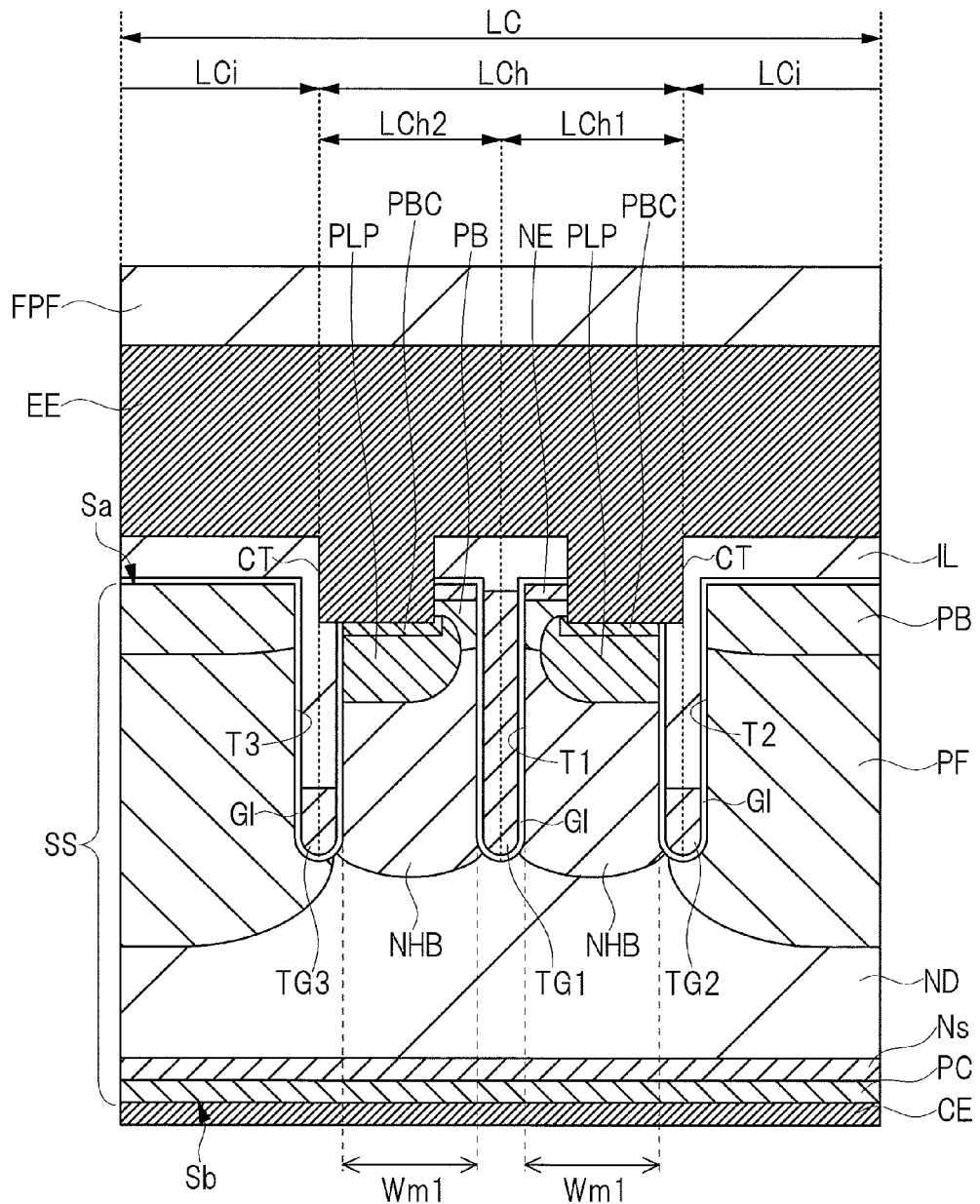
FIG. 39 is a cross-sectional view of a principal part of a first example of an IE-type trench gate IGBT according to an eighth embodiment.
Figure 40:
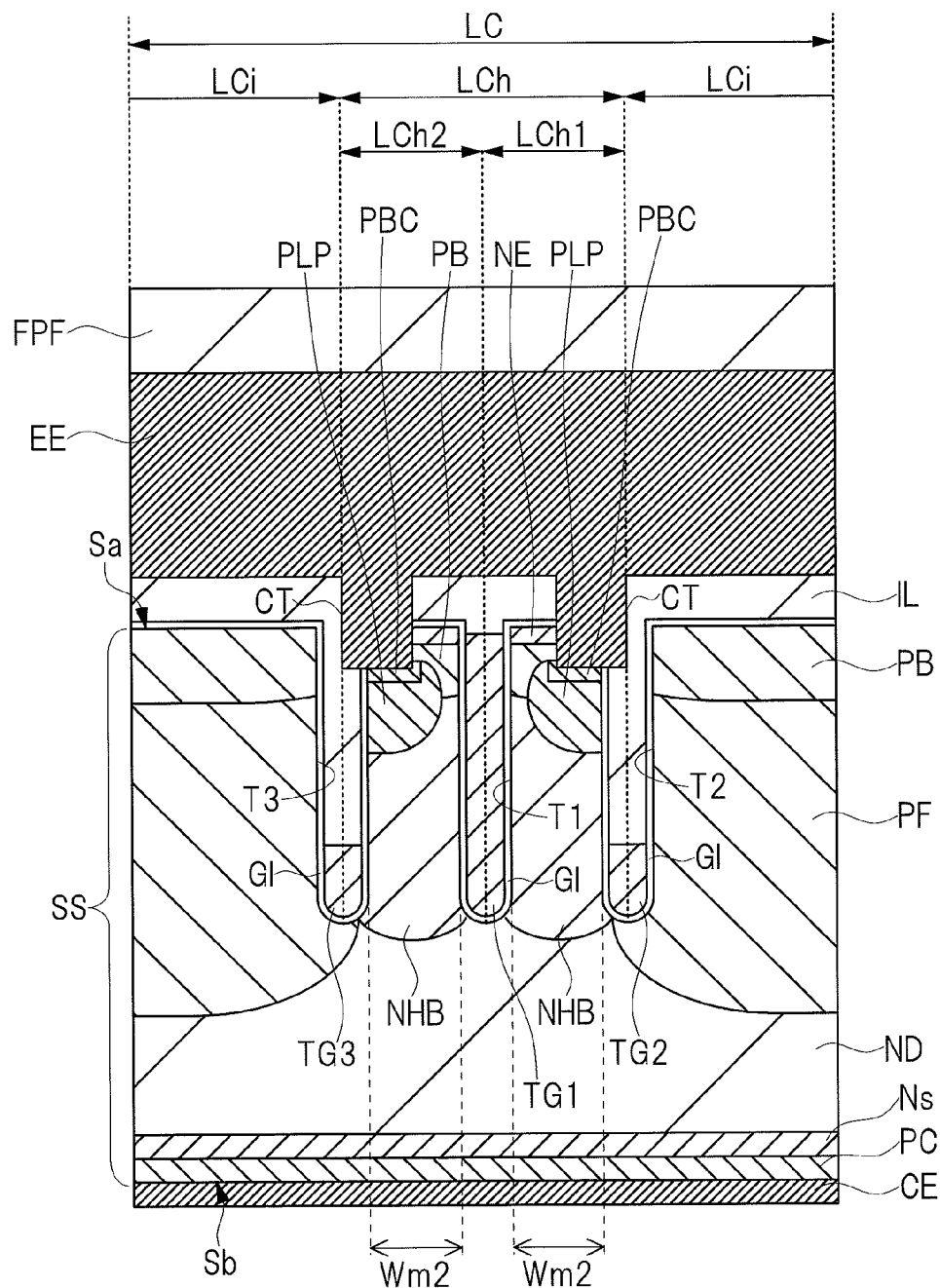
FIG. 40 is a cross-sectional view of a principal part of a second example of the IE-type trench gate IGBT according to the eighth embodiment.

An IE type trench gate IGBT according to the present eighth embodiment will be described by using FIGS. 39 and 40. FIGS. 39 and 40 illustrate a cross-sectional view of a principal part of a first example of the IE type trench gate IGBT according to the present eighth embodiment and a cross-sectional view of a principal part of a second example of the IE type trench gate IGBT, respectively. The IE type trench gate IGBT described here is different from the IE type trench gate IGBT according to the above-described third embodiment in a structure of the contact groove CT of the linear hybrid cell region LCh. Therefore, in the following descriptions, only a different part from the IE type trench gate IGBT according to the above-described third embodiment will be described as a principle.

In the first example of the IE type trench gate IGBT according to the present eighth embodiment, as illustrated in FIG. 39, the contact groove CT is formed in a region in the first linear hybrid sub cell region LCh1 where the $N^+$ emitter region NE is not formed on the opposite side of the first trench T1 in which the first linear trench gate electrode TG1 electrically connected to the gate electrode is embedded. Similarly, the contact groove CT is formed in a region in the second linear hybrid sub cell region LCh2 where the $N^+$ emitter region NE is not formed on the opposite side of the first trench T1 in which the first linear trench gate electrode TG1 electrically connected to the gate electrode is embedded.

The contact groove CT of the first linear hybrid sub cell region LCh1 may be formed on the second trench T2. However, the contact groove CT of the first linear hybrid sub cell region LCh1 is formed so as not to be on the P-type floating region PF (P-type body region PB) over the second trench T2. Similarly, the contact groove CT of the second linear hybrid sub cell region LCh2 may be formed on the third trench T3. However, the contact groove CT of the second linear hybrid sub cell region LCh2 is formed so as not to be on the P-type floating region PF (P-type body region PB) over the third trench T3. This is because it is avoided that the emitter electrode EE and the P-type floating region PF are electrically connected to each other so that the P-type floating region PF is at an emitter potential.

As similar to the above-described seventh embodiment, it is required to secure a certain distance between the $P^+$-type latch-up prevention region PLP and the side wall of the first trench T1 because it is required to form an FET in a longitudinal direction on the first trench T1 side.

On the other hand, there is no $N^+$-type emitter region NE because the FET is not formed in the longitudinal direction on the second trench T2 side and the third trench T3 side, and therefore, it is not required to take a margin between the $P^+$-type latch-up prevention region PLP and the side walls of the second trench T2 and the third trench T3.

AS for the second example of the IE type trench gate IGBT according to the present eighth embodiment, as illustrated in FIG. 40, the gap Wm2 between the first trench T1 and the second trench T2 of the first linear hybrid sub cell region LCh1 is smaller than the gap Wm1 between the first trench T1 and the second trench T2 of the first linear hybrid sub cell region LCh1 shown in the first example. Similarly, the gap Wm2 between the first trench T1 and the third trench T3 of the second linear hybrid sub cell region LCh2 is smaller than the gap Wm1 between the first trench T1 and the third trench T3 of the second linear hybrid sub cell region LCh2 shown in the first example.

In this case, without changing a layout of the contact groove CT formed in the IE type trench gate IGBT according to the above-described third embodiment, each of the second trench T2 and the third trench T3 may be brought close to the first trench T1 side so that the gap Wm2 is narrowed.

In this manner, in the second example, almost the same effect as that of the above-described seventh embodiment can be obtained. That is, by narrowing the gap Wm2 between the first trench T1 and the second trench T2 of the first linear hybrid sub cell region LCh1 and the gap Wm2 between the first trench T1 and the third trench T3 of the second linear hybrid sub cell region LCh2, the area of the semiconductor chip in which the IE type trench gate IGBT is formed can reduced. By reducing the area of the semiconductor chip, the number of semiconductor chips acquirable from a wafer is increased, and therefore, a manufacturing cost can be improved.

In addition, without changing a width of the linear hybrid cell region LCh, a distance between the side wall of the first trench T1 and the side wall of the contact groove CT may be made large. In this case, although the area of the semiconductor chip in which the IE type trench gate IGBT is formed does not change, the gate capacitance in the linear hybrid cell region LCh can be reduced. Therefore, the switching characteristics of the IE type trench gate IGBT can be improved.

(Ninth Embodiment)

An IE type trench gate IGBT according to the present ninth embodiment will be described by using FIGS. 41 to 44. FIGS. 41, 42, 43 and 44 illustrate cross-sectional views of a principal part of a first example, a second example, a third example and a fourth example of a GEEEG type IE type trench gate IGBT according to the present ninth embodiment, respectively.

Figure 41:
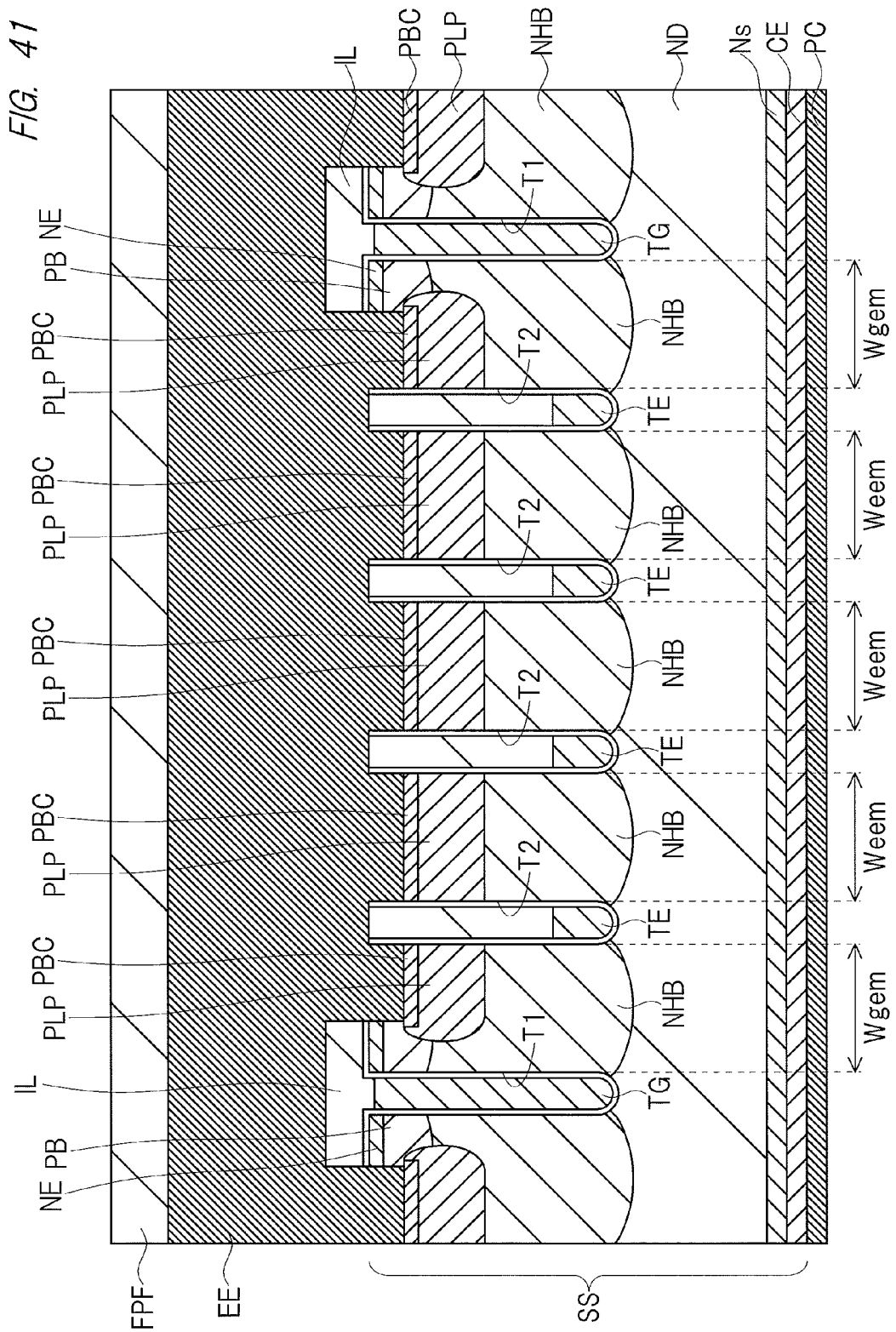
FIG. 41 is a cross-sectional view of a principal part of a first example of an IE-type trench gate IGBT according to a ninth embodiment.
Figure 42:
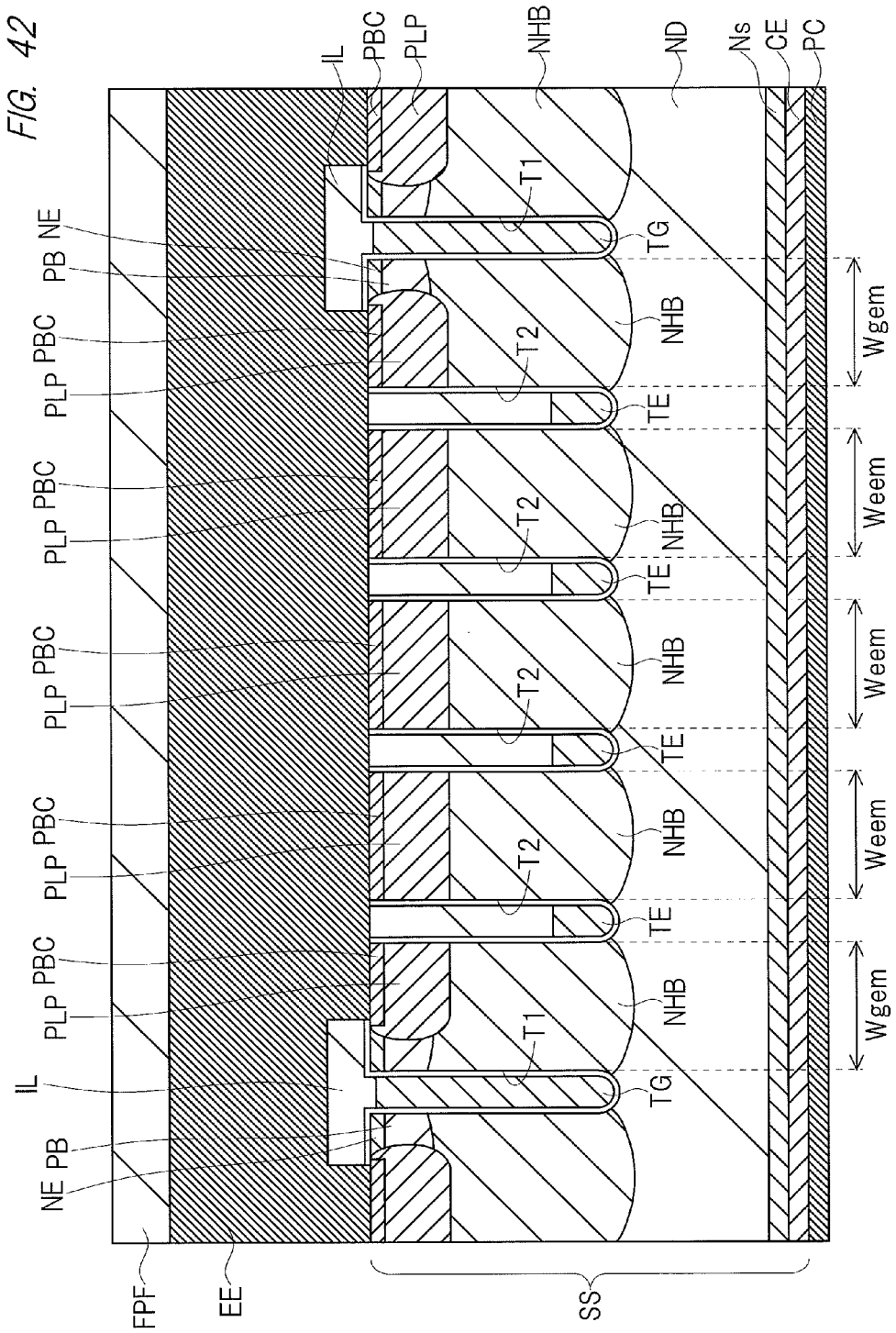
FIG. 42 is a cross-sectional view of a principal part of a second example of the IE-type trench gate IGBT according to the ninth embodiment.

FIG. 41 illustrates the first example of the present ninth embodiment, and illustrates a cross-sectional view of a principal part of the IE type trench gate IGBT to which body-contact etching is performed. FIG. 42 illustrates the second example of the present ninth embodiment, and illustrates a cross-sectional view of a principal part of the IE type trench gate IGBT to which the body-contact etching is not performed.

As illustrated in FIGS. 41 and 42, a plurality of first linear trench gate electrodes TG electrically connected to the gate electrode are formed, and a plurality of second linear trench gate electrodes TE electrically connected to the emitter electrode EE are formed so as to be separated from each other between the first linear trench gate electrodes TG which are adjacent to each other. The first linear trench gate electrode TG is embedded from the bottom end to the upper part of the first trench T1 formed in the semiconductor substrate SS. On the other hand, the second linear trench gate electrode TE is embedded in the bottom part of the second trench T2 formed in the semiconductor substrate SS so that its upper surface is positioned to be lower than the upper surface of the first linear trench gate electrode TG, and besides, is positioned to be lower than the bottom surface of the P-type body region PB.

In this manner, also in the GEEEG type IE type trench gate IGBT, an area in which the second linear trench gate electrode TE contributes to an input capacitance can be reduced by adjusting a height from the bottom end of the second linear trench gate electrode TE formed inside the second trench T2, and therefore, the input capacitance can be reduced.

In addition, a gap Weem between adjacent second trenches T2 can be made to be narrower than a gap Wgem between the first trench T1 and the second trench T2 adjacent thereto. By narrowing the gap Weem between the adjacent second trenches T2, the area of the semiconductor chip in which the IE type trench gate IGBT is formed can be reduced. By reducing the area of the semiconductor chip, the number of semiconductor chips acquirable from a wafer is increased, and therefore, a manufacturing cost can be reduced.

In addition, while the gap Weem between the adjacent second trenches T2 may be made small, the gap Wgem between the first trench T1 and the second trench T2 adjacent thereto may be made large. In this case, although the area of the semiconductor chip in which the IE type trench gate IGBT is formed does not change, the gate capacitance is reduced. Therefore, the switching characteristics of the IE type trench gate IGBT can be improved.

Figure 43:
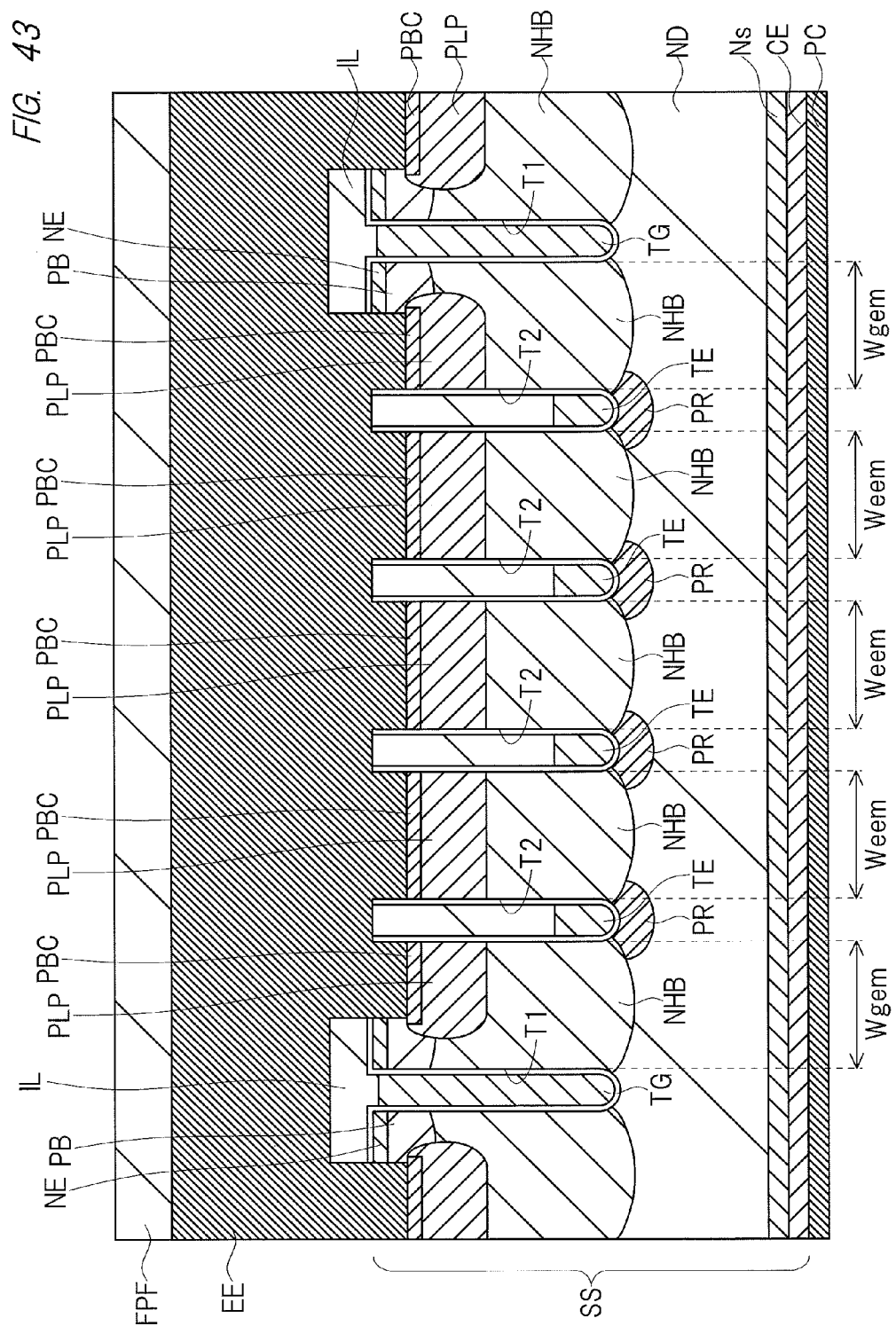
FIG. 43 is a cross-sectional view of a principal part of a third example of the IE-type trench gate IGBT according to the ninth embodiment.

FIG. 43 illustrates the third example of the present ninth embodiment, and illustrates a cross-sectional view of a principal part of the IE type trench gate IGBT to which the body-contact etching is performed. FIG. 44 illustrates the fourth example of the present ninth embodiment, and illustrates a cross-sectional view of a principal part of the IE type trench gate IGBT to which body-contact the etching is not performed.

As illustrated in FIGS. 43 and 44, this is different from the first example and the second example in a structure that the bottom end of the second trench T2 in which the second linear trench gate electrode TE is formed is covered with a P-type region PR. By configuring such a structure, an operation of the parasitic PMOS transistor described by using FIG. 6 can be added.

In the present ninth embodiment, the structure that the bottom end of the second trench T2 is covered with the P-type region PR has been exemplified. However, even a structure that the P-type floating region PF is formed deeply so that the bottom end of the second trench T2 is covered with the P-type floating region PF may be applicable.

In the foregoing, the invention made by the present inventor has been concretely described based on the embodiments. However, it is needless to say that the present invention is not limited to the foregoing embodiments and various modifications and alterations can be made within the scope of the present invention.

The present invention includes at least the following embodiments.

[Additional Note 1]

A semiconductor device provided with an IE type trench IGBT includes the followings.

(a) a semiconductor substrate which has a first main surface and a second main surface opposite to the first main surface;

(b) a collector region which is formed in the semiconductor substrate and which has a first conductivity type;

(c) a drift region which is formed in the semiconductor substrate on the collector region and which has a second conductivity type different from the first conductivity type;

(d) a plurality of linear unit cell regions which are formed along a first direction in the semiconductor substrate on the drift region;

(e) a gate electrode provided on the first main surface side;

(f) an emitter electrode provided on the first main surface side; and (g) a collector electrode provided on the second main surface side.

Here, the linear unit cell region includes the followings.

(d1) a linear hybrid cell region provided from the first main surface to inside;

(d2) a first linear hybrid sub cell region and a second linear hybrid sub cell region provided in the linear hybrid cell region so as to be symmetrical to each other in the first direction;

(d3) a first trench which is formed at a boundary between the first linear hybrid sub cell region and the second linear hybrid sub cell region so as to have a first depth from the first main surface;

(d4) a first linear trench gate electrode which is electrically connected to the gate electrode and which is formed inside the first trench;

(d5) a second trench and a third trench which are formed so as to sandwich both sides of the linear hybrid cell region in the first direction and so as to have the first depth from the first main surface;

(d6) a second linear trench gate electrode and a third linear trench gate electrode which are electrically connected to the emitter electrode and which are formed inside the second trench and the third trench, respectively;

(d7) an emitter region of the second conductivity type which is formed in a center part of the linear hybrid cell region so as to be in contact with the first trench and so as to have a second depth from the first main surface;

(d8) a body region of the first conductivity type which is formed below the emitter region so as to have a third depth deeper than the second depth from the first main surface;

(d9) a linear inactive cell region provided on both sides of the linear hybrid cell region in the first direction via the second trench and the third trench;

(d10) a floating region of the first conductivity type which is formed in the linear inactive cell region so as to have a fourth depth from the first main surface;

(d11) a first contact groove which is formed in a region on the second trench side of the first linear hybrid sub cell region so as to overlap with the second trench when seen in a plan view and so as to have a fifth depth shallower than the third depth from the first main surface; and (d12) a second contact groove which is formed in a region on the third trench side of the second linear hybrid sub cell region so as to overlap with the third trench when seen in a plan view and so as to have the fifth depth.

Further, upper surfaces of the second linear trench gate electrode and the third linear trench gate electrode are positioned to be lower than an upper surface of the first linear trench gate electrode.

[Additional Note 2]

A semiconductor device provided with an IE type trench IGBT includes the followings.

(a) a semiconductor substrate which has a first main surface and a second main surface opposite to the first main surface;

(b) a collector region which is formed in the semiconductor substrate and which has a first conductivity type;

(c) a drift region which is formed in the semiconductor substrate on the collector region and which has a second conductivity type different from the first conductivity type;

(d) a plurality of linear unit cell regions which are formed along a first direction in the semiconductor substrate on the drift region;

(e) a gate electrode provided on the first main surface side;

(f) an emitter electrode provided on the first main surface side; and (g) a collector electrode provided on the second main surface side.

Here, the linear unit cell region includes the followings.

(d1) a first trench and a second trench which are formed so as to sandwich both sides of the linear unit cell region in the first direction and so as to have a first depth from the first main surface;

(d2) a first linear trench gate electrode and a second linear trench gate electrode which are electrically connected to the gate electrode and which are formed inside the first trench and the second trench, respectively;

(d3) a plurality of third trenches which are formed between the first trench and the second trench so as to be separated from each other, and which has the first depth;

(d4) a plurality of third linear trench gate electrodes which are electrically connected to the emitter electrode and which are formed inside the plurality of third trenches, respectively;

(d5) a first emitter region and a second emitter region which are formed so as to have a second depth from the first main surface and so as to be in contact with the first trench and the second trench, respectively; and (d6) a first body region and a second body region of the first conductivity type which are formed below the first emitter region and the second emitter region so as to have a third depth deeper than the second depth from the first main surface, respectively.

Further, upper surfaces of the first linear trench gate electrode and the second linear trench gate electrode are positioned to be lower than an upper surface of the plurality of third linear trench gate electrodes.

What is claimed is:

1. A semiconductor device provided with an IE type trench IGBT comprising:
(a) a semiconductor substrate which has a first main surface and a second main surface opposite to the first main surface;
(b) a collector region which is formed in the semiconductor substrate and which has a first conductivity type;
(c) a drift region which is formed in the semiconductor substrate on the collector region and which has a second conductivity type different from the first conductivity type;
(d) a plurality of linear unit cell regions which are formed along a first direction in the semiconductor substrate on the drift region and each of which is formed of a first linear unit cell region and a second linear unit cell region;
(e) a gate electrode provided on the first main surface side;
(f) an emitter electrode provided on the first main surface side; and
(g) a collector electrode provided on the second main surface side,
the first linear unit cell region including:
(x1) a linear active cell region provided from the first main surface to inside;
(x2) a first trench and a second trench which are formed so as to sandwich both sides of the linear active cell region in the first direction and so as to have a first depth from the first main surface;
(x3) a first linear trench gate electrode and a second linear trench gate electrode which are electrically connected to the gate electrode and which are formed inside the first trench and the second trench, respectively;
(x4) an emitter region of the second conductivity type which is formed in the linear active cell region so as to have a second depth from the first main surface;
(x5) a first body region of the first conductivity type which is formed below the emitter region of the linear active cell region so as to have a third depth deeper than the second depth from the first main surface;
(x6) a first linear inactive cell region provided on both sides of the linear active cell region in the first direction via the first trench and the second trench; and
(x7) a first floating region of the first conductivity type which is formed in the first linear inactive cell region so as to have a fourth depth from the first main surface, and the second linear unit cell region including:
(y1) a linear hole collector cell region provided from the first main surface to inside;
(y2) a third trench and a fourth trench which are formed so as to sandwich both sides of the linear hole collector cell region in the first direction and so as to have the first depth from the first main surface;
(y3) a third linear trench gate electrode and a fourth linear trench gate electrode which are electrically connected to the emitter electrode and which are formed inside the third trench and the fourth trench, respectively;
(y4) a second body region of the first conductivity type which is formed in the linear hole collector cell region so as to have the third depth from the first main surface;
(y5) a second linear inactive cell region provided on both sides of the linear hole collector cell region in the first direction via the third trench and the fourth trench; and
(y6) a second floating region of the first conductivity type which is formed in the second linear inactive cell region so as to have the fourth depth from the first main surface,
wherein, further, upper surfaces of the third linear trench gate electrode and the fourth linear trench gate electrode are positioned to be lower than upper surfaces of the first linear trench gate electrode and the second linear trench gate electrode.

2. The semiconductor device according to claim 1,
wherein upper surfaces of the third linear trench gate electrode and the fourth linear trench gate electrode are positioned to be lower than the third depth of the second body region.

3. The semiconductor device according to claim 1,
wherein the first linear unit cell region further includes a first gate insulation film formed in inner walls of the first trench and the second trench,
a thickness of the first gate insulation film on the first linear inactive cell region side is thicker than a thickness of the first gate insulation film on the linear active cell region side,
the second linear unit cell region further includes a second gate insulation film formed in inner walls of the third trench and the fourth trench, and
a thickness of the second gate insulation film on the second linear inactive cell region side is thicker than a thickness of the second gate insulation film on the linear hole collector cell region side.

4. The semiconductor device according to claim 1,
wherein the first linear unit cell region further includes a first hole barrier region of the second conductivity type formed below the first body region in the linear active cell region, and
an impurity concentration of the first hole barrier region is higher than an impurity concentration of the drift region and lower than an impurity concentration of the emitter region.

5. The semiconductor device according to claim 4,
wherein the second linear unit cell region further includes a second hole barrier region of the second conductivity type formed below the second body region in the linear hole collector cell region.

6. The semiconductor device according to claim 5,
wherein the second linear unit cell region further includes a connection region of the second conductivity type which is formed below the second hole barrier region in the linear hole collector cell region and which is connected to the second linear inactive cell region provided on both sides of the linear hole collector cell region in the first direction.

7. The semiconductor device according to claim 1,
wherein the first linear unit cell region further includes:
a first linear dummy trench gate electrode formed below the first linear trench gate electrode via a first insulation film in the first trench; and
a second linear dummy trench gate electrode formed below the second linear trench gate electrode via a second insulation film in the second trench.

8. The semiconductor device according to claim 7,
wherein a thickness of a first gate insulation film formed between the first linear trench gate electrode and an inner wall of the first trench is thinner than a thickness of a first dummy insulation film formed between the first linear dummy trench gate electrode and an inner wall of the first trench, and
a thickness of a second gate insulation film formed between the second linear trench gate electrode and an inner wall of the second trench is thinner than a thickness of a second dummy insulation film formed between the second linear dummy trench gate electrode and an inner wall of the second trench.

9. The semiconductor device according to claim 7,
wherein the second linear unit cell region further includes:
a third linear dummy trench gate electrode formed below the third linear trench gate electrode via a third insulation film in the third trench; and
a fourth linear dummy trench gate electrode formed below the fourth linear trench gate electrode via a fourth insulation film in the fourth trench.

10. The semiconductor device according to claim 9,
wherein a thickness of a third gate insulation film formed between the third linear trench gate electrode and an inner wall of the third trench is thinner than a thickness of a third dummy insulation film formed between the third linear dummy trench gate electrode and an inner wall of the third trench, and
a thickness of a fourth gate insulation film formed between the fourth linear trench gate electrode and an inner wall of the fourth trench is thinner than a thickness of a fourth dummy insulation film formed between the fourth linear dummy trench gate electrode and an inner wall of the fourth trench.

11. The semiconductor device according to claim 1,
wherein the fourth depth of the first floating region is deeper than the first depth of the first trench and the second trench.

12. A semiconductor device provided with an IE type trench IGBT comprising:
(a) a semiconductor substrate which has a first main surface and a second main surface opposite to the first main surface;
(b) a collector region which is formed in the semiconductor substrate and which has a first conductivity type;
(c) a drift region which is formed in the semiconductor substrate on the collector region and which has a second conductivity type different from the first conductivity type;
(d) a plurality of linear unit cell regions which are formed along a first direction in the semiconductor substrate on the drift region;
(e) a gate electrode provided on the first main surface side;
(f) an emitter electrode provided on the first main surface side; and
(g) a collector electrode provided on the second main surface side,
the linear unit cell region including:
(d1) a linear hybrid cell region provided from the first main surface to inside;
(d2) a first linear hybrid sub cell region and a second linear hybrid sub cell region provided in the linear hybrid cell region so as to be symmetrical to each other in the first direction;
(d3) a first trench formed at a boundary between the first linear hybrid sub cell region and the second linear hybrid sub cell region so as to have a first depth from the first main surface;
(d4) a first linear trench gate electrode which is electrically connected to the gate electrode and which is formed inside the first trench;
(d5) a second trench and a third trench which are formed so as to sandwich both sides of the linear hybrid cell region in the first direction and so as to have the first depth from the first main surface;
(d6) a second linear trench gate electrode and a third linear trench gate electrode which are electrically connected to the emitter electrode and which are formed inside the second trench and the third trench, respectively;
(d7) an emitter region of the second conductivity type which is formed so as to have a second depth from the first main surface and so as to be in contact with the first trench in a central part of the linear hybrid cell region;
(d8) a body region of the first conductivity type which is formed below the emitter region so as to have a third depth deeper than the second depth from the first main surface;
(d9) a linear inactive cell region provided on both sides of the linear hybrid cell region in the first direction via the second trench and the third trench; and
(d10) a floating region of the first conductivity type which is formed in the linear inactive cell region so as to have a fourth depth from the first main surface,
wherein, further, upper surfaces of the second linear trench gate electrode and the third linear trench gate electrode are positioned to be lower than an upper surface of the first linear trench gate electrode.

13. The semiconductor device according to claim 12,
wherein upper surfaces of the second linear trench gate electrode and the third linear trench gate electrode are positioned to be lower than the third depth of the body region.

14. The semiconductor device according to claim 12,
wherein the linear hybrid cell region further includes
a hole barrier region of the second conductivity type formed below the body region in the first linear hybrid sub cell region and the second linear hybrid sub cell region, and
an impurity concentration of the hole barrier region is higher than an impurity concentration of the drift region and lower than an impurity concentration of the emitter region.

15. The semiconductor device according to claim 12,
wherein the fourth depth of the floating region is deeper than the first depth of the first trench and the second trench.

16. A semiconductor device provided with an IE type trench IGBT comprising:
(a) a semiconductor substrate which has a first main surface and a second main surface opposite to the first main surface;
(b) a collector region which is formed in the semiconductor substrate and which has a first conductivity type;

(c) a drift region which is formed in the semiconductor substrate on the collector region and which has a second conductivity type different from the first conductivity type;
(d) a plurality of linear unit cell regions which are formed along a first direction in the semiconductor substrate on the drift region and each of which is formed of a first linear unit cell region and a second linear unit cell region;
(e) a gate electrode provided on the first main surface side;
(f) an emitter electrode provided on the first main surface side; and
(g) a collector electrode provided on the second main surface side,
the first linear unit cell region including:
(x1) a linear active cell region provided from the first main surface to inside;
(x2) a first trench and a second trench which are formed so as to sandwich both sides of the linear active cell region in the first direction and so as to have a first depth from the first main surface;
(x3) a first linear trench gate electrode and a second linear trench gate electrode which are electrically connected to the gate electrode and which are formed inside the first trench and the second trench, respectively;
(x4) an emitter region of the second conductivity type which is formed in the linear active cell region so as to have a second depth from the first main surface;
(x5) a first body region of the first conductivity type which is formed below the emitter region of the linear active cell region so as to have a third depth deeper than the second depth from the first main surface;
(x6) a first linear inactive cell region provided on both sides of the linear active cell region in the first direction via the first trench and the second trench;
(x7) a first floating region of the first conductivity type which is formed in the first linear inactive cell region so as to have a fourth depth from the first main surface; and
(x8) a first contact groove which is formed in the linear active cell region so as to have a width smaller than a gap between the first trench and the second trench and so as to have a fifth depth shallower than the third depth from the first main surface and in which the emitter electrode is embedded, and
the second linear unit cell region including:
(y1) a linear hole collector cell region provided from the first main surface to inside;
(y2) a third trench and a fourth trench which are formed so as to sandwich both sides of the linear hole collector cell region in the first direction and so as to have the first depth from the first main surface;
(y3) a third linear trench gate electrode and a fourth linear trench gate electrode which are electrically connected to the emitter electrode and which are formed inside the third trench and the fourth trench, respectively;
(y4) a second linear inactive cell region provided on both sides of the linear hole collector cell region in the first direction via the third trench and the fourth trench;
(y5) a second floating region of the first conductivity type which is formed in the second linear inactive cell region so as to have the fourth depth from the first main surface; and
(y6) a second contact groove which is formed in the linear hole collector cell region so as to have the fifth depth from the first main surface and in which the emitter electrode is embedded,
wherein, further, upper surfaces of the third linear trench gate electrode and the fourth linear trench gate electrode are positioned to be lower than upper surfaces of the first linear trench gate electrode and the second linear trench gate electrode, and
a width of the first contact groove in the first direction and a width of the second contact groove in the first direction are different from each other.

17. The semiconductor device according to claim 16, wherein a width of the second contact groove in the first direction is larger than a width of the first contact groove in the first direction.

18. The semiconductor device according to claim 16, wherein a gap between the third trench and the fourth trench is narrower than a gap between the first trench and the second trench.

19. The semiconductor device according to claim 16, wherein a width of the second contact groove in the first direction is larger than a width of the first contact groove in the first direction, and a gap between the third trench and the fourth trench is narrower than a gap between the first trench and the second trench.

20. The semiconductor device according to claim 16, wherein the second contact groove overlaps with the third trench or the fourth trench, or the third trench and the fourth trench, when seen in a plan view.

\* \* \* \* \*